US012777602B2

(12) United States Patent
Ramirez Macias et al.

(10) Patent No.: US 12,777,602 B2
(45) Date of Patent: Oct. 27, 2026

(54) METHODS, SYSTEMS, APPARATUS, AND ARTICLES OF MANUFACTURE TO CONTROL LOAD DISTRIBUTION OF INTEGRATED CIRCUIT PACKAGES

(71) Applicant: Intel Corporation, Santa Clara, CA (US)

(72) Inventors: Andres Ramirez Macias, Zapopan (MX); Eric Buddrius, Hillsboro, OR (US); Jeffory Smalley, East Olympia, WA (US); Fernando Gonzalez Lenero, Zapopan (MX); Francisco Javier Colorado Alonso, Zúñiga (MX); Fatima Elias Flores, Zapopan (MX); Rolf Laido, Sherwood, OR (US)

(73) Assignee: Intel Corporation

( * ) Notice: Subject to any disclaimer, the term of this patent is extended or adjusted under 35 U.S.C. 154(b) by 174 days.

(21) Appl. No.: 17/956,612

(22) Filed: Sep. 29, 2022

(65) Prior Publication Data

US 2023/0027076 A1 Jan. 26, 2023

(51) Int. Cl.
*H05K 7/10* (2006.01)

(52) U.S. Cl.
CPC .................................. *H05K 7/1007* (2013.01)

(58) Field of Classification Search
CPC .............................. H05K 7/1007; H01L 23/32
See application file for complete search history.

(56) References Cited

U.S. PATENT DOCUMENTS

| | | | | |
|---|---|---|---|---|
| 11,411,332 | B2 * | 8/2022 | Cheng | H05K 7/1061 |
| 2008/0081489 | A1 * | 4/2008 | MacGregor | H01R 12/88 439/71 |
| 2021/0320050 | A1 | 10/2021 | Robinson et al. | |

FOREIGN PATENT DOCUMENTS

| | | |
|---|---|---|
| GB | 2576032 | 4/2021 |
| GB | 2576030 | 12/2021 |
| GB | 2597525 | 2/2022 |
| GB | 2601357 | 6/2022 |

* cited by examiner

*Primary Examiner* — James Wu
(74) *Attorney, Agent, or Firm* — Hanley, Flight & Zimmerman, LLC

(57) ABSTRACT

Methods, systems, apparatus, and articles of manufacture to control load distribution of integrated circuit packages are disclosed. An example apparatus includes a carrier plate including a first surface to face a heatsink; a second surface opposite the first surface, and an aperture extending between the first and second surfaces, the aperture dimensioned to surround a semiconductor device, and a spring carried by the carrier plate, the spring to contact a surface of the semiconductor device proximate an outer edge of the semiconductor device.

20 Claims, 29 Drawing Sheets

METHODS, SYSTEMS, APPARATUS, AND ARTICLES OF MANUFACTURE TO CONTROL LOAD DISTRIBUTION OF INTEGRATED CIRCUIT PACKAGES

FIELD OF THE DISCLOSURE

This disclosure relates generally to integrated circuit packages and, more particularly, to methods, systems, apparatus, and articles of manufacture to control load distribution of integrated circuit packages.

BACKGROUND

In many electronic devices, a heatsink is mechanically and thermically coupled to a semiconductor device (e.g., an integrated circuit (IC) package, a land grid array (LGA) processor chip, a ball grid array (BGA) processor chip, a pin grid array (PGA) processor chip, a memory chip, etc.) to dissipate heat therefrom. A carrier (e.g., a package carrier) can be used to couple the heatsink to the semiconductor device and/or align the semiconductor device to a corresponding socket during assembly.

Figure 1:
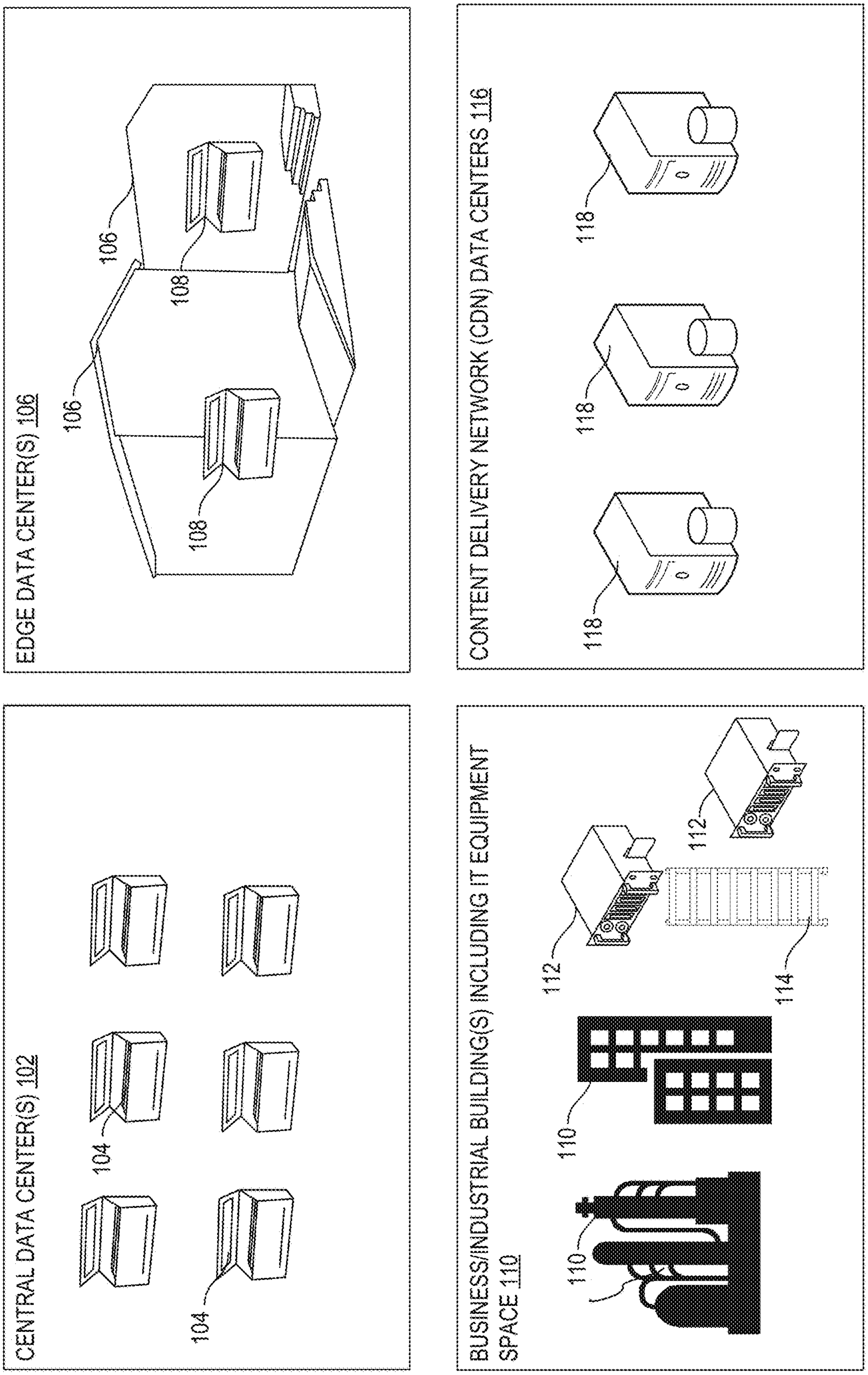
FIG. 1 illustrates one or more example environments in which teachings of this disclosure may be implemented.

In general, the same reference numbers will be used throughout the drawing(s) and accompanying written description to refer to the same or like parts. The figures are not necessarily to scale. Instead, the thickness of the layers or regions may be enlarged in the drawings. Although the figures show layers and regions with clean lines and boundaries, some or all of these lines and/or boundaries may be idealized. In reality, the boundaries and/or lines may be unobservable, blended, and/or irregular.

As used herein, unless otherwise stated, the term "above" describes the relationship of two parts relative to Earth. A first part is above a second part, if the second part has at least one part between Earth and the first part. Likewise, as used herein, a first part is "below" a second part when the first part is closer to the Earth than the second part. As noted above, a first part can be above or below a second part with one or more of: other parts therebetween, without other parts therebetween, with the first and second parts touching, or without the first and second parts being in direct contact with one another.

As used in this patent, stating that any part (e.g., a layer, film, area, region, or plate) is in any way on (e.g., positioned on, located on, disposed on, or formed on, etc.) another part, indicates that the referenced part is either in contact with the other part, or that the referenced part is above the other part with one or more intermediate part(s) located therebetween.

As used herein, connection references (e.g., attached, coupled, connected, and joined) may include intermediate members between the elements referenced by the connection reference and/or relative movement between those elements unless otherwise indicated. As such, connection references do not necessarily infer that two elements are directly connected and/or in fixed relation to each other. As used herein, stating that any part is in "contact" with another part is defined to mean that there is no intermediate part between the two parts.

Unless specifically stated otherwise, descriptors such as "first," "second," "third," etc., are used herein without imputing or otherwise indicating any meaning of priority, physical order, arrangement in a list, and/or ordering in any way, but are merely used as labels and/or arbitrary names to distinguish elements for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for identifying those elements distinctly that might, for example, otherwise share a same name.

As used herein, "approximately" and "about" modify their subjects/values to recognize the potential presence of variations that occur in real world applications. For example, "approximately" and "about" may modify dimensions that may not be exact due to manufacturing tolerances and/or other real world imperfections as will be understood by persons of ordinary skill in the art. For example, "approximately" and "about" may indicate such dimensions may be within a tolerance range of +/−10% unless otherwise specified in the below description.

As used herein, "processor circuitry" is defined to include (i) one or more special purpose electrical circuits structured to perform specific operation(s) and including one or more semiconductor-based logic devices (e.g., electrical hardware implemented by one or more transistors), and/or (ii) one or more general purpose semiconductor-based electrical circuits programmable with instructions to perform specific operations and including one or more semiconductor-based logic devices (e.g., electrical hardware implemented by one or more transistors). Examples of processor circuitry include programmable microprocessors, Field Programmable Gate Arrays (FPGAs) that may instantiate instructions, Central Processor Units (CPUs), Graphics Processor Units (GPUs), Digital Signal Processors (DSPs), XPUs, or microcontrollers and integrated circuits such as Application Specific Integrated Circuits (ASICs). For example, an XPU may be implemented by a heterogeneous computing system including multiple types of processor circuitry (e.g., one or more FPGAs, one or more CPUs, one or more GPUs, one or more DSPs, etc., and/or a combination thereof) and application programming interface(s) (API(s)) that may assign computing task(s) to whichever one(s) of the multiple types of processor circuitry is/are best suited to execute the computing task(s).

DETAILED DESCRIPTION

During operation of an electronic device, one or more electronic components (e.g., a semiconductor chip, an LGA processor chip, a BGA processor chip, a PGA processor chip, a memory chip, other types of integrated circuit (IC) packages or semiconductor devices, etc.) of the electronic device may generate heat. In some cases, excessive heat may cause overheating and, thus, degradation in performance of the electronic components. To prevent overheating, some electronic devices include a heatsink thermally coupled to one or more of the electronic components to facilitate heat transfer therefrom. Some heatsinks utilize liquids and/or gases (e.g., air) to cool the electronic components.

In some electronic devices, the heatsink and a semiconductor device (e.g., a CPU, a GPU, or other IC package) being cooled thereby are assembled in an electronic heat dissipating component stack that further includes a corresponding socket to receive and electrically couple to the semiconductor device. The socket is electrically and mechanically coupled to a top surface of a printed circuit board (PCB). Further, the component stack may include a carrier coupled between the semiconductor device and the heatsink to facilitate alignment of the semiconductor device to the socket during assembly. In some cases, to prevent decoupling of the semiconductor device from the socket, one or more springs (e.g., retention springs) are coupled to a base of the heatsink and a bolster plate on the top surface of the PCB. The springs generate a downward force on the base of the heatsink, which presses the semiconductor device downward into and/or against the socket to enable retention therein and ensure adequate contact between different electrical contacts of the socket and semiconductor device. Further, the semiconductor device generates an upward force on the base of the heatsink (as a reactive force to the downward compressive force).

In some cases, during manufacture of one or more elements of the component stack, heating and/or cooling of the different materials within the elements may result in bending and/or warpage thereof. In some such cases, warpage of the semiconductor device and/or the socket may result in insufficient contact between the different electrical contacts of the semiconductor device and the socket. For instance, due to warpage, a contact load (e.g., a pin load) between the electrical contacts proximate outer edges of the semiconductor device and/or the socket may be insufficient (e.g., the contact load is less than a threshold load). In some cases, insufficient contact load between the electrical contacts disrupts and/or prevents flow of electrical signals between the semiconductor device and the socket.

Examples disclosed herein ensure sufficient contact loads are provided between electrical contacts of a semiconductor device and a socket by distributing loads from a loading mechanism of a component stack to outer edges and/or corners of the semiconductor device. In examples disclosed herein, an example carrier (e.g., a carrier plate) includes an aperture in which a semiconductor device (e.g., a semiconductor chip, a processor chip, a memory chip, an IC package) is to be disposed. The example carrier includes example springs (e.g., torsional springs, leaf springs) to contact a surface (e.g., a step surface) of the semiconductor device proximate outer edges of the semiconductor device. In some examples, the springs are positioned in example cavities of the carrier. In some such examples, example clips are placed in the cavities to hold the springs in the cavities. Additionally or alternatively, the springs may be integrally formed with the carrier. In some examples, when the loading mechanism applies a retention load on a heatsink of the component stack, the springs distribute (e.g., direct) a portion of the retention load onto the surface of the semiconductor device proximate the outer edges and/or corners. Advantageously, an increased load on the surface of the semiconductor device counteracts and/or reduces effects of warpage of the semiconductor device and/or the socket. As such, examples disclosed herein reduce parts cost and/or manufacturing cost associated with repair and/or replacement of the semiconductor device and/or socket. Further, the increased load on the surface of the semiconductor device can increase a contact force (e.g., a pin force, a pin load) between electrical contacts of the semiconductor device and the socket, thus improving reliability of signal transmission therebetween.

FIG. 1 illustrates one or more example environments in which teachings of this disclosure may be implemented. The example environment(s) of FIG. 1 can include one or more central data centers 102. The central data center(s) 102 can store a large number of servers used by, for instance, one or more organizations for data processing, storage, etc. As illustrated in FIG. 1, the central data center(s) 102 include a plurality of immersion tank(s) 104 to facilitate cooling of the servers and/or other electronic components stored at the central data center(s) 102. The immersion tank(s) 104 can provide for single-phase immersion cooling or two-phase immersion cooling.

The example environments of FIG. 1 can be part of an edge computing system. For instance, the example environments of FIG. 1 can include edge data centers or micro-data centers 106. The edge data center(s) 106 can include, for example, data centers located at a base of a cell tower. In some examples, the edge data center(s) 106 are located at or near a top of a cell tower and/or other utility pole. The edge data center(s) 106 include respective housings that store server(s), where the server(s) can be in communication with, for instance, the server(s) stored at the central data center(s) 102, client devices, and/or other computing devices in the edge network. Example housings of the edge data center(s) 106 may include materials that form one or more exterior surfaces that partially or fully protect contents therein, in which protection may include weather protection, hazardous environment protection (e.g., EMI, vibration, extreme temperatures), and/or enable submergibility. Example housings may include power circuitry to provide power for stationary and/or portable implementations, such as AC power inputs, DC power inputs, AC/DC or DC/AC converter(s), power regulators, transformers, charging circuitry, batteries, wired inputs and/or wireless power inputs. As illustrated in FIG. 1, the edge data center(s) 106 can include immersion tank(s) 108 to store server(s) and/or other electronic component(s) located at the edge data center(s) 106.

The example environment(s) of FIG. 1 can include buildings 110 for purposes of business and/or industry that store information technology (IT) equipment in, for example, one or more rooms of the building(s) 110. For example, as represented in FIG. 1, server(s) 112 can be stored with server rack(s) 114 that support the server(s) 112 (e.g., in an opening of slot of the rack 114). In some examples, the server(s) 112 located at the buildings 110 include on-premise server(s) of an edge computing network, where the on-premise server(s) are in communication with remote server(s) (e.g., the server(s) at the edge data center(s) 106) and/or other computing device(s) within an edge network.

The example environment(s) of FIG. 1 include content delivery network (CDN) data center(s) 116. The CDN data center(s) 116 of this example include server(s) 118 that cache content such as images, webpages, videos, etc. accessed via user devices. The server(s) 118 of the CDN data centers 116 can be disposed in immersion cooling tank(s) such as the immersion tanks 104, 108 shown in connection with the data centers 102, 106.

In some instances, the example data centers 102, 106, 116 and/or building(s) 110 of FIG. 1 include servers and/or other electronic components that are cooled independent of immersion tanks (e.g., the immersion tanks 104, 108) and/or an associated immersion cooling system. That is, in some examples, some or all of the servers and/or other electronic components in the data centers 102, 106, 116 and/or building(s) 110 can be cooled by air and/or liquid coolants without immersing the servers and/or other electronic components therein. Thus, in some examples, the immersion tanks 104, 108 of FIG. 1 may be omitted. Further, the example data centers 102, 106, 116 and/or building(s) 110 of FIG. 1 can correspond to, be implemented by, and/or be adaptations of the example data center 200 described in further detail below in connection with FIGS. 2-16.

Although a certain number of cooling tank(s) and other component(s) are shown in the figures, any number of such components may be present. Also, the example cooling data centers and/or other structures or environments disclosed herein are not limited to arrangements of the size that are depicted in FIG. 1. For instance, the structures containing example cooling systems and/or components thereof disclosed herein can be of a size that includes an opening to accommodate service personnel, such as the example data center(s) 106 of FIG. 1, but can also be smaller (e.g., a "doghouse" enclosure). For instance, the structures containing example cooling systems and/or components thereof disclosed herein can be sized such that access (e.g., the only access) to an interior of the structure is a port for service personnel to reach into the structure. In some examples, the structures containing example cooling systems and/or components thereof disclosed herein are be sized such that only a tool can reach into the enclosure because the structure may be supported by, for a utility pole or radio tower, or a larger structure.

Figure 2:
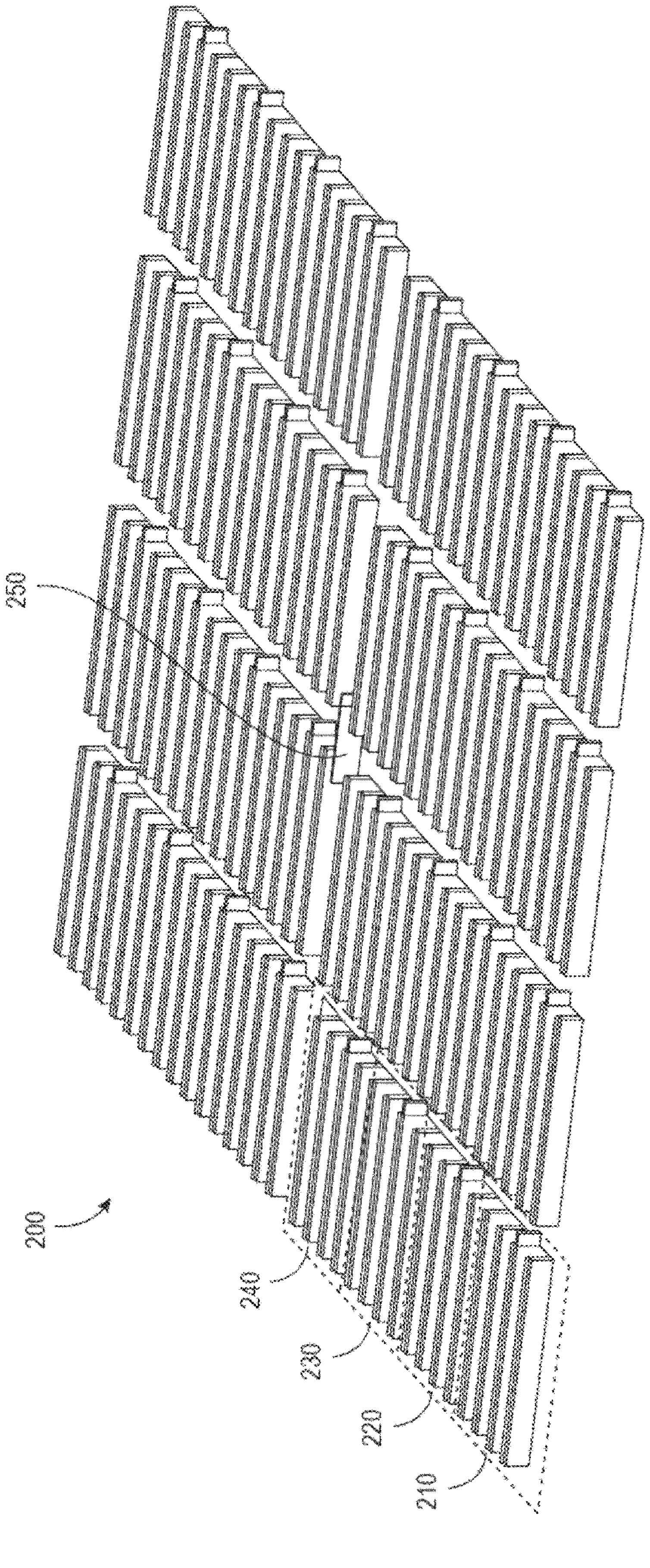
FIG. 2 illustrates at least one example of a data center for executing workloads with disaggregated resources.

FIG. 2 illustrates an example data center 200 in which disaggregated resources may cooperatively execute one or more workloads (e.g., applications on behalf of customers). The illustrated data center 200 includes multiple platforms 210, 220, 230, 240 (referred to herein as pods), each of which includes one or more rows of racks. Although the data center 200 is shown with multiple pods, in some examples, the data center 200 may be implemented as a single pod. As described in more detail herein, a rack may house multiple sleds. A sled may be primarily equipped with a particular type of resource (e.g., memory devices, data storage devices, accelerator devices, general purpose processors), i.e., resources that can be logically coupled to form a composed node. Some such nodes may act as, for example, a server. In the illustrative example, the sleds in the pods 210, 220, 230, 240 are connected to multiple pod switches (e.g., switches that route data communications to and from sleds within the pod). The pod switches, in turn, connect with spine switches 250 that switch communications among pods (e.g., the pods 210, 220, 230, 240) in the data center 200. In some examples, the sleds may be connected with a fabric using Intel Omni-Path™ technology. In other examples, the sleds may be connected with other fabrics, such as InfiniBand or Ethernet. As described in more detail herein, resources within the sleds in the data center 200 may be allocated to a group (referred to herein as a "managed node") containing resources from one or more sleds to be collectively utilized in the execution of a workload. The workload can execute as if the resources belonging to the managed node were located on the same sled. The resources in a managed node may belong to sleds belonging to different racks, and even to different pods 210, 220, 230, 240. As such, some resources of a single sled may be allocated to one managed node while other resources of the same sled are allocated to a different managed node (e.g., first processor circuitry assigned to one managed node and second processor circuitry of the same sled assigned to a different managed node).

A data center including disaggregated resources, such as the data center 200, can be used in a wide variety of contexts, such as enterprise, government, cloud service provider, and communications service provider (e.g., Telco's), as well in a wide variety of sizes, from cloud service provider mega-data centers that consume over 200,000 sq. ft. to single- or multi-rack installations for use in base stations.

In some examples, the disaggregation of resources is accomplished by using individual sleds that include predominantly a single type of resource (e.g., compute sleds including primarily compute resources, memory sleds including primarily memory resources). The disaggregation of resources in this manner, and the selective allocation and deallocation of the disaggregated resources to form a managed node assigned to execute a workload, improves the operation and resource usage of the data center 200 relative to typical data centers. Such typical data centers include hyperconverged servers containing compute, memory, storage and perhaps additional resources in a single chassis. For example, because a given sled will contain mostly resources of a same particular type, resources of that type can be upgraded independently of other resources. Additionally, because different resource types (processors, storage, accelerators, etc.) typically have different refresh rates, greater resource utilization and reduced total cost of ownership may be achieved. For example, a data center operator can upgrade the processor circuitry throughout a facility by only swapping out the compute sleds. In such a case, accelerator and storage resources may not be contemporaneously upgraded and, rather, may be allowed to continue operating until those resources are scheduled for their own refresh. Resource utilization may also increase. For example, if managed nodes are composed based on requirements of the workloads that will be running on them, resources within a node are more likely to be fully utilized. Such utilization may allow for more managed nodes to run in a data center with a given set of resources, or for a data center expected to run a given set of workloads, to be built using fewer resources.

Figure 3:
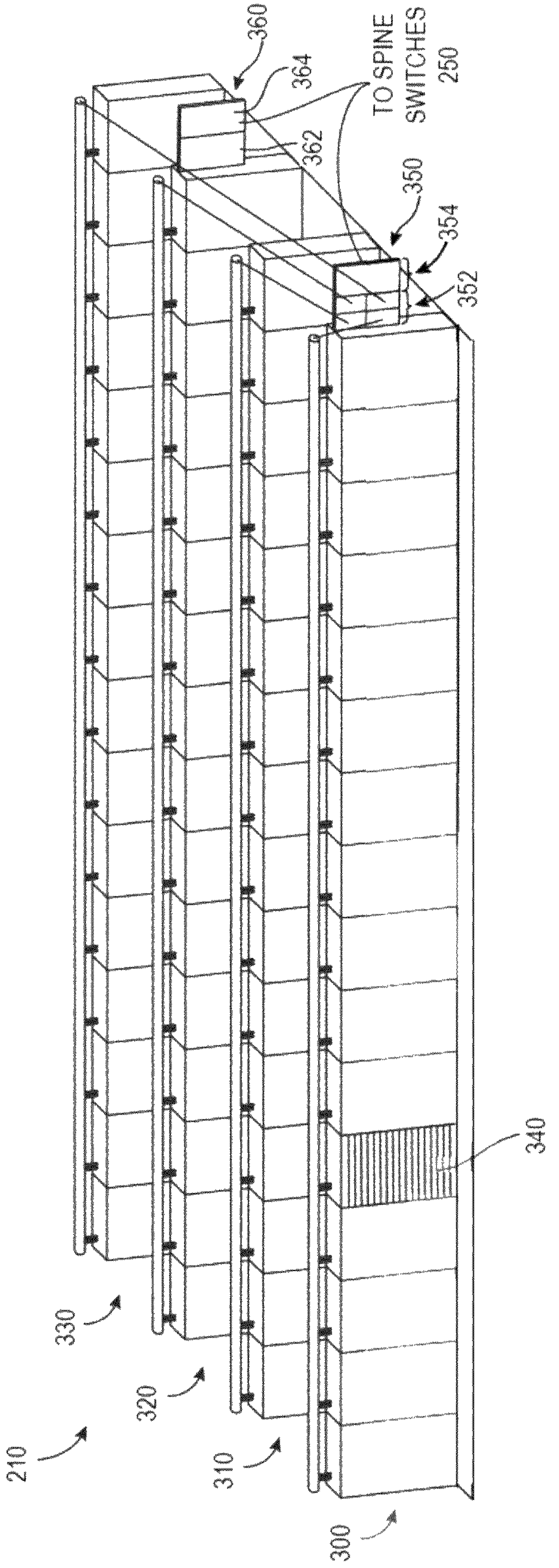
FIG. 3 illustrates at least one example of a pod that may be included in the data center of FIG. 2.

Referring now to FIG. 3, the pod 210, in the illustrative example, includes a set of rows 300, 310, 320, 330 of racks 340. Individual ones of the racks 340 may house multiple sleds (e.g., sixteen sleds) and provide power and data connections to the housed sleds, as described in more detail herein. In the illustrative example, the racks are connected to multiple pod switches 350, 360. The pod switch 350 includes a set of ports 352 to which the sleds of the racks of the pod 210 are connected and another set of ports 354 that connect the pod 210 to the spine switches 250 to provide connectivity to other pods in the data center 200. Similarly, the pod switch 360 includes a set of ports 362 to which the sleds of the racks of the pod 210 are connected and a set of ports 364 that connect the pod 210 to the spine switches 250. As such, the use of the pair of switches 350, 360 provides an amount of redundancy to the pod 210. For example, if either of the switches 350, 360 fails, the sleds in the pod 210 may still maintain data communication with the remainder of the data center 200 (e.g., sleds of other pods) through the other switch 350, 360. Furthermore, in the illustrative example, the switches 250, 350, 360 may be implemented as dual-mode optical switches, capable of routing both Ethernet protocol communications carrying Internet Protocol (IP) packets and communications according to a second, high-performance link-layer protocol (e.g., PCI Express) via optical signaling media of an optical fabric.

It should be appreciated that any one of the other pods 220, 230, 240 (as well as any additional pods of the data center 200) may be similarly structured as, and have components similar to, the pod 210 shown in and disclosed in regard to FIG. 3 (e.g., a given pod may have rows of racks housing multiple sleds as described above). Additionally, while two pod switches 350, 360 are shown, it should be understood that in other examples, a different number of pod switches may be present, providing even more failover capacity. In other examples, pods may be arranged differently than the rows-of-racks configuration shown in FIGS. 2 and 3. For example, a pod may include multiple sets of racks arranged radially, i.e., the racks are equidistant from a center switch.

Figure 4:
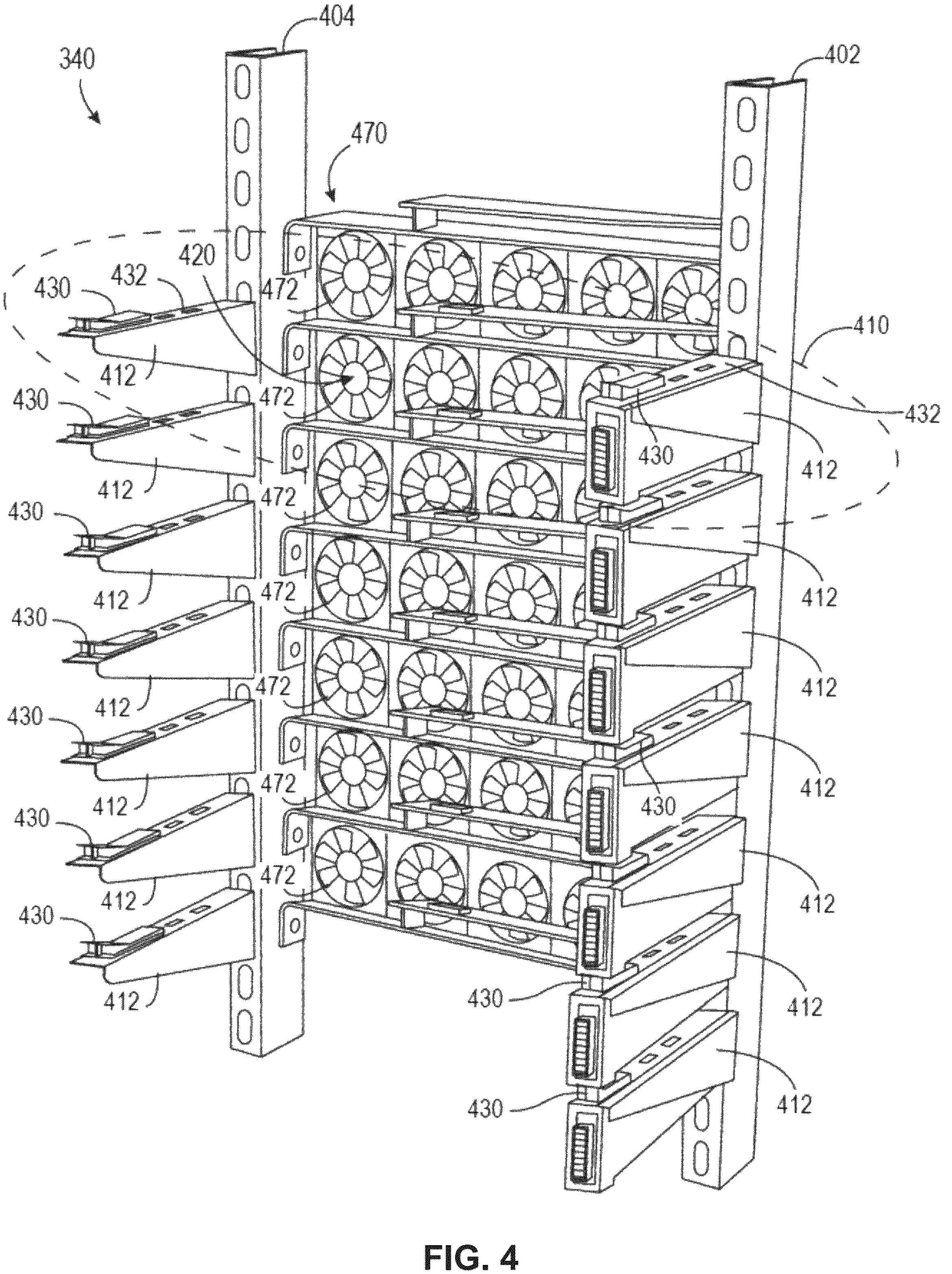
FIG. 4 is a perspective view of at least one example of a rack that may be included in the pod of FIG. 3.
Figure 5:
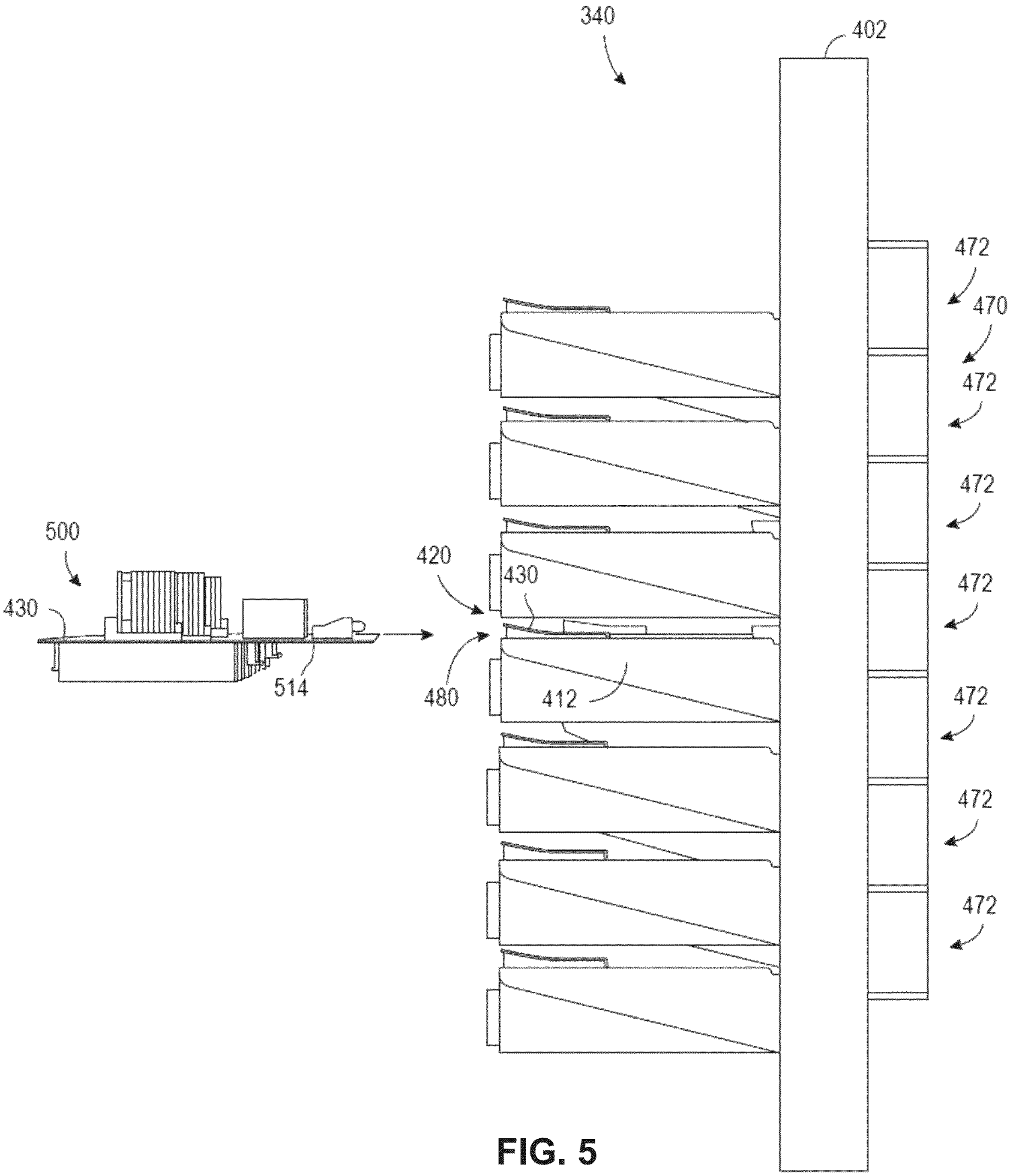
FIG. 5 is a side elevation view of the rack of FIG. 4.
Figure 6:
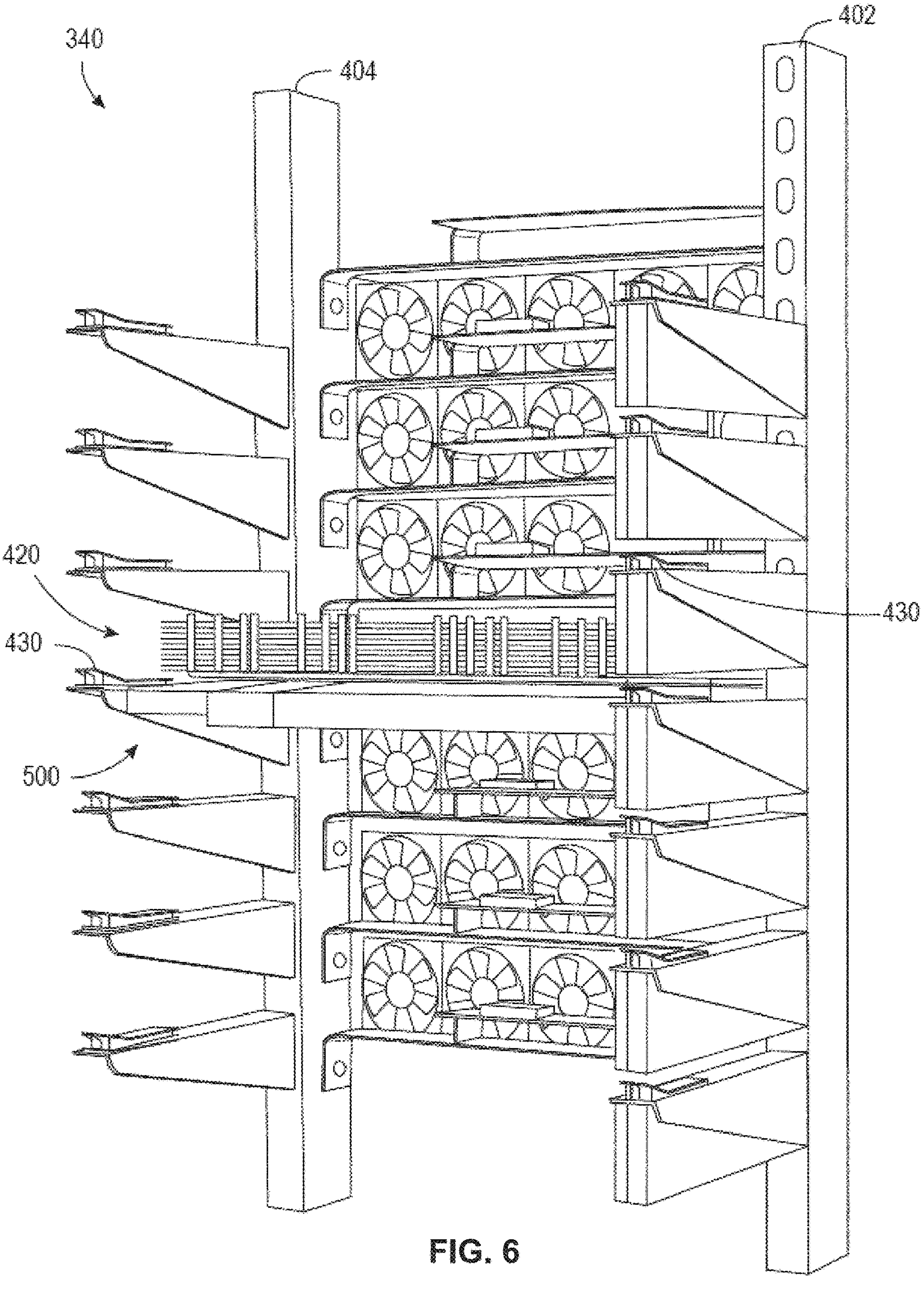
FIG. 6 is a perspective view of the rack of FIG. 4 having a sled mounted therein.

FIGS. 4-6 illustrate an example rack 340 of the data center 200. As shown in the illustrated example, the rack 340 includes two elongated support posts 402, 404, which are arranged vertically. For example, the elongated support posts 402, 404 may extend upwardly from a floor of the data center 200 when deployed. The rack 340 also includes one or more horizontal pairs 410 of elongated support arms 412 (identified in FIG. 4 via a dashed ellipse) configured to support a sled of the data center 200 as discussed below. One elongated support arm 412 of the pair of elongated support arms 412 extends outwardly from the elongated support post 402 and the other elongated support arm 412 extends outwardly from the elongated support post 404.

In the illustrative examples, at least some of the sleds of the data center 200 are chassis-less sleds. That is, such sleds have a chassis-less circuit board substrate on which physical resources (e.g., processors, memory, accelerators, storage, etc.) are mounted as discussed in more detail below. As such, the rack 340 is configured to receive the chassis-less sleds. For example, a given pair 410 of the elongated support arms 412 defines a sled slot 420 of the rack 340, which is configured to receive a corresponding chassis-less sled. To do so, the elongated support arms 412 include corresponding circuit board guides 430 configured to receive the chassis-less circuit board substrate of the sled. The circuit board guides 430 are secured to, or otherwise mounted to, a top side 432 of the corresponding elongated support arms 412. For example, in the illustrative example, the circuit board guides 430 are mounted at a distal end of the corresponding elongated support arm 412 relative to the corresponding elongated support post 402, 404. For clarity of FIGS. 4-6, not every circuit board guide 430 may be referenced in each figure. In some examples, at least some of the sleds include a chassis and the racks 340 are suitably adapted to receive the chassis.

The circuit board guides 430 include an inner wall that defines a circuit board slot 480 configured to receive the chassis-less circuit board substrate of a sled 500 when the sled 500 is received in the corresponding sled slot 420 of the rack 340. To do so, as shown in FIG. 5, a user (or robot) aligns the chassis-less circuit board substrate of an illustrative chassis-less sled 500 to a sled slot 420. The user, or robot, may then slide the chassis-less circuit board substrate forward into the sled slot 420 such that each side edge 514 of the chassis-less circuit board substrate is received in a corresponding circuit board slot 480 of the circuit board guides 430 of the pair 410 of elongated support arms 412 that define the corresponding sled slot 420 as shown in FIG. 5. By having robotically accessible and robotically manipulable sleds including disaggregated resources, the different types of resource can be upgraded independently of one other and at their own optimized refresh rate. Furthermore, the sleds are configured to blindly mate with power and data communication cables in the rack 340, enhancing their ability to be quickly removed, upgraded, reinstalled, and/or replaced. As such, in some examples, the data center 200 may operate (e.g., execute workloads, undergo maintenance and/or upgrades, etc.) without human involvement on the data center floor. In other examples, a human may facilitate one or more maintenance or upgrade operations in the data center 200.

It should be appreciated that the circuit board guides 430 are dual sided. That is, a circuit board guide 430 includes an inner wall that defines a circuit board slot 480 on each side of the circuit board guide 430. In this way, the circuit board guide 430 can support a chassis-less circuit board substrate on either side. As such, a single additional elongated support post may be added to the rack 340 to turn the rack 340 into a two-rack solution that can hold twice as many sled slots 420 as shown in FIG. 4. The illustrative rack 340 includes seven pairs 410 of elongated support arms 412 that define seven corresponding sled slots 420. The sled slots 420 are configured to receive and support a corresponding sled 500 as discussed above. In other examples, the rack 340 may include additional or fewer pairs 410 of elongated support arms 412 (i.e., additional or fewer sled slots 420). It should be appreciated that because the sled 500 is chassis-less, the sled 500 may have an overall height that is different than typical servers. As such, in some examples, the height of a given sled slot 420 may be shorter than the height of a typical server (e.g., shorter than a single rank unit, referred to as "1U"). That is, the vertical distance between pairs 410 of elongated support arms 412 may be less than a standard rack unit "1U." Additionally, due to the relative decrease in height of the sled slots 420, the overall height of the rack 340 in some examples may be shorter than the height of traditional rack enclosures. For example, in some examples, the elongated support posts 402, 404 may have a length of six feet or less. Again, in other examples, the rack 340 may have different dimensions. For example, in some examples, the vertical distance between pairs 410 of elongated support arms 412 may be greater than a standard rack unit "1U". In such examples, the increased vertical distance between the sleds allows for larger heatsinks to be attached to the physical resources and for larger fans to be used (e.g., in the fan array 470 described below) for cooling the sleds, which in turn can allow the physical resources to operate at increased power levels. Further, it should be appreciated that the rack 340 does not include any walls, enclosures, or the like. Rather, the rack 340 is an enclosure-less rack that is opened to the local environment. In some cases, an end plate may be attached to one of the elongated support posts 402, 404 in those situations in which the rack 340 forms an end-of-row rack in the data center 200.

In some examples, various interconnects may be routed upwardly or downwardly through the elongated support posts 402, 404. To facilitate such routing, the elongated support posts 402, 404 include an inner wall that defines an inner chamber in which interconnects may be located. The interconnects routed through the elongated support posts 402, 404 may be implemented as any type of interconnects including, but not limited to, data or communication interconnects to provide communication connections to the sled slots 420, power interconnects to provide power to the sled slots 420, and/or other types of interconnects.

The rack 340, in the illustrative example, includes a support platform on which a corresponding optical data connector (not shown) is mounted. Such optical data connectors are associated with corresponding sled slots 420 and are configured to mate with optical data connectors of corresponding sleds 500 when the sleds 500 are received in the corresponding sled slots 420. In some examples, optical connections between components (e.g., sleds, racks, and switches) in the data center 200 are made with a blind mate optical connection. For example, a door on a given cable may prevent dust from contaminating the fiber inside the cable. In the process of connecting to a blind mate optical connector mechanism, the door is pushed open when the end of the cable approaches or enters the connector mechanism. Subsequently, the optical fiber inside the cable may enter a gel within the connector mechanism and the optical fiber of one cable comes into contact with the optical fiber of another cable within the gel inside the connector mechanism.

The illustrative rack 340 also includes a fan array 470 coupled to the cross-support arms of the rack 340. The fan array 470 includes one or more rows of cooling fans 472, which are aligned in a horizontal line between the elongated support posts 402, 404. In the illustrative example, the fan array 470 includes a row of cooling fans 472 for the different sled slots 420 of the rack 340. As discussed above, the sleds 500 do not include any on-board cooling system in the illustrative example and, as such, the fan array 470 provides cooling for such sleds 500 received in the rack 340. In other examples, some or all of the sleds 500 can include on-board cooling systems. Further, in some examples, the sleds 500 and/or the racks 340 may include and/or incorporate a liquid and/or immersion cooling system to facilitate cooling of electronic component(s) on the sleds 500. The rack 340, in the illustrative example, also includes different power supplies associated with different ones of the sled slots 420. A given power supply is secured to one of the elongated support arms 412 of the pair 410 of elongated support arms 412 that define the corresponding sled slot 420. For example, the rack 340 may include a power supply coupled or secured to individual ones of the elongated support arms 412 extending from the elongated support post 402. A given power supply includes a power connector configured to mate with a power connector of a sled 500 when the sled 500 is received in the corresponding sled slot 420. In the illustrative example, the sled 500 does not include any on-board power supply and, as such, the power supplies provided in the rack 340 supply power to corresponding sleds 500 when mounted to the rack 340. A given power supply is configured to satisfy the power requirements for its associated sled, which can differ from sled to sled. Additionally, the power supplies provided in the rack 340 can operate independent of each other. That is, within a single rack, a first power supply providing power to a compute sled can provide power levels that are different than power levels supplied by a second power supply providing power to an accelerator sled. The power supplies may be controllable at the sled level or rack level, and may be controlled locally by components on the associated sled or remotely, such as by another sled or an orchestrator.

Figure 7:
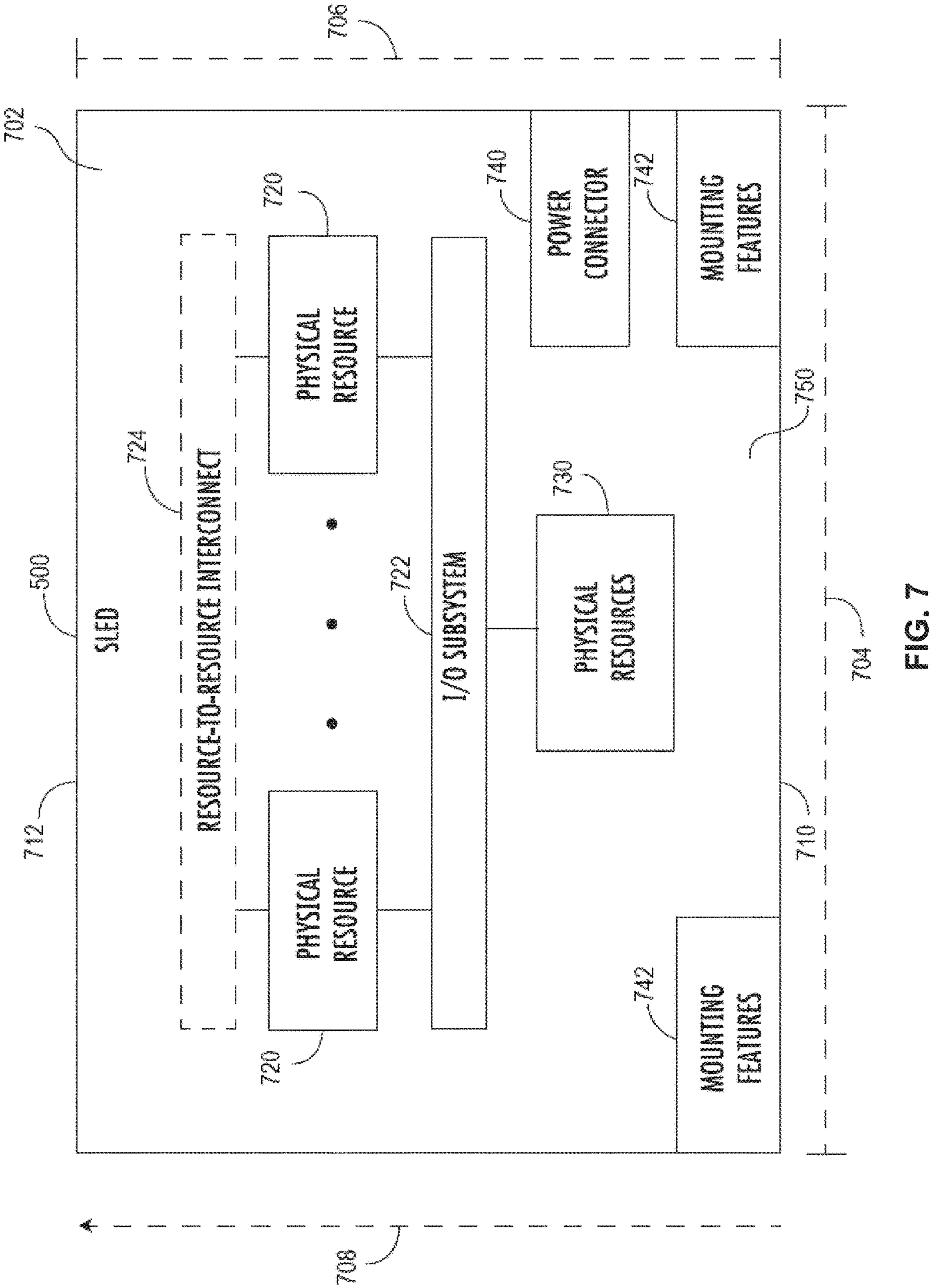
FIG. 7 is a is a block diagram of at least one example of a top side of the sled of FIG. 6.

Referring now to FIG. 7, the sled 500, in the illustrative example, is configured to be mounted in a corresponding rack 340 of the data center 200 as discussed above. In some examples, a give sled 500 may be optimized or otherwise configured for performing particular tasks, such as compute tasks, acceleration tasks, data storage tasks, etc. For example, the sled 500 may be implemented as a compute sled 900 as discussed below in regard to FIGS. 9 and 10, an accelerator sled 1100 as discussed below in regard to FIGS. 11 and 12, a storage sled 1300 as discussed below in regard to FIGS. 13 and 14, or as a sled optimized or otherwise configured to perform other specialized tasks, such as a memory sled 1500, discussed below in regard to FIG. 15.

As discussed above, the illustrative sled 500 includes a chassis-less circuit board substrate 702, which supports various physical resources (e.g., electrical components) mounted thereon. It should be appreciated that the circuit board substrate 702 is "chassis-less" in that the sled 500 does not include a housing or enclosure. Rather, the chassis-less circuit board substrate 702 is open to the local environment. The chassis-less circuit board substrate 702 may be formed from any material capable of supporting the various electrical components mounted thereon. For example, in an illustrative example, the chassis-less circuit board substrate 702 is formed from an FR-4 glass-reinforced epoxy laminate material. Other materials may be used to form the chassis-less circuit board substrate 702 in other examples.

As discussed in more detail below, the chassis-less circuit board substrate 702 includes multiple features that improve the thermal cooling characteristics of the various electrical components mounted on the chassis-less circuit board substrate 702. As discussed, the chassis-less circuit board substrate 702 does not include a housing or enclosure, which may improve the airflow over the electrical components of the sled 500 by reducing those structures that may inhibit air flow. For example, because the chassis-less circuit board substrate 702 is not positioned in an individual housing or enclosure, there is no vertically-arranged backplane (e.g., a back plate of the chassis) attached to the chassis-less circuit board substrate 702, which could inhibit air flow across the electrical components. Additionally, the chassis-less circuit board substrate 702 has a geometric shape configured to reduce the length of the airflow path across the electrical components mounted to the chassis-less circuit board substrate 702. For example, the illustrative chassis-less circuit board substrate 702 has a width 704 that is greater than a depth 706 of the chassis-less circuit board substrate 702. In one particular example, the chassis-less circuit board substrate 702 has a width of about 21 inches and a depth of about 9 inches, compared to a typical server that has a width of about 17 inches and a depth of about 39 inches. As such, an airflow path 708 that extends from a front edge 710 of the chassis-less circuit board substrate 702 toward a rear edge 712 has a shorter distance relative to typical servers, which may improve the thermal cooling characteristics of the sled 500. Furthermore, although not illustrated in FIG. 7, the various physical resources mounted to the chassis-less circuit board substrate 702 in this example are mounted in corresponding locations such that no two substantively heat-producing electrical components shadow each other as discussed in more detail below. That is, no two electrical components, which produce appreciable heat during operation (i.e., greater than a nominal heat sufficient enough to adversely impact the cooling of another electrical component), are mounted to the chassis-less circuit board substrate 702 linearly in-line with each other along the direction of the airflow path 708 (i.e., along a direction extending from the front edge 710 toward the rear edge 712 of the chassis-less circuit board substrate 702). The placement and/or structure of the features may be suitable adapted when the electrical component(s) are being cooled via liquid (e.g., one phase or two phase immersion cooling).

As discussed above, the illustrative sled 500 includes one or more physical resources 720 mounted to a top side 750 of the chassis-less circuit board substrate 702. Although two physical resources 720 are shown in FIG. 7, it should be appreciated that the sled 500 may include one, two, or more physical resources 720 in other examples. The physical resources 720 may be implemented as any type of processor, controller, or other compute circuit capable of performing various tasks such as compute functions and/or controlling the functions of the sled 500 depending on, for example, the type or intended functionality of the sled 500. For example, as discussed in more detail below, the physical resources 720 may be implemented as high-performance processors in examples in which the sled 500 is implemented as a compute sled, as accelerator co-processors or circuits in examples in which the sled 500 is implemented as an accelerator sled, storage controllers in examples in which the sled 500 is implemented as a storage sled, or a set of memory devices in examples in which the sled 500 is implemented as a memory sled.

The sled 500 also includes one or more additional physical resources 730 mounted to the top side 750 of the chassis-less circuit board substrate 702. In the illustrative example, the additional physical resources include a network interface controller (NIC) as discussed in more detail below. Depending on the type and functionality of the sled 500, the physical resources 730 may include additional or other electrical components, circuits, and/or devices in other examples.

The physical resources 720 are communicatively coupled to the physical resources 730 via an input/output (I/O) subsystem 722. The I/O subsystem 722 may be implemented as circuitry and/or components to facilitate input/output operations with the physical resources 720, the physical resources 730, and/or other components of the sled 500. For example, the I/O subsystem 722 may be implemented as, or otherwise include, memory controller hubs, input/output control hubs, integrated sensor hubs, firmware devices, communication links (e.g., point-to-point links, bus links, wires, cables, waveguides, light guides, printed circuit board traces, etc.), and/or other components and subsystems to facilitate the input/output operations. In the illustrative example, the I/O subsystem 722 is implemented as, or otherwise includes, a double data rate 4 (DDR4) data bus or a DDR5 data bus.

In some examples, the sled 500 may also include a resource-to-resource interconnect 724. The resource-to-resource interconnect 724 may be implemented as any type of communication interconnect capable of facilitating resource-to-resource communications. In the illustrative example, the resource-to-resource interconnect 724 is implemented as a high-speed point-to-point interconnect (e.g., faster than the I/O subsystem 722). For example, the resource-to-resource interconnect 724 may be implemented as a QuickPath Interconnect (QPI), an UltraPath Interconnect (UPI), or other high-speed point-to-point interconnect dedicated to resource-to-resource communications.

The sled 500 also includes a power connector 740 configured to mate with a corresponding power connector of the rack 340 when the sled 500 is mounted in the corresponding rack 340. The sled 500 receives power from a power supply of the rack 340 via the power connector 740 to supply power to the various electrical components of the sled 500. That is, the sled 500 does not include any local power supply (i.e., an on-board power supply) to provide power to the electrical components of the sled 500. The exclusion of a local or on-board power supply facilitates the reduction in the overall footprint of the chassis-less circuit board substrate 702, which may increase the thermal cooling characteristics of the various electrical components mounted on the chassis-less circuit board substrate 702 as discussed above. In some examples, voltage regulators are placed on a bottom side 850

(see FIG. 8) of the chassis-less circuit board substrate 702 directly opposite of processor circuitry 920 (see FIG. 9), and power is routed from the voltage regulators to the processor circuitry 920 by vias extending through the circuit board substrate 702. Such a configuration provides an increased thermal budget, additional current and/or voltage, and better voltage control relative to typical printed circuit boards in which processor power is delivered from a voltage regulator, in part, by printed circuit traces.

In some examples, the sled 500 may also include mounting features 742 configured to mate with a mounting arm, or other structure, of a robot to facilitate the placement of the sled 700 in a rack 340 by the robot. The mounting features 742 may be implemented as any type of physical structures that allow the robot to grasp the sled 500 without damaging the chassis-less circuit board substrate 702 or the electrical components mounted thereto. For example, in some examples, the mounting features 742 may be implemented as non-conductive pads attached to the chassis-less circuit board substrate 702. In other examples, the mounting features may be implemented as brackets, braces, or other similar structures attached to the chassis-less circuit board substrate 702. The particular number, shape, size, and/or make-up of the mounting feature 742 may depend on the design of the robot configured to manage the sled 500.

Figure 8:
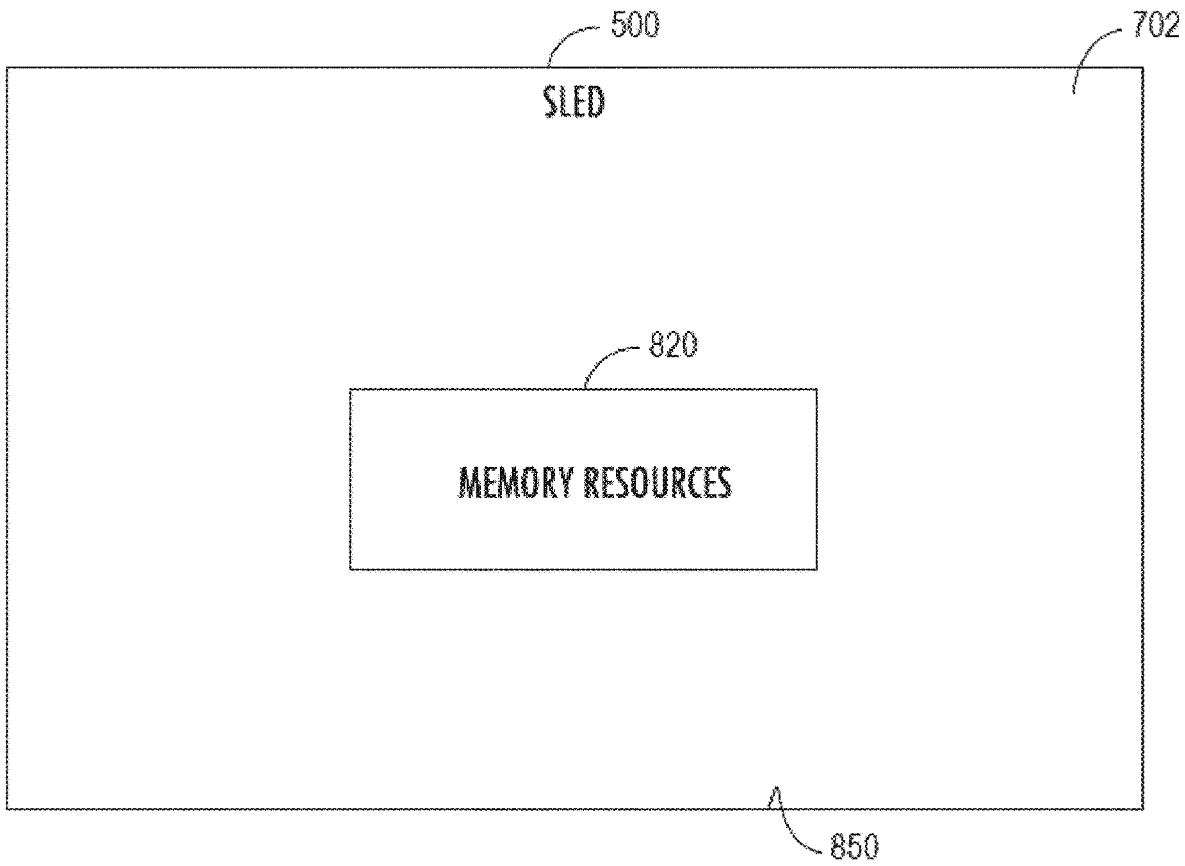
FIG. 8 is a block diagram of at least one example of a bottom side of the sled of FIG. 7.

Referring now to FIG. 8, in addition to the physical resources 730 mounted on the top side 750 of the chassis-less circuit board substrate 702, the sled 500 also includes one or more memory devices 820 mounted to a bottom side 850 of the chassis-less circuit board substrate 702. That is, the chassis-less circuit board substrate 702 is implemented as a double-sided circuit board. The physical resources 720 are communicatively coupled to the memory devices 820 via the I/O subsystem 722. For example, the physical resources 720 and the memory devices 820 may be communicatively coupled by one or more vias extending through the chassis-less circuit board substrate 702. Different ones of the physical resources 720 may be communicatively coupled to different sets of one or more memory devices 820 in some examples. Alternatively, in other examples, different ones of the physical resources 720 may be communicatively coupled to the same ones of the memory devices 820.

The memory devices 820 may be implemented as any type of memory device capable of storing data for the physical resources 720 during operation of the sled 500, such as any type of volatile (e.g., dynamic random access memory (DRAM), etc.) or non-volatile memory. Volatile memory may be a storage medium that requires power to maintain the state of data stored by the medium. Non-limiting examples of volatile memory may include various types of random access memory (RAM), such as dynamic random access memory (DRAM) or static random access memory (SRAM). One particular type of DRAM that may be used in a memory module is synchronous dynamic random access memory (SDRAM). In particular examples, DRAM of a memory component may comply with a standard promulgated by JEDEC, such as JESD79F for DDR SDRAM, JESD79-2F for DDR2 SDRAM, JESD79-3F for DDR3 SDRAM, JESD79-4A for DDR4 SDRAM, JESD209 for Low Power DDR (LPDDR), JESD209-2 for LPDDR2, JESD209-3 for LPDDR3, and JESD209-4 for LPDDR4. Such standards (and similar standards) may be referred to as DDR-based standards and communication interfaces of the storage devices that implement such standards may be referred to as DDR-based interfaces.

In one example, the memory device is a block addressable memory device, such as those based on NAND or NOR technologies. A memory device may also include next-generation nonvolatile devices, such as Intel 3D XPoint™ memory or other byte addressable write-in-place nonvolatile memory devices. In one example, the memory device may be or may include memory devices that use chalcogenide glass, multi-threshold level NAND flash memory, NOR flash memory, single or multi-level Phase Change Memory (PCM), a resistive memory, nanowire memory, ferroelectric transistor random access memory (FeTRAM), anti-ferroelectric memory, magnetoresistive random access memory (MRAM) memory that incorporates memristor technology, resistive memory including the metal oxide base, the oxygen vacancy base and the conductive bridge Random Access Memory (CB-RAM), or spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory. The memory device may refer to the die itself and/or to a packaged memory product. In some examples, the memory device may include a transistor-less stackable cross point architecture in which memory cells sit at the intersection of word lines and bit lines and are individually addressable and in which bit storage is based on a change in bulk resistance.

Figure 9:
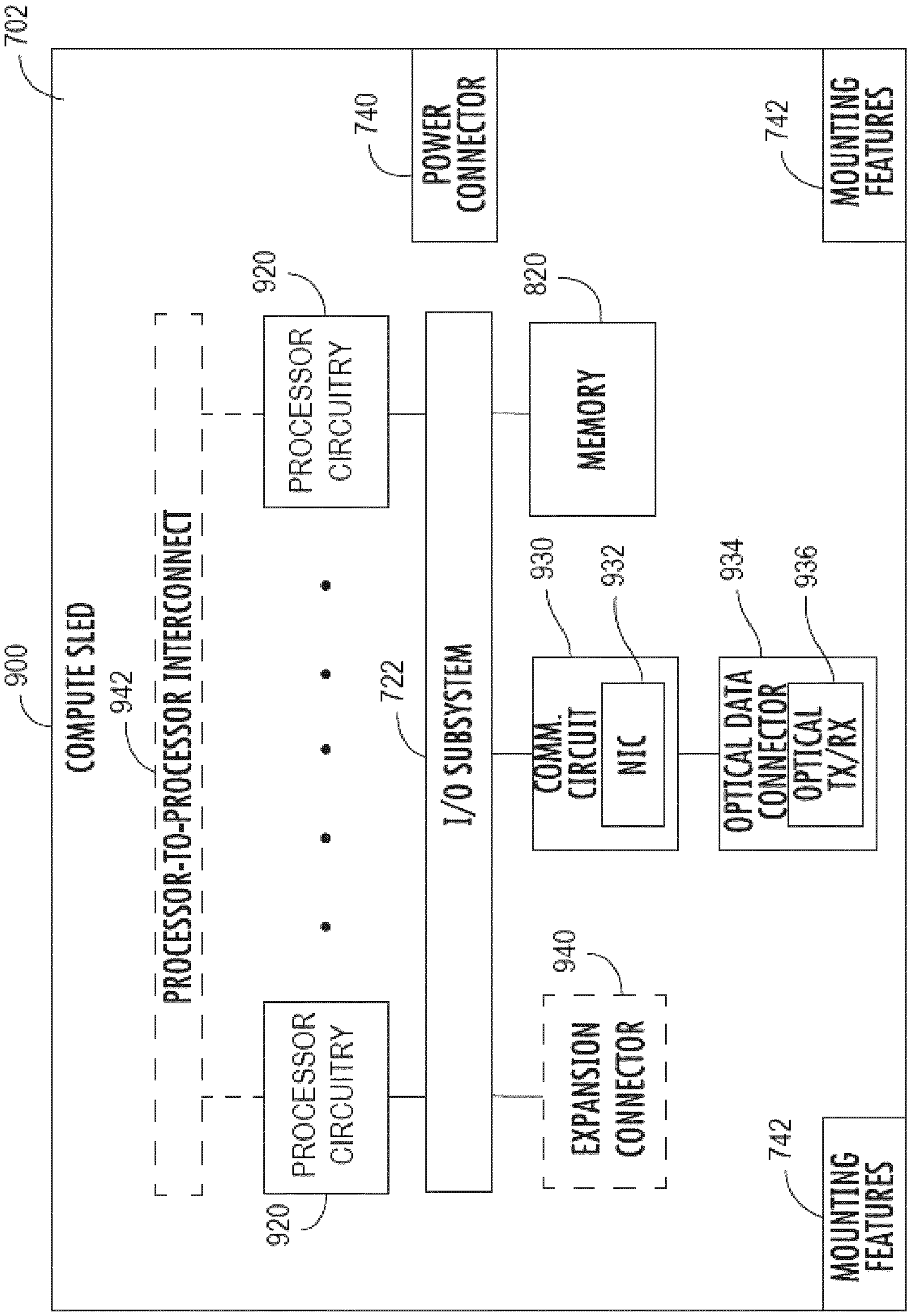
FIG. 9 is a block diagram of at least one example of a compute sled usable in the data center of FIG. 2.

Referring now to FIG. 9, in some examples, the sled 500 may be implemented as a compute sled 900. The compute sled 900 is optimized, or otherwise configured, to perform compute tasks. As discussed above, the compute sled 900 may rely on other sleds, such as acceleration sleds and/or storage sleds, to perform such compute tasks. The compute sled 900 includes various physical resources (e.g., electrical components) similar to the physical resources of the sled 500, which have been identified in FIG. 9 using the same reference numbers. The description of such components provided above in regard to FIGS. 7 and 8 applies to the corresponding components of the compute sled 900 and is not repeated herein for clarity of the description of the compute sled 900.

In the illustrative compute sled 900, the physical resources 720 include processor circuitry 920. Although only two blocks of processor circuitry 920 are shown in FIG. 9, it should be appreciated that the compute sled 900 may include additional processor circuits 920 in other examples. Illustratively, the processor circuitry 920 corresponds to high-performance processors 920 and may be configured to operate at a relatively high power rating. Although the high-performance processor circuitry 920 generates additional heat operating at power ratings greater than typical processors (which operate at around 155-230 W), the enhanced thermal cooling characteristics of the chassis-less circuit board substrate 702 discussed above facilitate the higher power operation. For example, in the illustrative example, the processor circuitry 920 is configured to operate at a power rating of at least 250 W. In some examples, the processor circuitry 920 may be configured to operate at a power rating of at least 350 W.

In some examples, the compute sled 900 may also include a processor-to-processor interconnect 942. Similar to the resource-to-resource interconnect 724 of the sled 500 discussed above, the processor-to-processor interconnect 942 may be implemented as any type of communication interconnect capable of facilitating processor-to-processor interconnect 942 communications. In the illustrative example, the processor-to-processor interconnect 942 is implemented as a high-speed point-to-point interconnect (e.g., faster than the I/O subsystem 722). For example, the processor-to-processor interconnect 942 may be implemented as a QuickPath Interconnect (QPI), an UltraPath Interconnect (UPI), or other high-speed point-to-point interconnect dedicated to processor-to-processor communications.

The compute sled 900 also includes a communication circuit 930. The illustrative communication circuit 930 includes a network interface controller (NIC) 932, which may also be referred to as a host fabric interface (HFI). The NIC 932 may be implemented as, or otherwise include, any type of integrated circuit, discrete circuits, controller chips, chipsets, add-in-boards, daughtercards, network interface cards, or other devices that may be used by the compute sled 900 to connect with another compute device (e.g., with other sleds 500). In some examples, the NIC 932 may be implemented as part of a system-on-a-chip (SoC) that includes one or more processors, or included on a multichip package that also contains one or more processors. In some examples, the NIC 932 may include a local processor (not shown) and/or a local memory (not shown) that are both local to the NIC 932. In such examples, the local processor of the NIC 932 may be capable of performing one or more of the functions of the processor circuitry 920. Additionally or alternatively, in such examples, the local memory of the NIC 932 may be integrated into one or more components of the compute sled at the board level, socket level, chip level, and/or other levels.

The communication circuit 930 is communicatively coupled to an optical data connector 934. The optical data connector 934 is configured to mate with a corresponding optical data connector of the rack 340 when the compute sled 900 is mounted in the rack 340. Illustratively, the optical data connector 934 includes a plurality of optical fibers which lead from a mating surface of the optical data connector 934 to an optical transceiver 936. The optical transceiver 936 is configured to convert incoming optical signals from the rack-side optical data connector to electrical signals and to convert electrical signals to outgoing optical signals to the rack-side optical data connector. Although shown as forming part of the optical data connector 934 in the illustrative example, the optical transceiver 936 may form a portion of the communication circuit 930 in other examples.

In some examples, the compute sled 900 may also include an expansion connector 940. In such examples, the expansion connector 940 is configured to mate with a corresponding connector of an expansion chassis-less circuit board substrate to provide additional physical resources to the compute sled 900. The additional physical resources may be used, for example, by the processor circuitry 920 during operation of the compute sled 900. The expansion chassis-less circuit board substrate may be substantially similar to the chassis-less circuit board substrate 702 discussed above and may include various electrical components mounted thereto. The particular electrical components mounted to the expansion chassis-less circuit board substrate may depend on the intended functionality of the expansion chassis-less circuit board substrate. For example, the expansion chassis-less circuit board substrate may provide additional compute resources, memory resources, and/or storage resources. As such, the additional physical resources of the expansion chassis-less circuit board substrate may include, but is not limited to, processors, memory devices, storage devices, and/or accelerator circuits including, for example, field programmable gate arrays (FPGA), application-specific integrated circuits (ASICs), security co-processors, graphics processing units (GPUs), machine learning circuits, or other specialized processors, controllers, devices, and/or circuits.

Figure 10:
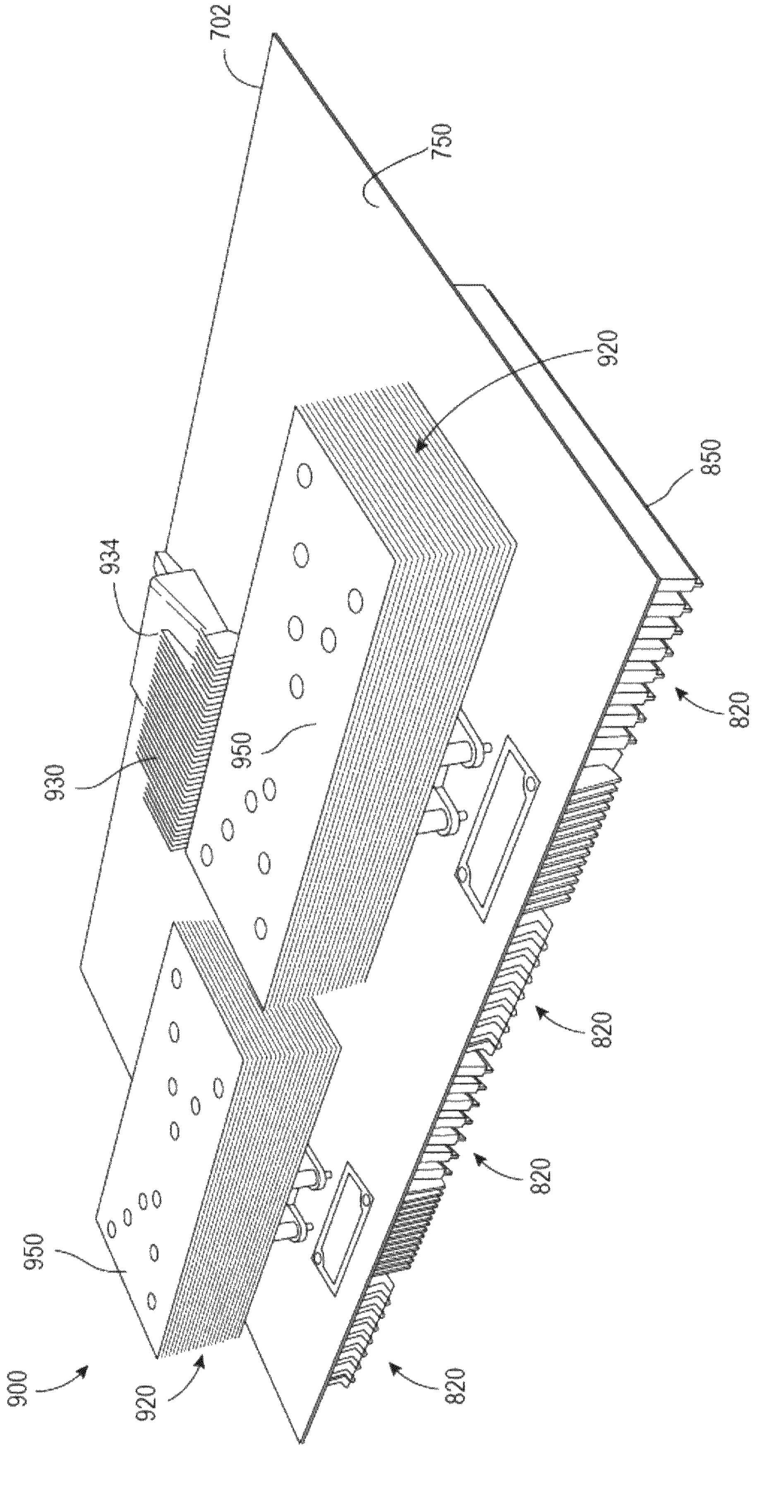
FIG. 10 is a top perspective view of at least one example of the compute sled of FIG. 9.

Referring now to FIG. 10, an illustrative example of the compute sled 900 is shown. As shown, the processor circuitry 920, communication circuit 930, and optical data connector 934 are mounted to the top side 750 of the chassis-less circuit board substrate 702. Any suitable attachment or mounting technology may be used to mount the physical resources of the compute sled 900 to the chassis-less circuit board substrate 702. For example, the various physical resources may be mounted in corresponding sockets (e.g., a processor socket), holders, or brackets. In some cases, some of the electrical components may be directly mounted to the chassis-less circuit board substrate 702 via soldering or similar techniques.

As discussed above, the separate processor circuitry 920 and the communication circuit 930 are mounted to the top side 750 of the chassis-less circuit board substrate 702 such that no two heat-producing, electrical components shadow each other. In the illustrative example, the processor circuitry 920 and the communication circuit 930 are mounted in corresponding locations on the top side 750 of the chassis-less circuit board substrate 702 such that no two of those physical resources are linearly in-line with others along the direction of the airflow path 708. It should be appreciated that, although the optical data connector 934 is in-line with the communication circuit 930, the optical data connector 934 produces no or nominal heat during operation.

The memory devices 820 of the compute sled 900 are mounted to the bottom side 850 of the of the chassis-less circuit board substrate 702 as discussed above in regard to the sled 500. Although mounted to the bottom side 850, the memory devices 820 are communicatively coupled to the processor circuitry 920 located on the top side 750 via the I/O subsystem 722. Because the chassis-less circuit board substrate 702 is implemented as a double-sided circuit board, the memory devices 820 and the processor circuitry 920 may be communicatively coupled by one or more vias, connectors, or other mechanisms extending through the chassis-less circuit board substrate 702. Different processor circuitry 920 (e.g., different processors) may be communicatively coupled to a different set of one or more memory devices 820 in some examples. Alternatively, in other examples, different processor circuitry 920 (e.g., different processors) may be communicatively coupled to the same ones of the memory devices 820. In some examples, the memory devices 820 may be mounted to one or more memory mezzanines on the bottom side of the chassis-less circuit board substrate 702 and may interconnect with a corresponding processor circuitry 920 through a ball-grid array.

Different processor circuitry 920 (e.g., different processors) include and/or is associated with corresponding heatsinks 950 secured thereto. Due to the mounting of the memory devices 820 to the bottom side 850 of the chassis-less circuit board substrate 702 (as well as the vertical spacing of the sleds 500 in the corresponding rack 340), the top side 750 of the chassis-less circuit board substrate 702 includes additional "free" area or space that facilitates the use of heatsinks 950 having a larger size relative to traditional heatsinks used in typical servers. Additionally, due to the improved thermal cooling characteristics of the chassis-less circuit board substrate 702, none of the processor heatsinks 950 include cooling fans attached thereto. That is, the heatsinks 950 may be fan-less heatsinks. In some examples, the heatsinks 950 mounted atop the processor circuitry 920 may overlap with the heatsink attached to the communication circuit 930 in the direction of the airflow path 708 due to their increased size, as illustratively suggested by FIG. 10.

Figure 11:
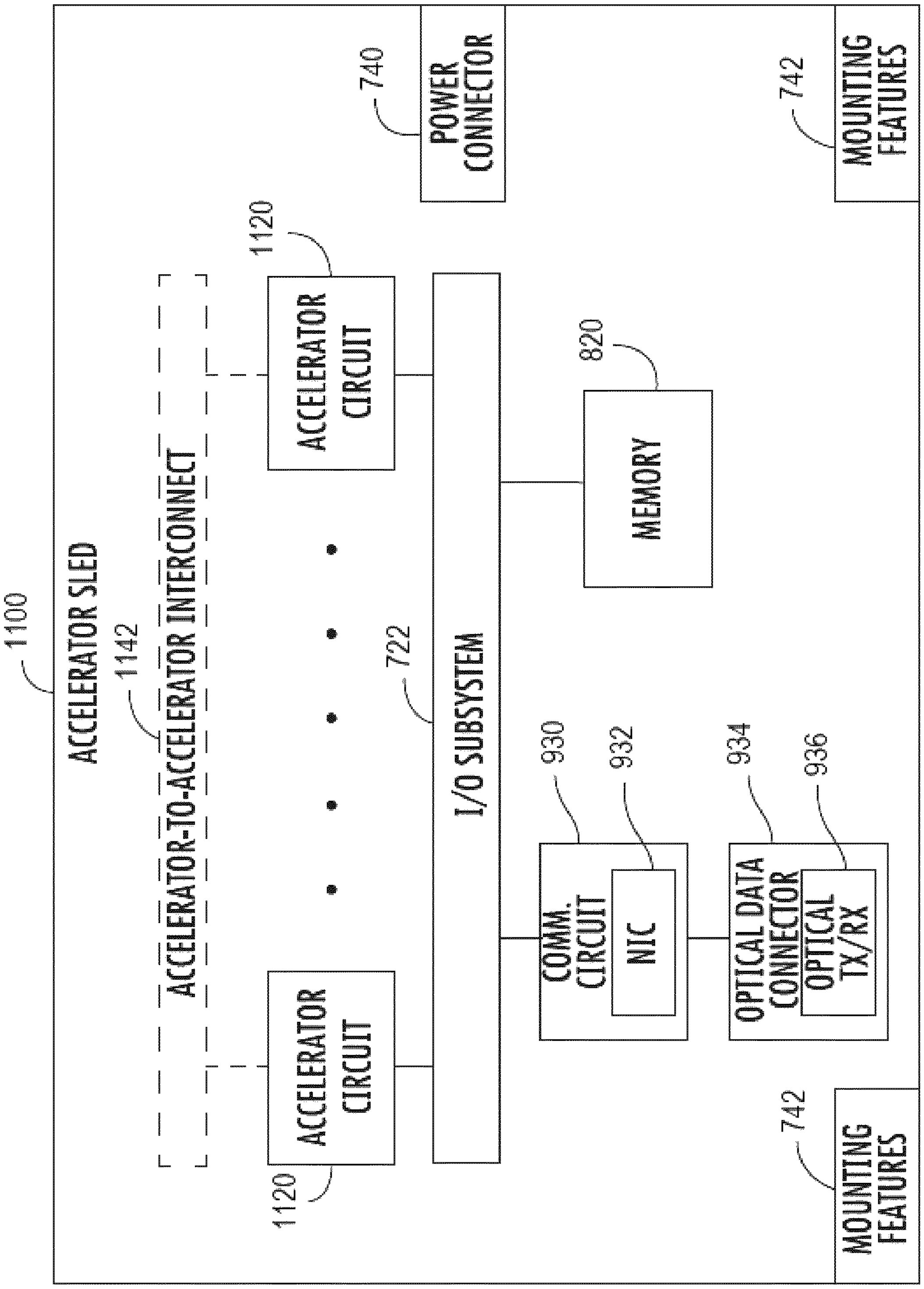
FIG. 11 is a block diagram of at least one example of an accelerator sled usable in the data center of FIG. 2.

Referring now to FIG. 11, in some examples, the sled 500 may be implemented as an accelerator sled 1100. The accelerator sled 1100 is configured, to perform specialized compute tasks, such as machine learning, encryption, hashing, or other computational-intensive task. In some examples, for example, a compute sled 900 may offload tasks to the accelerator sled 1100 during operation. The accelerator sled 1100 includes various components similar to components of the sled 500 and/or the compute sled 900, which have been identified in FIG. 11 using the same reference numbers. The description of such components provided above in regard to FIGS. 7, 8, and 9 apply to the corresponding components of the accelerator sled 1100 and is not repeated herein for clarity of the description of the accelerator sled 1100.

Figure 12:
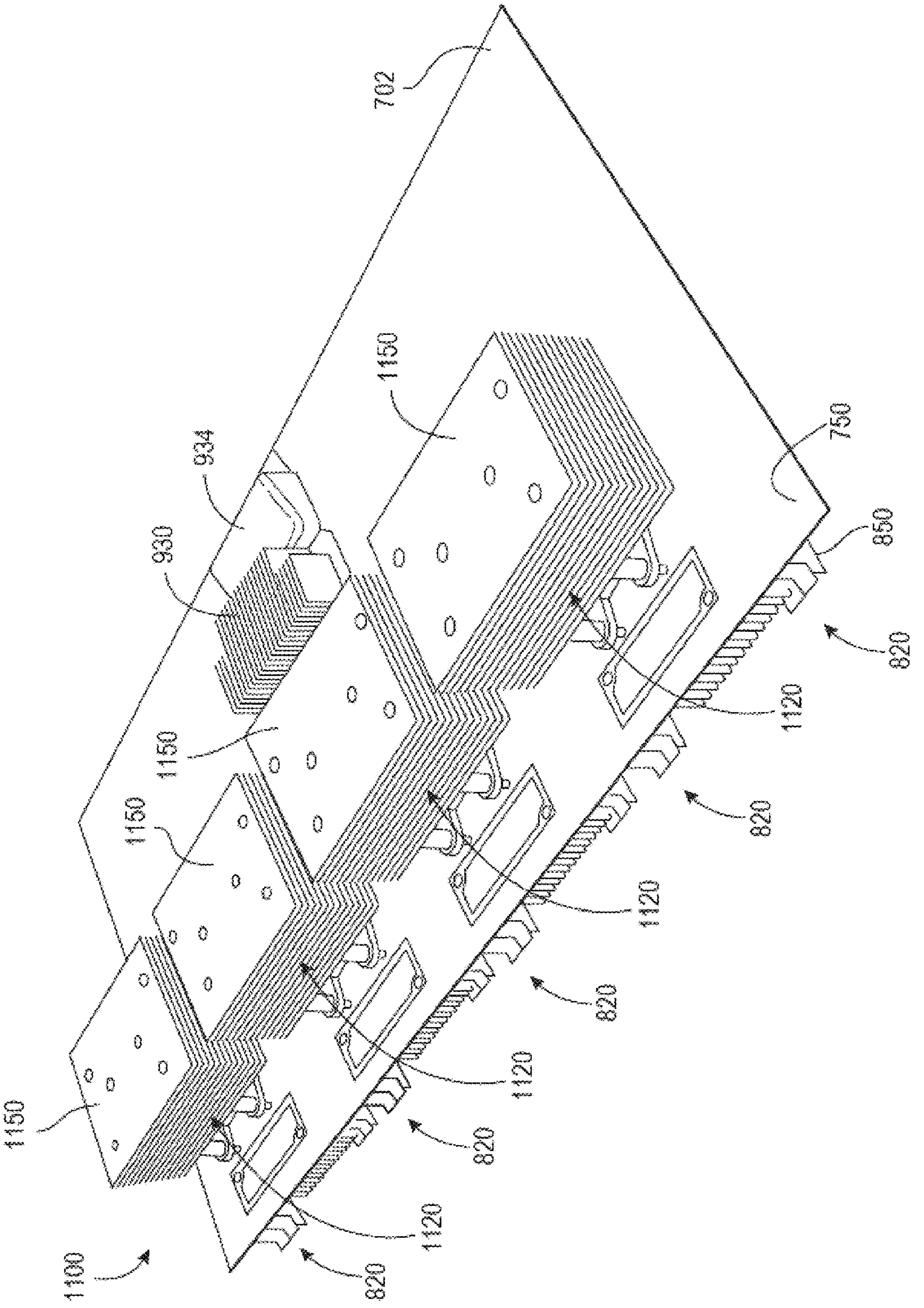
FIG. 12 is a top perspective view of at least one example of the accelerator sled of FIG. 10.

In the illustrative accelerator sled 1100, the physical resources 720 include accelerator circuits 1120. Although only two accelerator circuits 1120 are shown in FIG. 11, it should be appreciated that the accelerator sled 1100 may include additional accelerator circuits 1120 in other examples. For example, as shown in FIG. 12, the accelerator sled 1100 may include four accelerator circuits 1120. The accelerator circuits 1120 may be implemented as any type of processor, co-processor, compute circuit, or other device capable of performing compute or processing operations. For example, the accelerator circuits 1120 may be implemented as, for example, field programmable gate arrays (FPGA), application-specific integrated circuits (ASICs), security co-processors, graphics processing units (GPUs), neuromorphic processor units, quantum computers, machine learning circuits, or other specialized processors, controllers, devices, and/or circuits.

In some examples, the accelerator sled 1100 may also include an accelerator-to-accelerator interconnect 1142. Similar to the resource-to-resource interconnect 724 of the sled 700 discussed above, the accelerator-to-accelerator interconnect 1142 may be implemented as any type of communication interconnect capable of facilitating accelerator-to-accelerator communications. In the illustrative example, the accelerator-to-accelerator interconnect 1142 is implemented as a high-speed point-to-point interconnect (e.g., faster than the I/O subsystem 722). For example, the accelerator-to-accelerator interconnect 1142 may be implemented as a QuickPath Interconnect (QPI), an UltraPath Interconnect (UPI), or other high-speed point-to-point interconnect dedicated to processor-to-processor communications. In some examples, the accelerator circuits 1120 may be daisy-chained with a primary accelerator circuit 1120 connected to the NIC 932 and memory 820 through the I/O subsystem 722 and a secondary accelerator circuit 1120 connected to the NIC 932 and memory 820 through a primary accelerator circuit 1120.

Referring now to FIG. 12, an illustrative example of the accelerator sled 1100 is shown. As discussed above, the accelerator circuits 1120, the communication circuit 930, and the optical data connector 934 are mounted to the top side 750 of the chassis-less circuit board substrate 702. Again, the individual accelerator circuits 1120 and communication circuit 930 are mounted to the top side 750 of the chassis-less circuit board substrate 702 such that no two heat-producing, electrical components shadow each other as discussed above. The memory devices 820 of the accelerator sled 1100 are mounted to the bottom side 850 of the of the chassis-less circuit board substrate 702 as discussed above in regard to the sled 700. Although mounted to the bottom side 850, the memory devices 820 are communicatively coupled to the accelerator circuits 1120 located on the top side 750 via the I/O subsystem 722 (e.g., through vias). Further, the accelerator circuits 1120 may include and/or be associated with a heatsink 1150 that is larger than a traditional heatsink used in a server. As discussed above with reference to the heatsinks 950 of FIG. 9, the heatsinks 1150 may be larger than traditional heatsinks because of the "free" area provided by the memory resources 820 being located on the bottom side 850 of the chassis-less circuit board substrate 702 rather than on the top side 750.

Figure 13:
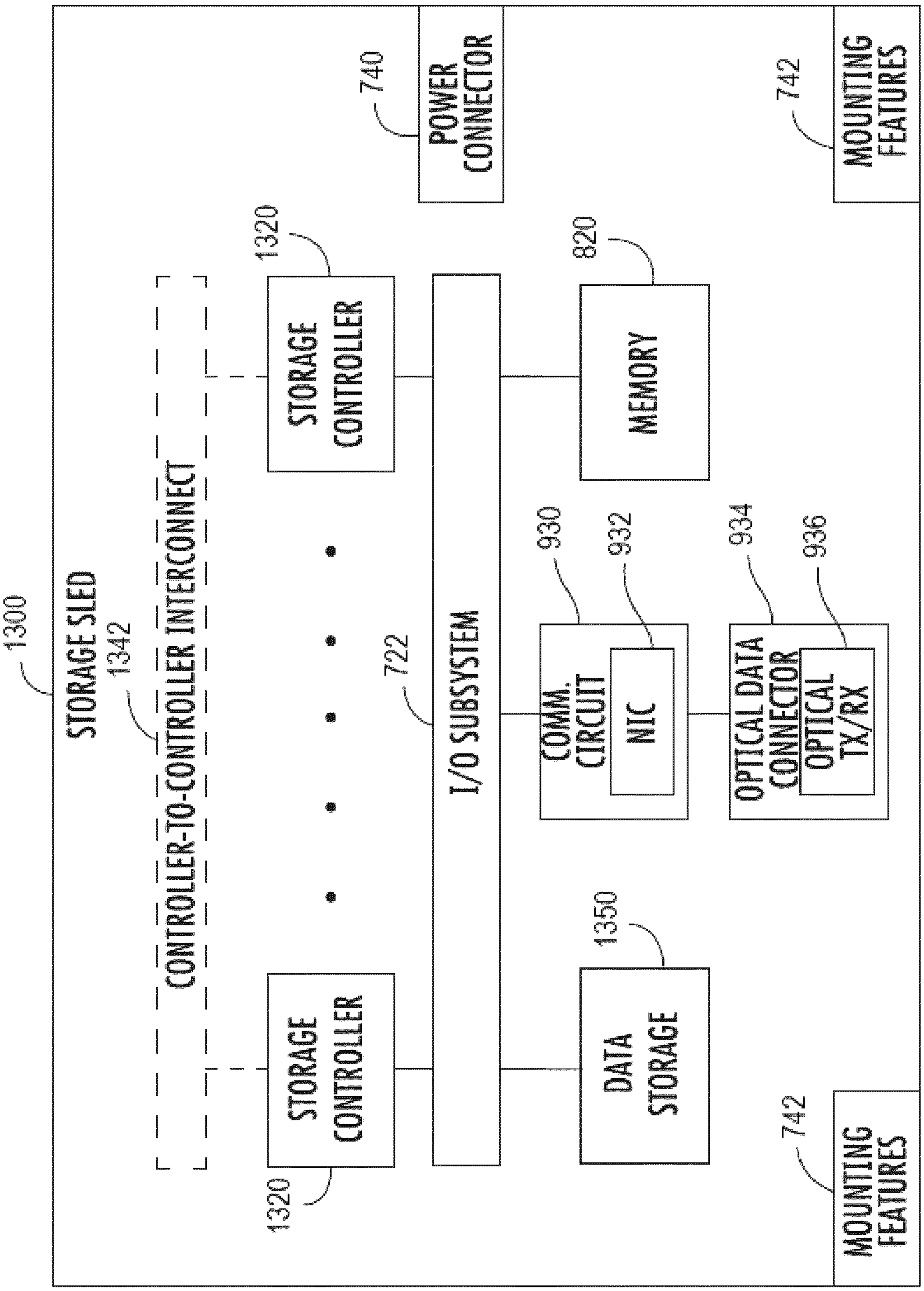
FIG. 13 is a block diagram of at least one example of a storage sled usable in the data center of FIG. 2.

Referring now to FIG. 13, in some examples, the sled 500 may be implemented as a storage sled 1300. The storage sled 1300 is configured, to store data in a data storage 1350 local to the storage sled 1300. For example, during operation, a compute sled 900 or an accelerator sled 1100 may store and retrieve data from the data storage 1350 of the storage sled 1300. The storage sled 1300 includes various components similar to components of the sled 500 and/or the compute sled 900, which have been identified in FIG. 13 using the same reference numbers. The description of such components provided above in regard to FIGS. 7, 8, and 9 apply to the corresponding components of the storage sled 1300 and is not repeated herein for clarity of the description of the storage sled 1300.

In the illustrative storage sled 1300, the physical resources 720 includes storage controllers 1320. Although only two storage controllers 1320 are shown in FIG. 13, it should be appreciated that the storage sled 1300 may include additional storage controllers 1320 in other examples. The storage controllers 1320 may be implemented as any type of processor, controller, or control circuit capable of controlling the storage and retrieval of data into the data storage 1350 based on requests received via the communication circuit 930. In the illustrative example, the storage controllers 1320 are implemented as relatively low-power processors or controllers. For example, in some examples, the storage controllers 1320 may be configured to operate at a power rating of about 75 watts.

In some examples, the storage sled 1300 may also include a controller-to-controller interconnect 1342. Similar to the resource-to-resource interconnect 724 of the sled 500 discussed above, the controller-to-controller interconnect 1342 may be implemented as any type of communication interconnect capable of facilitating controller-to-controller communications. In the illustrative example, the controller-to-controller interconnect 1342 is implemented as a high-speed point-to-point interconnect (e.g., faster than the I/O subsystem 722). For example, the controller-to-controller interconnect 1342 may be implemented as a QuickPath Interconnect (QPI), an UltraPath Interconnect (UPI), or other high-speed point-to-point interconnect dedicated to processor-to-processor communications.

Figure 14:
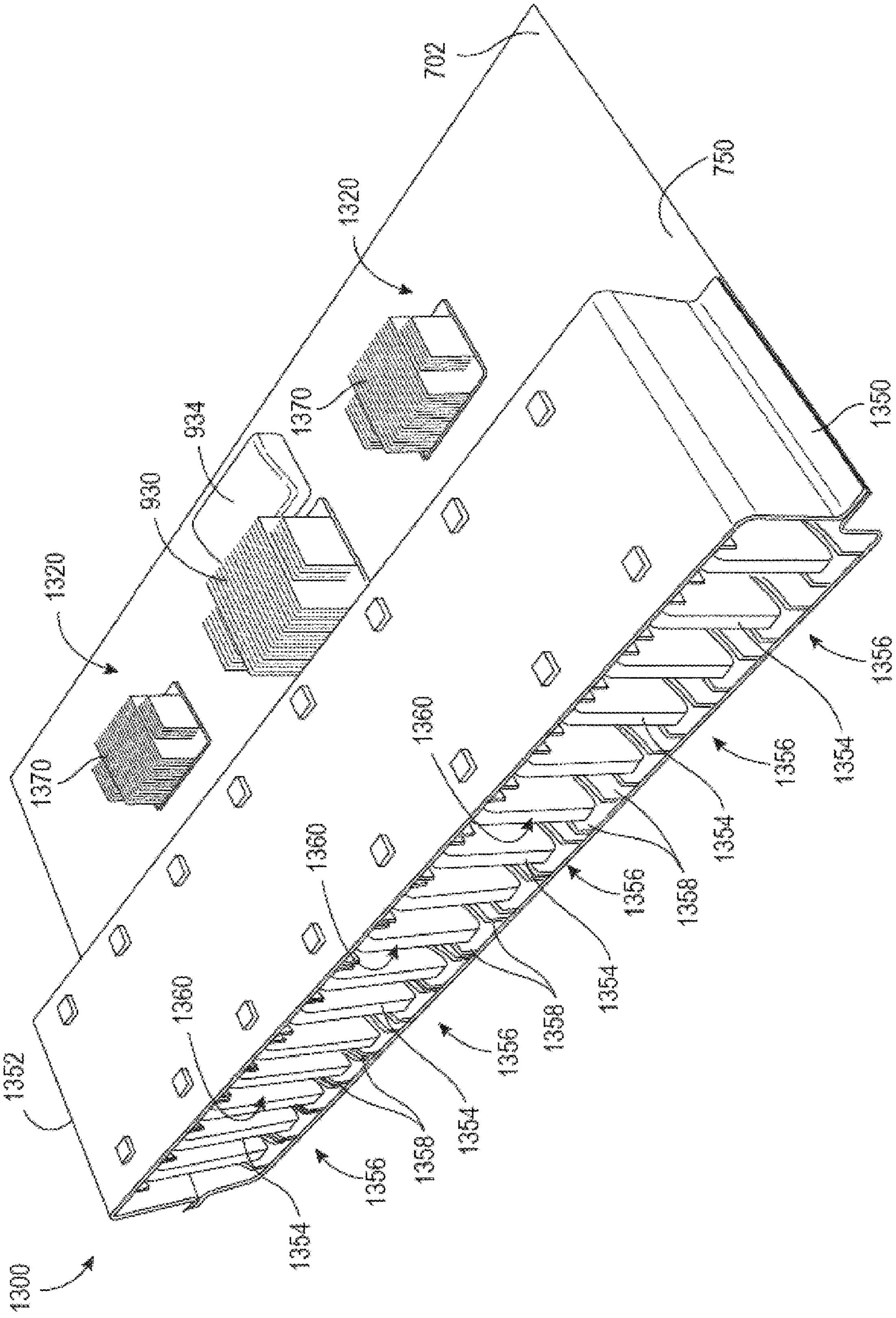
FIG. 14 is a top perspective view of at least one example of the storage sled of FIG. 13.

Referring now to FIG. 14, an illustrative example of the storage sled 1300 is shown. In the illustrative example, the data storage 1350 is implemented as, or otherwise includes, a storage cage 1352 configured to house one or more solid state drives (SSDs) 1354. To do so, the storage cage 1352 includes a number of mounting slots 1356, which are configured to receive corresponding solid state drives 1354. The mounting slots 1356 include a number of drive guides 1358 that cooperate to define an access opening 1360 of the corresponding mounting slot 1356. The storage cage 1352 is secured to the chassis-less circuit board substrate 702 such that the access openings face away from (i.e., toward the front of) the chassis-less circuit board substrate 702. As such, solid state drives 1354 are accessible while the storage sled 1300 is mounted in a corresponding rack 304. For example, a solid state drive 1354 may be swapped out of a rack 340 (e.g., via a robot) while the storage sled 1300 remains mounted in the corresponding rack 340.

The storage cage 1352 illustratively includes sixteen mounting slots 1356 and is capable of mounting and storing sixteen solid state drives 1354. The storage cage 1352 may be configured to store additional or fewer solid state drives 1354 in other examples. Additionally, in the illustrative example, the solid state drives are mounted vertically in the storage cage 1352, but may be mounted in the storage cage 1352 in a different orientation in other examples. A given solid state drive 1354 may be implemented as any type of data storage device capable of storing long term data. To do so, the solid state drives 1354 may include volatile and non-volatile memory devices discussed above.

As shown in FIG. 14, the storage controllers 1320, the communication circuit 930, and the optical data connector 934 are illustratively mounted to the top side 750 of the chassis-less circuit board substrate 702. Again, as discussed above, any suitable attachment or mounting technology may be used to mount the electrical components of the storage sled 1300 to the chassis-less circuit board substrate 702 including, for example, sockets (e.g., a processor socket), holders, brackets, soldered connections, and/or other mounting or securing techniques.

As discussed above, the individual storage controllers 1320 and the communication circuit 930 are mounted to the top side 750 of the chassis-less circuit board substrate 702 such that no two heat-producing, electrical components shadow each other. For example, the storage controllers 1320 and the communication circuit 930 are mounted in corresponding locations on the top side 750 of the chassis-less circuit board substrate 702 such that no two of those electrical components are linearly in-line with each other along the direction of the airflow path 708.

The memory devices 820 (not shown in FIG. 14) of the storage sled 1300 are mounted to the bottom side 850 (not shown in FIG. 14) of the chassis-less circuit board substrate 702 as discussed above in regard to the sled 500. Although mounted to the bottom side 850, the memory devices 820 are communicatively coupled to the storage controllers 1320 located on the top side 750 via the I/O subsystem 722. Again, because the chassis-less circuit board substrate 702 is implemented as a double-sided circuit board, the memory devices 820 and the storage controllers 1320 may be communicatively coupled by one or more vias, connectors, or other mechanisms extending through the chassis-less circuit board substrate 702. The storage controllers 1320 include and/or are associated with a heatsink 1370 secured thereto. As discussed above, due to the improved thermal cooling characteristics of the chassis-less circuit board substrate 702 of the storage sled 1300, none of the heatsinks 1370 include cooling fans attached thereto. That is, the heatsinks 1370 may be fan-less heatsinks.

Figure 15:
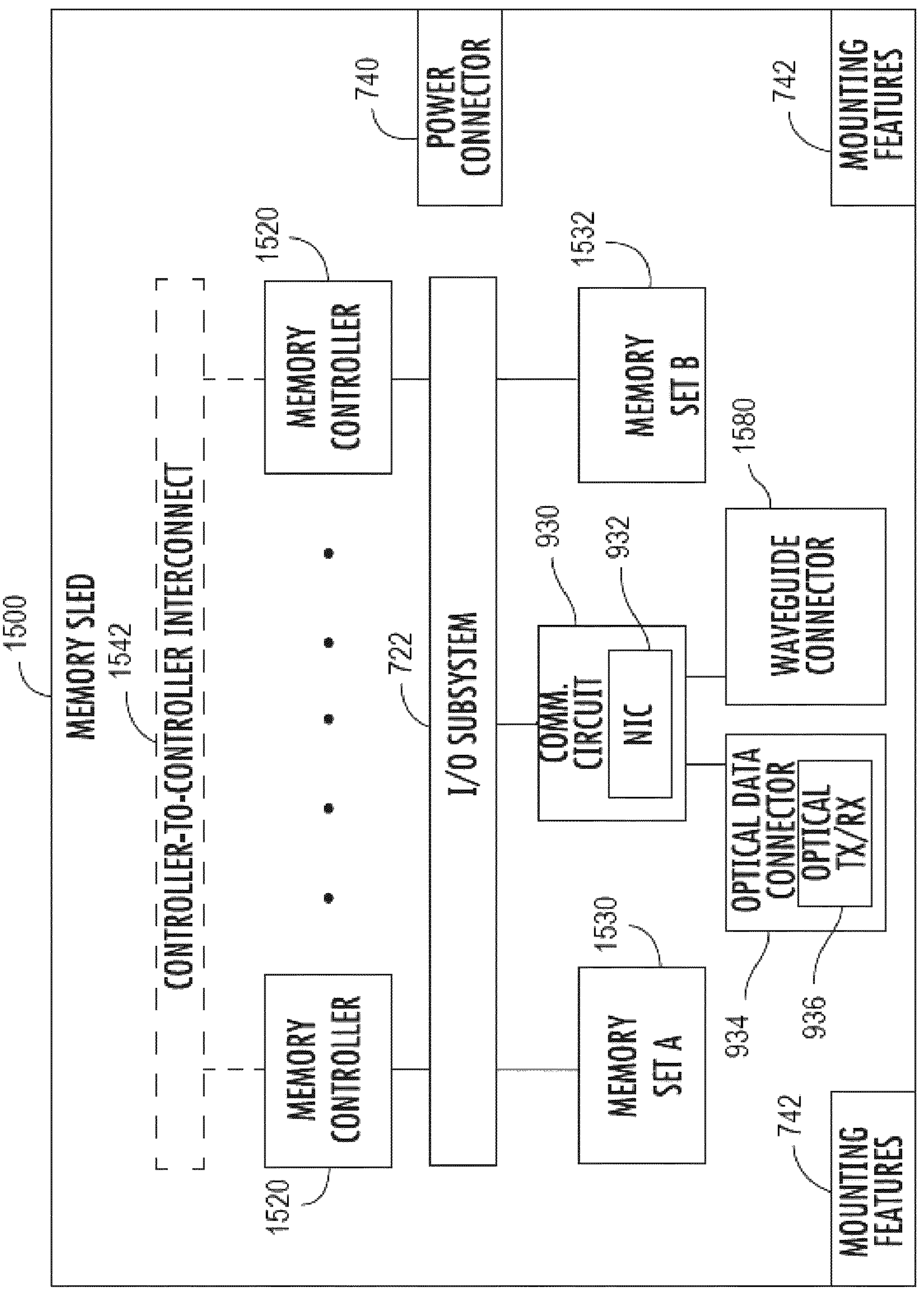
FIG. 15 is a block diagram of at least one example of a memory sled usable in the data center of FIG. 2.

Referring now to FIG. 15, in some examples, the sled 500 may be implemented as a memory sled 1500. The storage sled 1500 is optimized, or otherwise configured, to provide other sleds 500 (e.g., compute sleds 900, accelerator sleds 1100, etc.) with access to a pool of memory (e.g., in two or more sets 1530, 1532 of memory devices 820) local to the memory sled 1300. For example, during operation, a compute sled 900 or an accelerator sled 1100 may remotely write to and/or read from one or more of the memory sets 1530, 1532 of the memory sled 1300 using a logical address space that maps to physical addresses in the memory sets 1530, 1532. The memory sled 1500 includes various components similar to components of the sled 500 and/or the compute sled 900, which have been identified in FIG. 15 using the same reference numbers. The description of such components provided above in regard to FIGS. 7, 8, and 9 apply to the corresponding components of the memory sled 1500 and is not repeated herein for clarity of the description of the memory sled 1500.

In the illustrative memory sled 1500, the physical resources 720 include memory controllers 1520. Although only two memory controllers 1520 are shown in FIG. 15, it should be appreciated that the memory sled 1500 may include additional memory controllers 1520 in other examples. The memory controllers 1520 may be implemented as any type of processor, controller, or control circuit capable of controlling the writing and reading of data into the memory sets 1530, 1532 based on requests received via the communication circuit 930. In the illustrative example, the memory controllers 1520 are connected to corresponding memory sets 1530, 1532 to write to and read from memory devices 820 (not shown) within the corresponding memory set 1530, 1532 and enforce any permissions (e.g., read, write, etc.) associated with sled 500 that has sent a request to the memory sled 1500 to perform a memory access operation (e.g., read or write).

In some examples, the memory sled 1500 may also include a controller-to-controller interconnect 1542. Similar to the resource-to-resource interconnect 724 of the sled 500 discussed above, the controller-to-controller interconnect 1542 may be implemented as any type of communication interconnect capable of facilitating controller-to-controller communications. In the illustrative example, the controller-to-controller interconnect 1542 is implemented as a high-speed point-to-point interconnect (e.g., faster than the I/O subsystem 722). For example, the controller-to-controller interconnect 1542 may be implemented as a QuickPath Interconnect (QPI), an UltraPath Interconnect (UPI), or other high-speed point-to-point interconnect dedicated to processor-to-processor communications. As such, in some examples, a memory controller 1520 may access, through the controller-to-controller interconnect 1542, memory that is within the memory set 1532 associated with another memory controller 1520. In some examples, a scalable memory controller is made of multiple smaller memory controllers, referred to herein as "chiplets", on a memory sled (e.g., the memory sled 1500). The chiplets may be interconnected (e.g., using EMIB (Embedded Multi-Die Interconnect Bridge) technology). The combined chiplet memory controller may scale up to a relatively large number of memory controllers and I/O ports, (e.g., up to 16 memory channels). In some examples, the memory controllers 1520 may implement a memory interleave (e.g., one memory address is mapped to the memory set 1530, the next memory address is mapped to the memory set 1532, and the third address is mapped to the memory set 1530, etc.). The interleaving may be managed within the memory controllers 1520, or from CPU sockets (e.g., of the compute sled 900) across network links to the memory sets 1530, 1532, and may improve the latency associated with performing memory access operations as compared to accessing contiguous memory addresses from the same memory device.

Further, in some examples, the memory sled 1500 may be connected to one or more other sleds 500 (e.g., in the same rack 340 or an adjacent rack 340) through a waveguide, using the waveguide connector 1580. In the illustrative example, the waveguides are 74 millimeter waveguides that provide 16 Rx (i.e., receive) lanes and 16 Tx (i.e., transmit)

lanes. Different ones of the lanes, in the illustrative example, are either 16 GHz or 32 GHz. In other examples, the frequencies may be different. Using a waveguide may provide high throughput access to the memory pool (e.g., the memory sets 1530, 1532) to another sled (e.g., a sled 500 in the same rack 340 or an adjacent rack 340 as the memory sled 1500) without adding to the load on the optical data connector 934.

Figure 16:
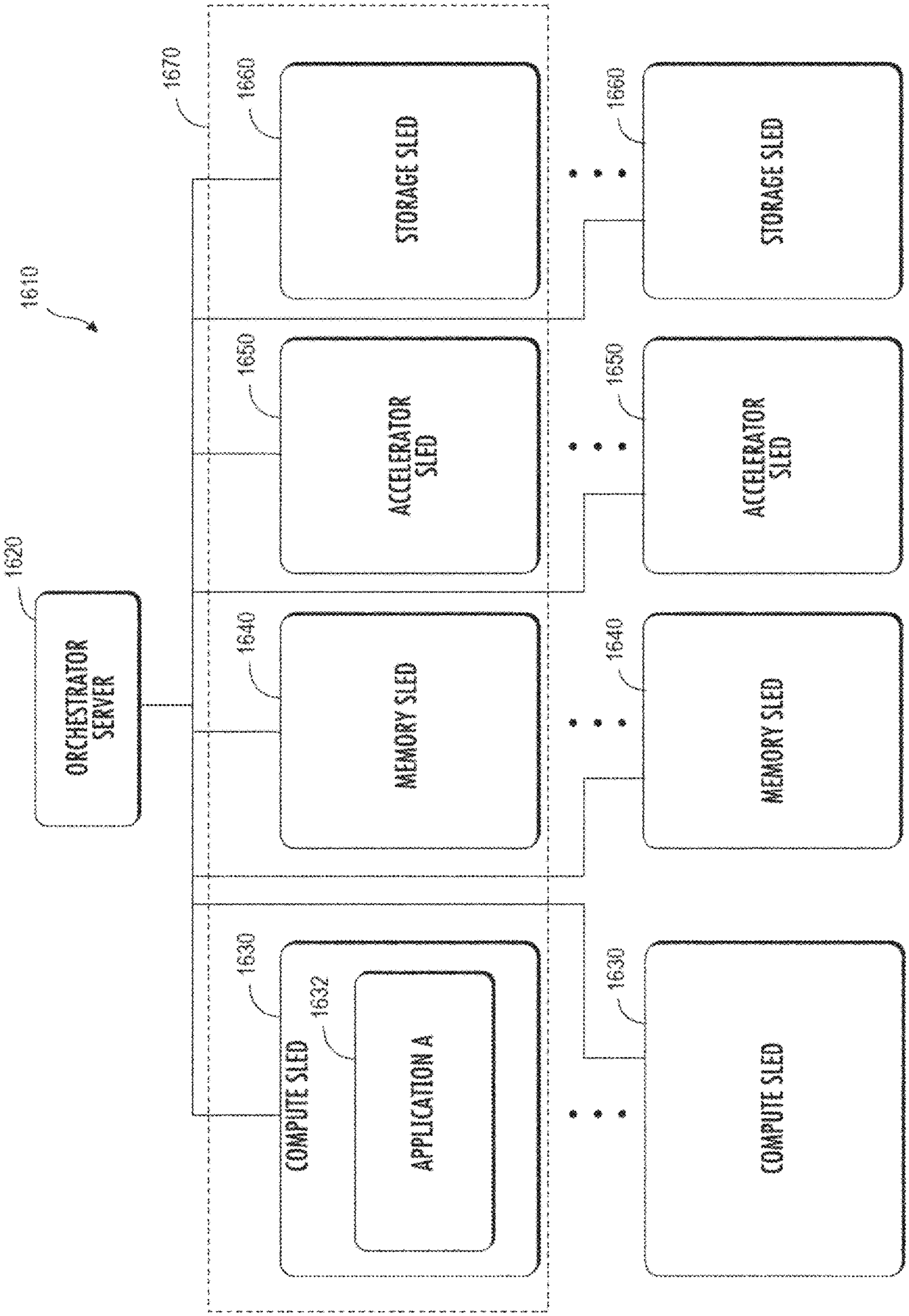
FIG. 16 is a block diagram of a system that may be established within the data center of FIG. 2 to execute workloads with managed nodes of disaggregated resources.

Referring now to FIG. 16, a system for executing one or more workloads (e.g., applications) may be implemented in accordance with the data center 200. In the illustrative example, the system 1610 includes an orchestrator server 1620, which may be implemented as a managed node including a compute device (e.g., processor circuitry 920 on a compute sled 900) executing management software (e.g., a cloud operating environment, such as OpenStack) that is communicatively coupled to multiple sleds 500 including a large number of compute sleds 1630 (e.g., similar to the compute sled 900), memory sleds 1640 (e.g., similar to the memory sled 1500), accelerator sleds 1650 (e.g., similar to the memory sled 1000), and storage sleds 1660 (e.g., similar to the storage sled 1300). One or more of the sleds 1630, 1640, 1650, 1660 may be grouped into a managed node 1670, such as by the orchestrator server 1620, to collectively perform a workload (e.g., an application 1632 executed in a virtual machine or in a container). The managed node 1670 may be implemented as an assembly of physical resources 720, such as processor circuitry 920, memory resources 820, accelerator circuits 1120, or data storage 1350, from the same or different sleds 500. Further, the managed node may be established, defined, or "spun up" by the orchestrator server 1620 at the time a workload is to be assigned to the managed node or at any other time, and may exist regardless of whether any workloads are presently assigned to the managed node. In the illustrative example, the orchestrator server 1620 may selectively allocate and/or deallocate physical resources 720 from the sleds 500 and/or add or remove one or more sleds 500 from the managed node 1670 as a function of quality of service (QoS) targets (e.g., a target throughput, a target latency, a target number of instructions per second, etc.) associated with a service level agreement for the workload (e.g., the application 1632). In doing so, the orchestrator server 1620 may receive telemetry data indicative of performance conditions (e.g., throughput, latency, instructions per second, etc.) in different ones of the sleds 500 of the managed node 1670 and compare the telemetry data to the quality of service targets to determine whether the quality of service targets are being satisfied. The orchestrator server 1620 may additionally determine whether one or more physical resources may be deallocated from the managed node 1670 while still satisfying the QoS targets, thereby freeing up those physical resources for use in another managed node (e.g., to execute a different workload). Alternatively, if the QoS targets are not presently satisfied, the orchestrator server 1620 may determine to dynamically allocate additional physical resources to assist in the execution of the workload (e.g., the application 1632) while the workload is executing. Similarly, the orchestrator server 1620 may determine to dynamically deallocate physical resources from a managed node if the orchestrator server 1620 determines that deallocating the physical resource would result in QoS targets still being met.

Additionally, in some examples, the orchestrator server 1620 may identify trends in the resource utilization of the workload (e.g., the application 1632), such as by identifying phases of execution (e.g., time periods in which different operations, having different resource utilizations characteristics, are performed) of the workload (e.g., the application 1632) and pre-emptively identifying available resources in the data center 200 and allocating them to the managed node 1670 (e.g., within a predefined time period of the associated phase beginning). In some examples, the orchestrator server 1620 may model performance based on various latencies and a distribution scheme to place workloads among compute sleds and other resources (e.g., accelerator sleds, memory sleds, storage sleds) in the data center 200. For example, the orchestrator server 1620 may utilize a model that accounts for the performance of resources on the sleds 500 (e.g., FPGA performance, memory access latency, etc.) and the performance (e.g., congestion, latency, bandwidth) of the path through the network to the resource (e.g., FPGA). As such, the orchestrator server 1620 may determine which resource(s) should be used with which workloads based on the total latency associated with different potential resource(s) available in the data center 200 (e.g., the latency associated with the performance of the resource itself in addition to the latency associated with the path through the network between the compute sled executing the workload and the sled 500 on which the resource is located).

In some examples, the orchestrator server 1620 may generate a map of heat generation in the data center 200 using telemetry data (e.g., temperatures, fan speeds, etc.) reported from the sleds 500 and allocate resources to managed nodes as a function of the map of heat generation and predicted heat generation associated with different workloads, to maintain a target temperature and heat distribution in the data center 200. Additionally or alternatively, in some examples, the orchestrator server 1620 may organize received telemetry data into a hierarchical model that is indicative of a relationship between the managed nodes (e.g., a spatial relationship such as the physical locations of the resources of the managed nodes within the data center 200 and/or a functional relationship, such as groupings of the managed nodes by the customers the managed nodes provide services for, the types of functions typically performed by the managed nodes, managed nodes that typically share or exchange workloads among each other, etc.). Based on differences in the physical locations and resources in the managed nodes, a given workload may exhibit different resource utilizations (e.g., cause a different internal temperature, use a different percentage of processor or memory capacity) across the resources of different managed nodes. The orchestrator server 1620 may determine the differences based on the telemetry data stored in the hierarchical model and factor the differences into a prediction of future resource utilization of a workload if the workload is reassigned from one managed node to another managed node, to accurately balance resource utilization in the data center 200. In some examples, the orchestrator server 1620 may identify patterns in resource utilization phases of the workloads and use the patterns to predict future resource utilization of the workloads.

To reduce the computational load on the orchestrator server 1620 and the data transfer load on the network, in some examples, the orchestrator server 1620 may send self-test information to the sleds 500 to enable a given sled 500 to locally (e.g., on the sled 500) determine whether telemetry data generated by the sled 500 satisfies one or more conditions (e.g., an available capacity that satisfies a predefined threshold, a temperature that satisfies a predefined threshold, etc.). The given sled 500 may then report back a simplified result (e.g., yes or no) to the orchestrator server 1620, which the orchestrator server 1620 may utilize in determining the allocation of resources to managed nodes.

Figure 17A:
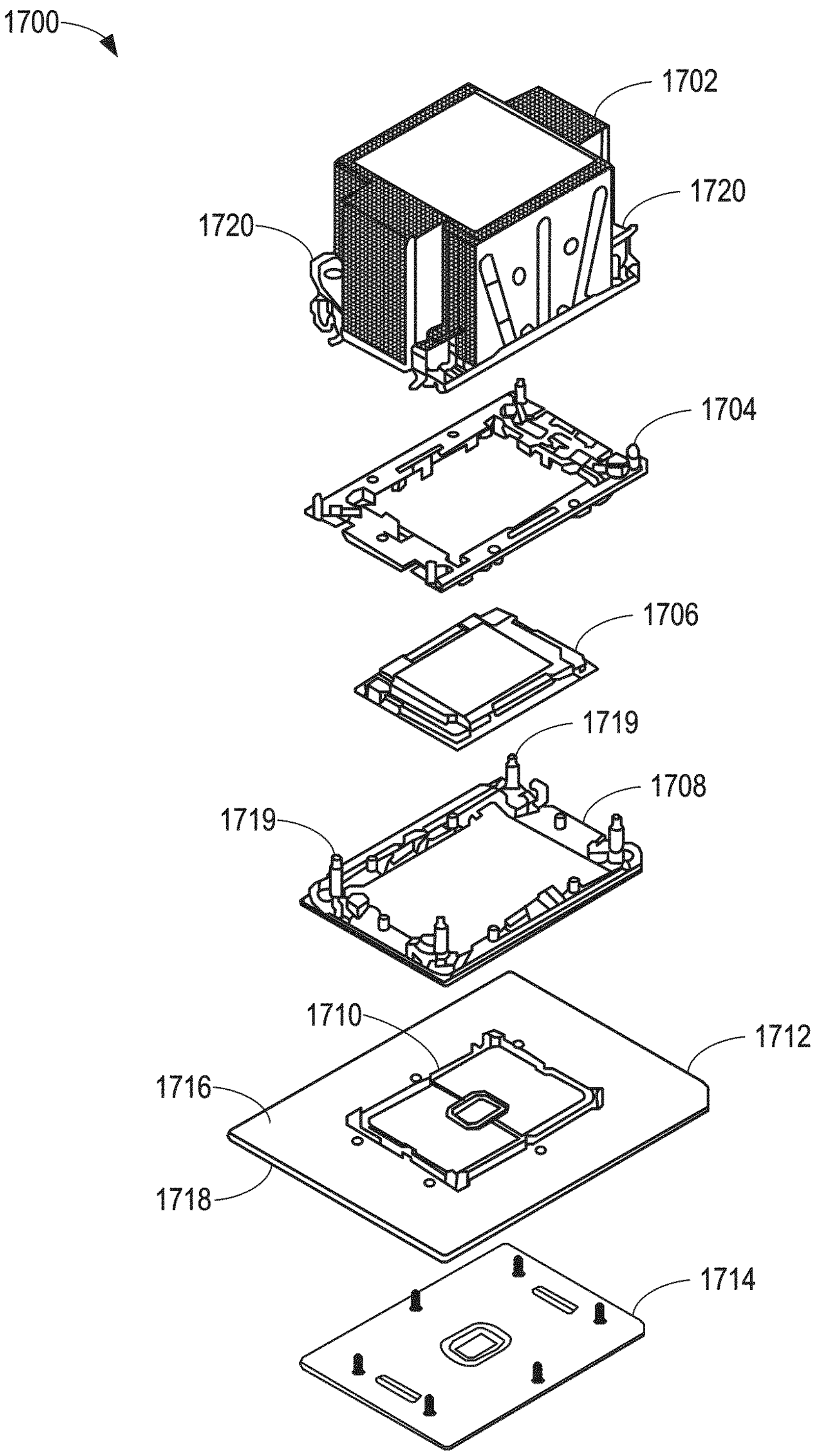
FIG. 17A illustrates an exploded view of an example electronic heat dissipating component stack in which examples disclosed herein may be implemented.

FIG. 17A illustrates an exploded view of an example electronic heat dissipating component stack 1700 in which examples disclosed herein may be implemented. In FIG. 17A, the example component stack 1700 includes an example heatsink 1702, an example carrier (e.g., a package carrier, a carrier plate) 1704, an example semiconductor device 1706, an example bolster plate 1708, an example socket 1710 coupled to an example printed circuit board (PCB) (e.g., a motherboard) 1712, and an example backplate 1714.

In FIG. 17A, the heatsink 1702 is couplable (e.g., thermally couplable) to the semiconductor device 1706 to dissipate heat therefrom. In some cases, the heatsink 1702 corresponds to one of the heatsinks 950 of FIG. 10, one of the heatsinks 1150 of FIG. 12, or one of the heatsinks 1370 of FIG. 14. In FIG. 17A, the semiconductor device 1706 is a land grid array (LGA) processor chip. Additionally or alternatively, the semiconductor device 1706 can be one of a ball grid array (BGA) processor chip or a pin grid array (PGA) processor chip instead. Further, in some examples, other types of IC packages and/or semiconductor chips can be used in the component stack 1700 instead of a processor chip (e.g., a memory chip). In FIG. 17A, the carrier 1704 is used to couple the heatsink 1702 to the semiconductor device 1706.

In some examples, a subassembly including the heatsink 1702, the carrier 1704, and the semiconductor device 1706 can be electrically and/or mechanically coupled to a top surface 1716 of the underlying PCB 1712 using the bolster plate 1708 and/or the socket 1710. For instance, the bolster plate 1708 is couplable to the top surface of the PCB 1712 such that the socket 1710 is centrally disposed in the bolster plate 1708. In FIG. 17A, the carrier 1704 includes one or more alignment features (e.g., holes, studs, and/or pins) that mate to corresponding alignment features (e.g., holes, studs, and/or pins) of the bolster plate 1708. During assembly of the subassembly (e.g., the heatsink 1702, the carrier 1704, and the semiconductor device 1706) to the PCB 1712, the mating of the alignment features between the carrier 1704 and the bolster plate 1708 facilitates alignment of contacts between the semiconductor device 1706 and corresponding contacts of the socket 1710. As such, the semiconductor device 1706 can be electrically and/or mechanically coupled to the socket 1710 without damage to the semiconductor device 1706 and/or the socket 1710. Further, the backplate 1714 is couplable to the bolster plate 1708 through holes in the PCB 1712 such that the backplate 1714 is adjacent a bottom surface 1718 of the PCB 1712 and the bolster plate 1708 is adjacent the top surface 1716 of the PCB 1712 with the PCB 1712 sandwiched therebetween.

In FIG. 17A, the bolster plate 1708 further includes example posts 1719 that extend into and are captured by and/or connected to example spring-loaded fasteners 1720 positioned at the corners of the heatsink 1702. When the component stack 1700 is assembled, springs in the spring-loaded fasteners 1720 urge the heatsink 1702 toward the bolster plate 1708 to place the semiconductor device 1706 and socket 1710 in compression. Thus, the spring force from the springs in the spring-loaded fasteners 1720 urge the semiconductor device 1706 toward the socket 1710 and facilitate retention therein. Additionally or alternatively, the backplate 1714 can include posts (e.g., similar to the posts 1719) that extend through the bolster plate and a base of the heatsink 1702 to be captured by and/or connected to the spring-loaded fasteners 1720. In other examples, spring-loaded fasteners 1720 can additionally or alternatively be positioned adjacent the backplate 1714 to capture and/or connect to posts extending through the assembly from the heatsink 1702. In other examples, the bolster plate 1708 may include a spring (either associated with the posts 1719 or separate therefrom) to urge the heatsink 1702 toward the bolster plate 1708 (in addition to or instead of springs in the spring-loaded fasteners 1720) to provide the spring force that urges the semiconductor ship 1706 in contact with the socket 1710.

Figure 17B:
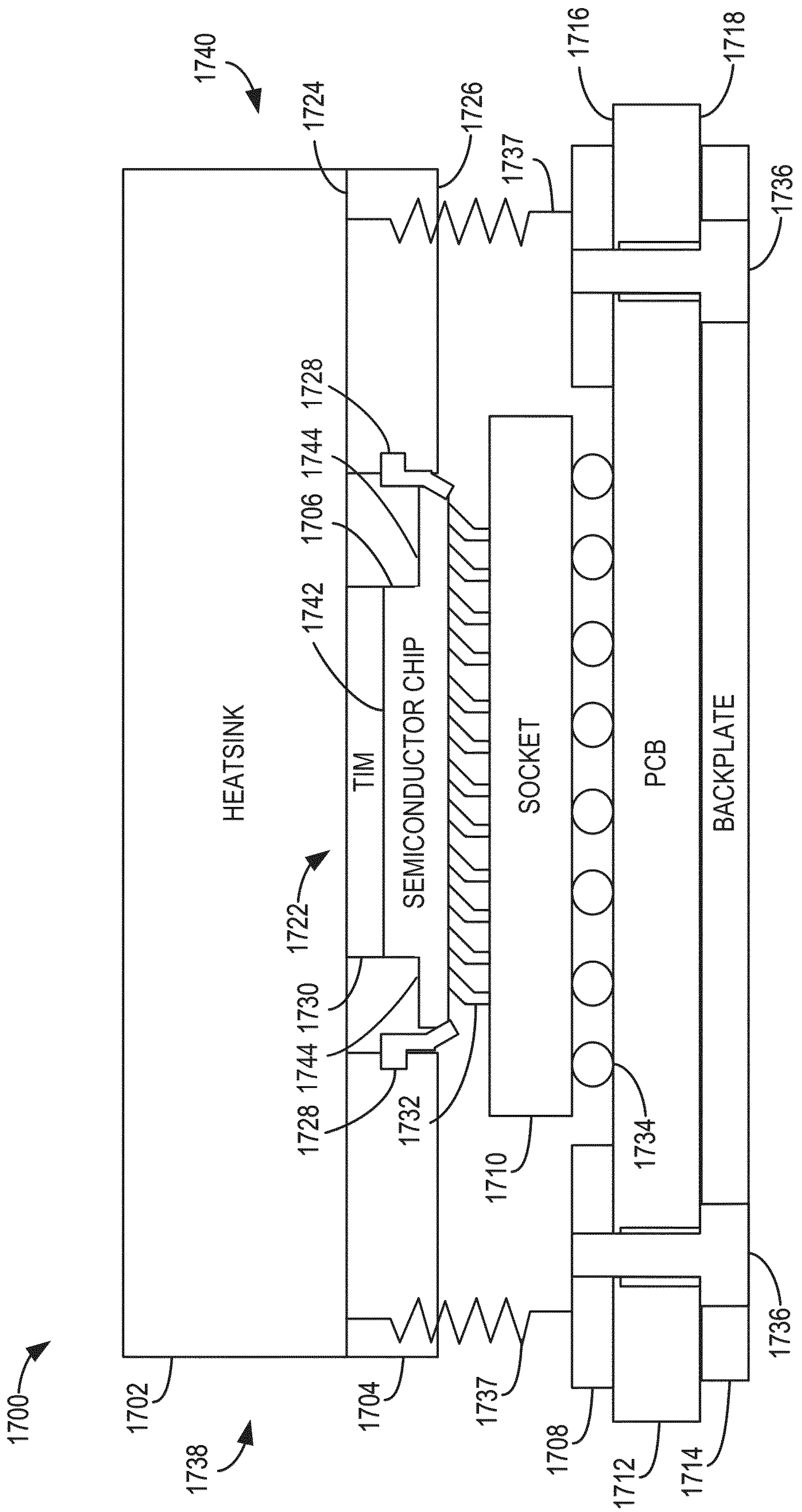
FIG. 17B illustrates a simplified side view of the example component stack of FIG. 17A.

FIG. 17B illustrates a simplified side view of the example component stack 1700 of FIG. 17A. In the illustrated example of FIG. 17A, the carrier 1704 includes an example aperture 1722 extending between first and second example surfaces 1724, 1726 of the carrier 1704. In this example, the first surface 1724 faces and/or is coupled to the heatsink 1702, and the second surface 1726 faces the bolster plate 1708. In the illustrated example, the semiconductor device 1706 is positioned (e.g., disposed) in the aperture 1722. In this example, the semiconductor device 1706 is coupled to the carrier 1704 via one or more example carrier snaps (e.g., retention snaps, clips) 1728 to hold (e.g., firmly hold) the semiconductor device 1706 in the aperture 1722. In this example, the carrier snaps 1728 are spaced about the aperture 1722. In this example, the carrier 1704 and, thus, the semiconductor device 1706 are coupled to the heatsink 1702 for cooling the semiconductor device 1706.

In this example, the semiconductor device 1706 is thermally coupled to the heatsink 1702 via an example thermal interface material (TIM) 1730 which can be, for instance, grease. In this instance, the TIM 1730 dissipates heat and/or facilitates heat transfer from the semiconductor device 1706. In FIG. 17B, the semiconductor device 1706 is electrically and/or mechanically coupled to the socket 1710 via a first example array of interconnects (e.g., pins) 1732, and the socket 1710 is further electrically and/or mechanically coupled to the PCB 1712 via a second example array of interconnects (e.g., balls) 1734 on the top surface 1716 of the PCB 1712. The backplate 1714 is coupled to the bottom surface 1718 of the PCB 1712 and to the bolster plate 1708 via fasteners (e.g., bolts, screws, threaded fasteners) 1736 extending through the PCB 1712 and/or the bolster plate 1708.

In FIG. 17B, the spring force urging the heatsink 1702 towards the bolster plate 1708 to place the semiconductor device 1706 and the socket 1710 in compression is illustratively represented by example springs 1737 for purposes of explanation. However, as noted above, the springs 1737 may positioned in different locations (e.g., within spring-loaded fasteners 1720 above a base of the heatsink 1702, below and/or adjacent the backplate 1714, on the bolster plate 1708, between the bolster plate 1708 and the heatsink 1702, etc.). In this case, the springs 1737 are positioned proximate outer edges 1738, 1740 of the heatsink 1702 and/or the bolster plate 1708 (e.g., away from a central region of the heatsink 1702 and/or the bolster plate 1708). In this instance, the springs 1737 urge the heatsink 1702 towards the bolster plate 1708. As a result, the heatsink 1702 presses downward in FIG. 17B on the semiconductor device 1706 to hold the semiconductor device 1706 towards the socket 1710, thus reducing a likelihood of decoupling of the semiconductor device 1706 from the socket 1710.

In some examples, warpage of the semiconductor device 1706 and/or the socket 1710 may result from heating and/or cooling of the semiconductor device 1706 and/or the socket 1710 during manufacture thereof. In some examples, the warpage of the semiconductor device 1706 exhibits a bowing and/or or bending of chip to have a generally bowl-shaped (e.g., concave surface on one side and a convex surface on an opposite side). More particularly, in some examples, as the semiconductor device 1706 warps (as a result of the processes involved in its fabrication), an example central surface 1742 (associated with an integrated heat spreader (IHS) of the semiconductor device 1706) urged downward relative to an example step surface 1744 of the semiconductor device 1706 along an outer edge or perimeter of the semiconductor device 1706.

Figure 18:
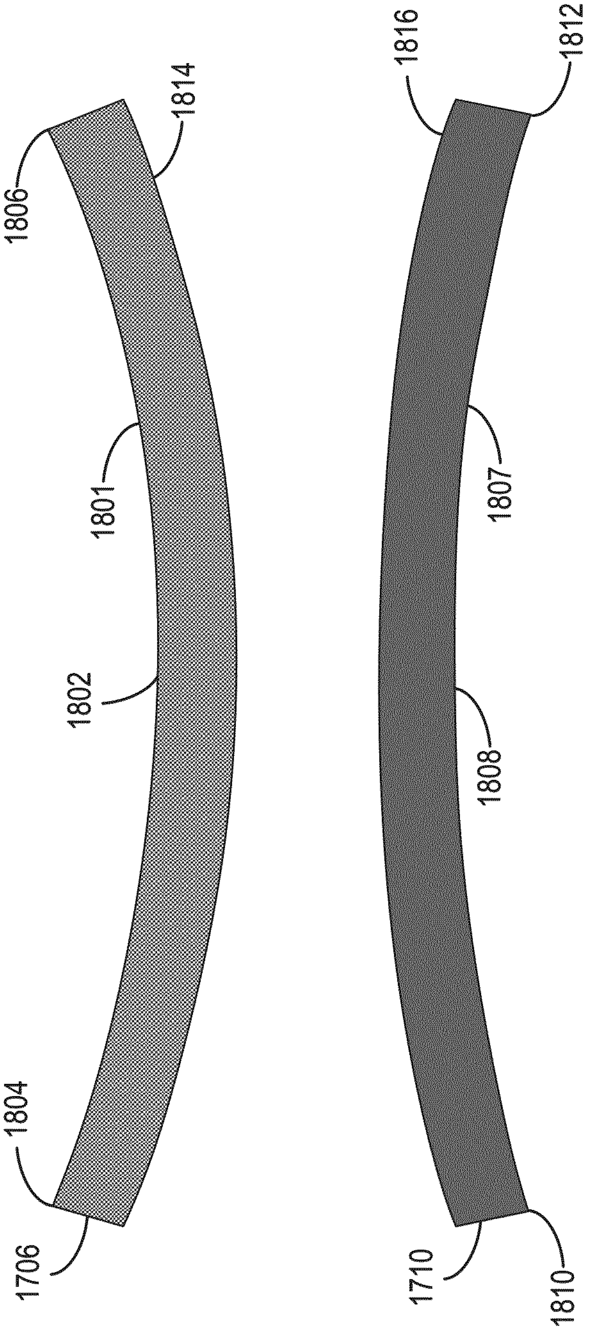
FIG. 18 illustrates warpage of the example semiconductor device and the example socket of FIGS. 17A and/or 17B.

FIG. 18 illustrates warpage of the example semiconductor device 1706 and the example socket 1710 of FIGS. 17A and/or 17B. Notably, the warpage represented in FIG. 18 is exaggerated for purposes of explanation. In some examples, as a result of temperature fluctuations during manufacture of the semiconductor device 1706 and/or the socket 1710, an upper surface 1801 of the semiconductor device 1706 (e.g., the surface facing away from the socket 1710) exhibits concave warpage as shown in FIG. 18. In particular, a center 1802 of the semiconductor device 1706 is displaced downward (e.g., toward the socket 1710) relative to edges 1804, 1806 of the semiconductor device 1706. In some examples, the downward displacement of the center 1802 relative to the edges 1804, 1806 of the semiconductor device 1706 is up to 200 microns (m) (e.g., −200 μm). Further, a bottom surface 1807 of the socket 1710 (e.g., the surface facing away from the semiconductor device 1706) exhibits convex warpage in which a center 1808 of the socket 1710 is displaced upward relative to edges 1810, 1812 of the socket 1710. In this example, the upward displacement of the center 1808 relative to the edges 1810, 1812 of the socket 1710 is up to 300 μm (e.g., +300 μm).

In some examples, due to the warpage of the semiconductor device 1706 and/or the socket 1710, a distance between contacts on a bottom surface 1814 of the semiconductor device 1706 and corresponding contacts on a top surface 1816 of the socket 1710 may differ at different points along the surfaces 1814, 1816. As a result, contact loads (e.g., pin loads) between the contacts on the bottom surface 1814 and the corresponding contacts on the top surface 1816 may differ at different points along the surfaces 1814, 1816. In particular, the contact load at a particular contact of the socket 1710 increases when the distance between the surfaces 1814, 1816 decreases. Thus, based on the warpage of the semiconductor device 1706 and the socket 1710 represented in FIG. 18, the contact load is the greatest near the center of the semiconductor device 1706 and the socket 1710 and decreases at locations farther away from the center. In some examples, the semiconductor device 1706 and the socket 1710 are generally rectangular in shape with opposing long sides and opposing short sides. In some such examples, the contact load is the least along the opposing short sides of the rectangular shaped components because these regions are farthest from the center of the components. In some examples, the contact loads proximate the edges 1810, 1812 of the socket 1710 do not satisfy (e.g., are less than) a threshold load required to ensure sufficient contact between the semiconductor device 1706 and the socket 1710. In some such examples, the resulting insufficient contact between the semiconductor device 1706 and the socket 1710 may disrupt and/or reduce reliability of transmission of electrical signals therebetween.

Figure 19A:
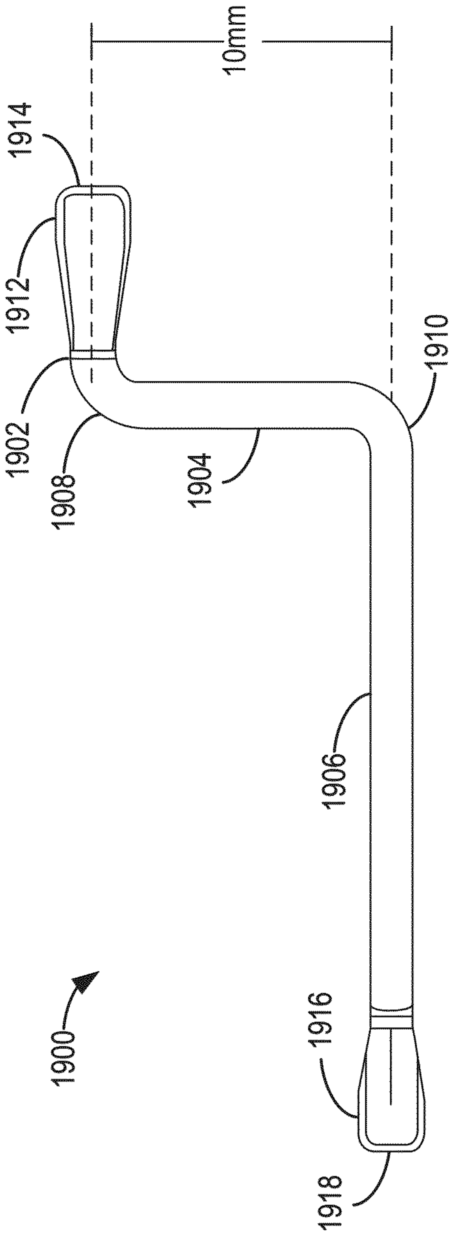
FIG. 19A illustrates a top view of an example torsional spring constructed in accordance with teachings of this disclosure.
Figure 19B:
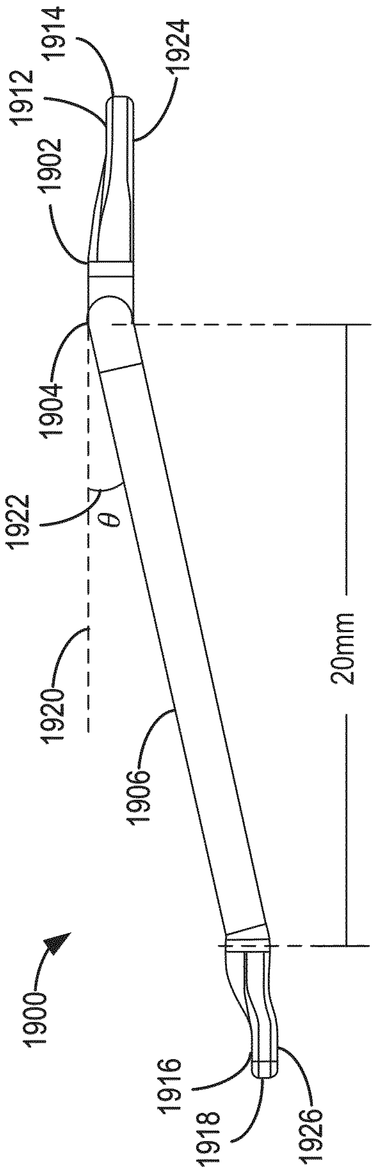
FIG. 19B illustrates a side view of the example torsional spring of FIG. 19A.

FIGS. 19A and 19B illustrate top and side views, respectively, of an example torsional spring (e.g., a torsional wire) 1900 constructed in accordance with teachings of this disclosure. In some examples, the torsional spring 1900 can be implemented on the example carrier 1704 of FIGS. 17A and/or 17B to distribute retention loads from a loading mechanism (e.g., the spring-loaded fasteners 1720 and/or the posts 1719 of FIG. 17A and/or other springs represented by the springs 1737 in FIG. 17B) of the component stack 1700 of FIGS. 17A and/or 17B to a surface of the semiconductor device 1706 and/or a surface of the bolster plate 1708. Accordingly, the torsional spring 1900 can counteract and/or reduce effects of warpage of the semiconductor device 1706 of FIG. 17B. In particular, the torsional spring 1900 urges the semiconductor device 1706 into a more planar state than the warped profile represented in FIG. 18 and, thus, ensures sufficient contact between electrical contacts of the semiconductor device 1706 and the socket 1710 of FIGS. 17A and/or 17B.

In the illustrated example of FIG. 19A, the torsional spring 1900 includes a first example arm 1902, a second example arm (e.g., a torsion arm) 1904, and a third example arm 1906. In some examples, the arms 1902, 1904, 1906 are angled with respect to one another. For example, the first arm 1902 is coupled to the second arm 1904 at a first example bend (e.g., a first elbow) 1908, and the second arm 1904 is coupled to the third arm 1906 at a second example bend (e.g., a second elbow) 1910. In this example, the first and second bends 1908, 1910 are 90-degree bends, such that the first arm 1902 is substantially perpendicular to the second arm 1904, and the second arm 1904 is substantially perpendicular to the third arm 1906. In some examples, the bends 1908, 1910 may be greater than or less than 90 degrees. In some examples, the torsional spring 1900 can include a different number of the bends 1908, 1910 (e.g., one of the bends 1908, 1910, more than two of the bends 1908, 1910). In this example, the first arm 1902 has a first length less than a second length of the second arm 1904, and the third arm 1906 has a third length greater than the second length of the second arm 1904. In this example, the second length of the second arm 1904 is approximately 10 millimeters (mm). In some examples, at least one of the first length, the second length, or the third length can be different. In some examples, a cross-sectional diameter of the torsional spring 1900 is approximately 1.5 mm. In some examples, the cross-sectional diameter can be different. In the illustrated example of FIG. 19A, the arms 1902, 1904, 1906 have a substantially circular cross-sectional shape, and the first and third arms 1902, 1906 flatten toward a first example flattened portion 1912 at a first example end 1914 of the torsional spring 1900 and a second example flattened portion 1916 at a second example end 1918 of the torsional spring 1900, respectively. While three of the arms 1902, 1904, 1906 are used in this example, the torsional spring 1900 may include one or more additional arms bent in one or more different directions between the first and second ends 1914, 1918 of the torsional spring 1900.

Turning to FIG. 19B, a side view of the torsional spring 1900 shows the third arm 1906 angled downward relative to an example horizontal axis 1920 of the first arm 1902 and/or the second arm 1904. For example, the third arm 1906 is angled downward by an example angle 1922, where the angle 1922 is an acute angle (e.g., less than 90 degrees). In some examples, the angle 1922 is less than 45 degrees, less than 30 degrees, etc. In this example, the horizontal axis 1920 is parallel to a plane along which both the first and second arms 1902, 1904 extend. In this example, a horizontal length along the third arm 1906 is approximately 20 mm. In some examples, the horizontal length may be different (e.g., greater than or less than 20 mm). In some examples, when the torsional spring 1900 is implemented in the assembled component stack 1700 of FIG. 17B, a first example contact surface 1924 at the first end 1914 of the first arm 1902 is to contact (e.g., interface with, abut) the step surface 1744 of the semiconductor device 1706 of FIG. 17B. Further, a second example contact surface 1926 at the second end 1918 of the third arm 1906 is to contact a surface of the bolster plate 1708 of FIG. 17B. In some examples, the first and second contact surfaces 1926 are substantially parallel to one another. In some examples, the first and second contact surfaces 1926 are substantially parallel to the horizontal axis 1920 (e.g., substantially parallel the plane defined by the first and second arms 1902, 1904).

Figure 20A:
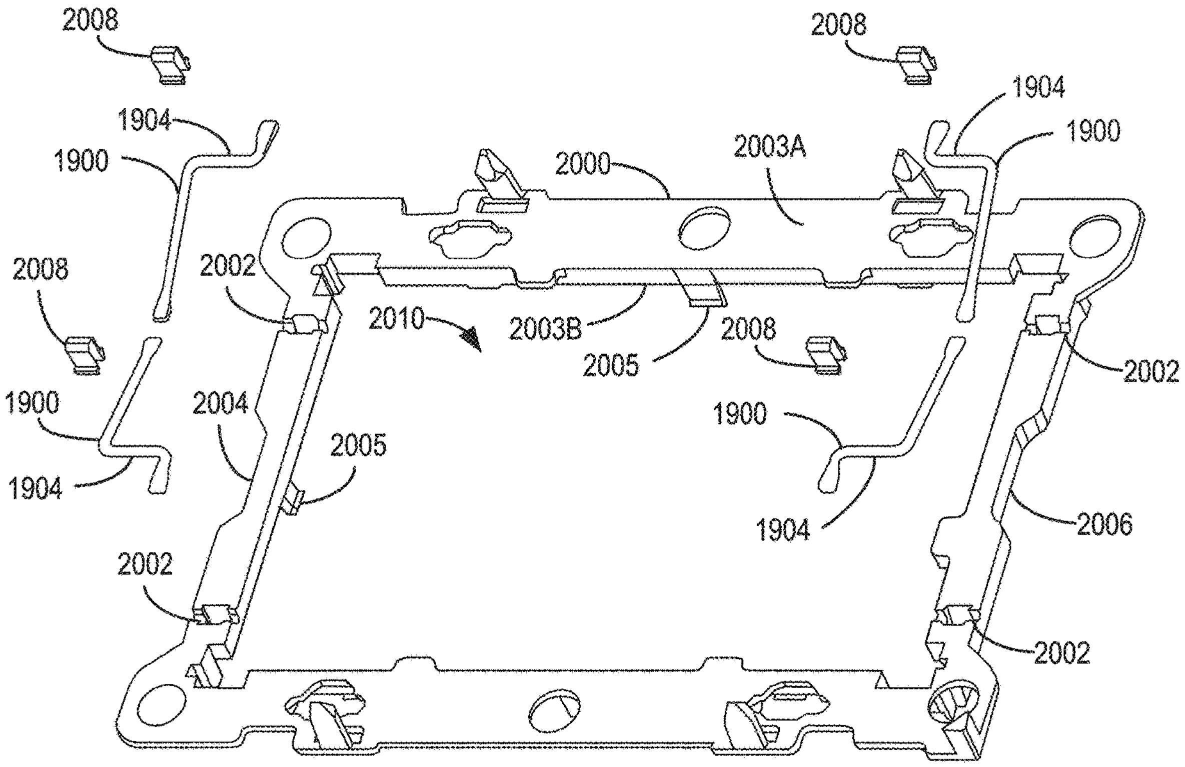
FIG. 20A illustrates an example carrier configured to receive ones of the example torsional spring of FIGS. 19A and/or 19B.

FIG. 20A illustrates an example carrier (e.g., a first carrier) 2000 configured to receive ones of the example torsional spring 1900 of FIGS. 19A and/or 19B. In some examples, the carrier 2000 of FIG. 20A can be implemented in the component stack 1700 of FIGS. 17A and/or 17B instead of the carrier 1704 of FIGS. 17A and/or 17B. In the illustrated example of FIG. 19A, the carrier 2000 includes example cavities (e.g., channels) 2002 in a first example surface 2003A of the carrier 2000 dimensioned to receive respective ones of the torsional springs 1900. In this example, the cavities 2002 extend into the first surface 2003 by a first distance less than a thickness of the carrier 2000 (e.g., less than a second distance between the first surface 2003A and a second example surface 2003B of the carrier 2000). In this example, the cavities 2002 are located proximate respective corners of the carrier 2000 on first and second example sides 2004, 2006 of the carrier 2000, where the first side 2004 is opposite the second side 2006. In some examples, the second arms 1904 of the torsional springs 1900 are to be placed in the cavities 2002 and/or are rotatable within the cavities 2002. In this example, the carrier 2000 includes example carrier snaps 2005 spaced about an example aperture 2010 of the carrier 2000, where the carrier snaps 2005 are couplable to the semiconductor device 1706 of FIGS. 17A and/or 17B. Further, example clips 2008 are to be placed in respective ones of the cavities 2002 to hold (e.g., retain) the torsional springs 1900 in the cavities 2002. For example, the clips 2008 are to be compressed prior to placing in the cavities 2002 and, when the clips 2008 are inside the cavities 2002, the clips 2008 are released (e.g., uncompressed) to engage with side walls of the cavities 2002 to hold the clips 2008 and, thus, the torsional springs 1900 in the cavities 2002. In this example, the carrier 2000 is plastic, the torsional springs 1900 are metal (e.g., metal wire, music wire, ASTM A228 music wire), and the clips 2008 are metal (e.g., steel). In some examples, a different material may be used for the carrier 2000, the torsional springs 1900, and/or the clips 2008. In some examples, the material for the torsional springs 1900 may be selected based on a desired spring constant of the torsional springs 1900. In some such examples, the desired spring constant is based on range of expected operational temperatures at which the component stack 1700 of FIGS. 17A and/or 17B is to operate. In some examples, the material for the torsional springs 1900 may be selected based on environmental conditions in which the component stack 1700 of FIGS. 17A and/or 17B is to be implemented. For example, the material may be selected to prevent and/or reduce galvanic corrosion between the torsional spring 1900 and the semiconductor device 1706.

Figure 20B:
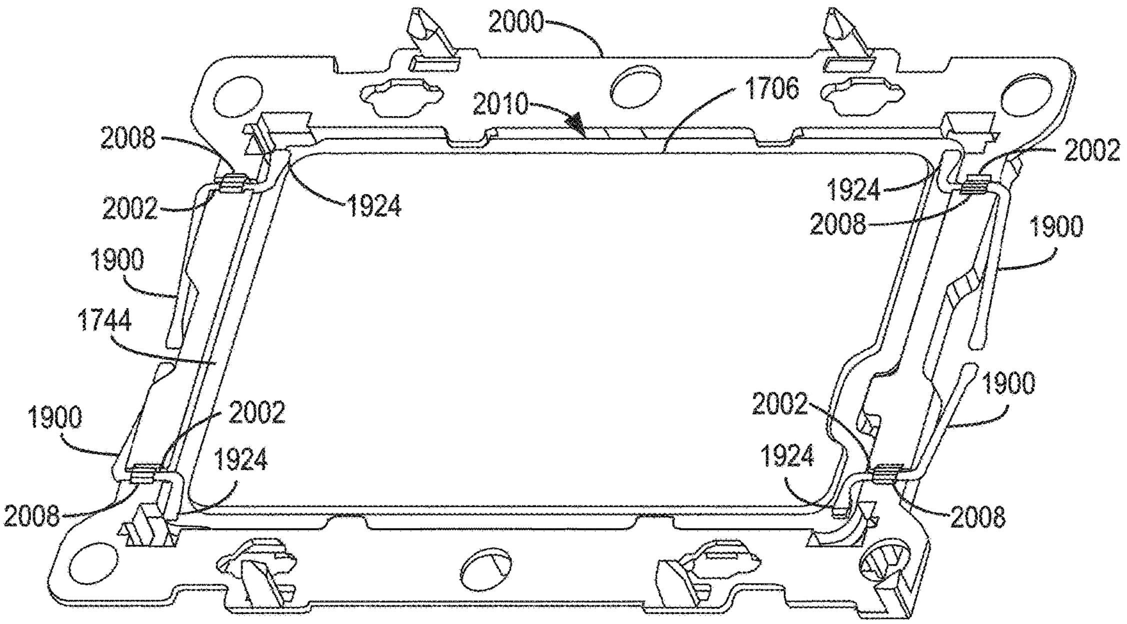
FIG. 20B illustrates the example torsional springs of FIGS. 19A and/or 19B and the example semiconductor device of FIGS. 17A and/or 17B positioned in and/or coupled to the example carrier of FIG. 20A.

FIG. 20B illustrates the example torsional springs 1900 of FIGS. 19A and/or 19B and the example semiconductor device 1706 of FIGS. 17A and/or 17B positioned in and/or coupled to the example carrier 2000 of FIG. 20A. In the illustrated example of FIG. 20B, the semiconductor device 1706 is positioned (e.g., disposed, placed) in the example aperture 2010 of the carrier 2000. Further, the torsional springs 1900 are positioned in corresponding ones of the cavities 2002 such that the first contact surfaces 1924 of the torsional springs 1900 contact the step surface 1744 of the semiconductor device 1706 proximate corners of the semiconductor device 1706. Further, as shown in FIG. 20B, the torsional springs 1900 are positioned so that the second contact surfaces 1926 (at the second end 1918) are adjacent a midpoint between the corners of the semiconductor device 1706. More particularly, in some examples, the second contact surfaces 1926 contact the bolster plate 1708 as detailed further below in connection with FIG. 21. In this example, the clips 2008 are placed in corresponding ones of the cavities 2002 and engaged with side walls of the cavities 2002. In this example, the clips 2008 prevent and/or resist removal of the torsional springs 1900 from the cavities 2002 when the clips 2008 are positioned in the cavities 2002. While the clips 2008 may retain the torsional springs 1900 in the cavities 2002, in some examples, the clips 2008 are dimensioned to nevertheless enable the torsional springs 1900 in the corresponding cavities 2002 to freely rotate (e.g., about an axis of the second arm 1904 of the torsional springs 1900 extending through the cavities 2002). In some examples, the clips 2008 can be compressed and removed from the cavities 2002 to enable removal of the torsional springs 1900 therefrom.

Figure 21:
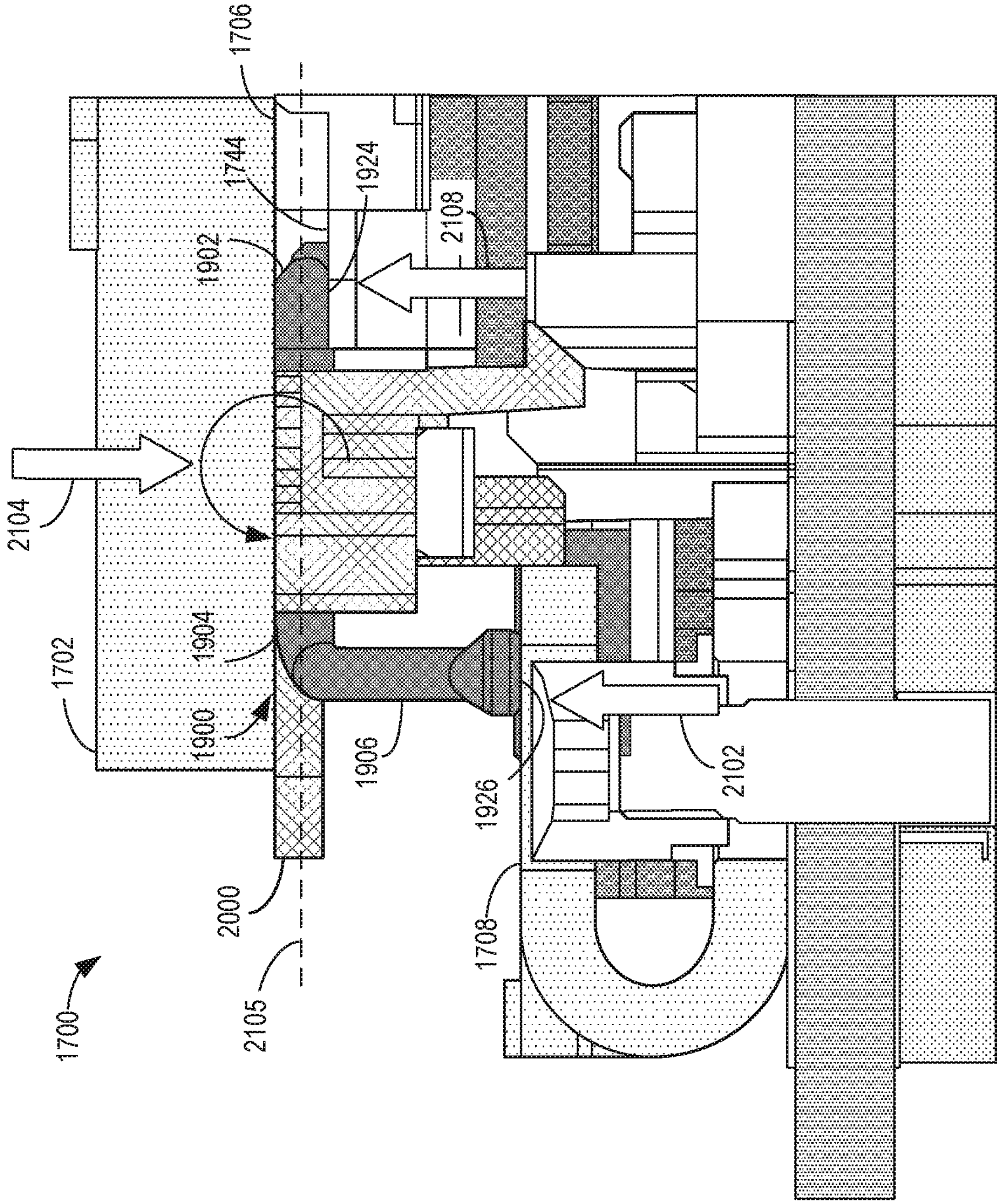
FIG. 21 illustrates a cross-sectional view of the example component stack of FIGS. 17A and/or 17B implementing the example torsional spring of FIGS. 19A and/or 19B.

FIG. 21 illustrates a cross-sectional view of the example component stack 1700 of FIGS. 17A and/or 17B implementing the example torsional spring 1900 of FIGS. 19A and/or 19B. In the illustrated example of FIG. 21, when the loading mechanism (e.g., the spring-loaded fasteners 1720 and/or the posts 1719 of FIG. 17A and/or any other suitable spring system represented by the springs 1737 of FIG. 17B) of the component stack 1700 generates a retention force on the heatsink 1702 of FIGS. 17A and/or 17B, the retention force urges the heatsink 1702 and/or the carrier 2000 (containing the torsional springs 1900) downward toward the bolster plate 1708 as shown in the example of FIG. 21. In some examples, the torsional spring 1900 is oriented relative to the carrier 2000 and the semiconductor device 1706 such that the second contact surface 1926 of the third arm 1906 comes into contact with the bolster plate 1708 before the semiconductor device 1706 is fully engaged with the socket 1710. As a result, in such examples, as the semiconductor device 1706 continues to be pressed into the socket 1710, the second contact surface 1926 of the third arm 1906 of the torsional spring 1900 contacts and/or presses on the bolster plate 1708, such that the bolster plate 1708 applies a first example reaction force 2102 upward onto the second contact surface 1926. The first reaction force 2102 urges the second contact surface 1926 upward, resulting in a second example reaction force (e.g., a torsional force) 2104 at (e.g., along) the second arm 1904 of the torsional spring 1900. The second reaction force 2104 causes rotation of the second arm 1904 of the torsional spring 1900 about an example rotation axis 2105 of the second arm 1904. As a result of the rotation of the second arm 1904, the first arm 1902 of the torsional spring 1900 rotates downward in the example of FIG. 21 towards the step surface 1744 of the semiconductor device 1706. Accordingly, the first contact surface 1924 of the first arm 1902 contacts and/or presses down on the step surface 1744 of the semiconductor device 1706, resulting in a third example reaction force 2108 from the step surface 1744 onto the first contact surface 1924. In some examples, as a result of the first and third reaction forces 2102, 2108 generated on the torsional spring 1900, the torsional spring 1900 distributes a first portion of the retention load generated by the loading mechanism to the step surface 1744 of the semiconductor device 1706 via the first contact surface 1924, and distributes a second portion of the retention load to the bolster plate 1708 via the second contact surface 1926. In some examples, the first portion of the retention load distributed onto the step surface 1744 reduces warpage of the semiconductor device 1706 (e.g., urges the outer edge of the semiconductor device 1706 toward the socket 1710 to offset the warpage arising from the manufacture of the chip and/or package) and/or increases a contact force between electrical contacts of the semiconductor device 1706 and the socket 1710 of FIGS. 17A and/or 17B.

Figures 22A, 22B, 22C:
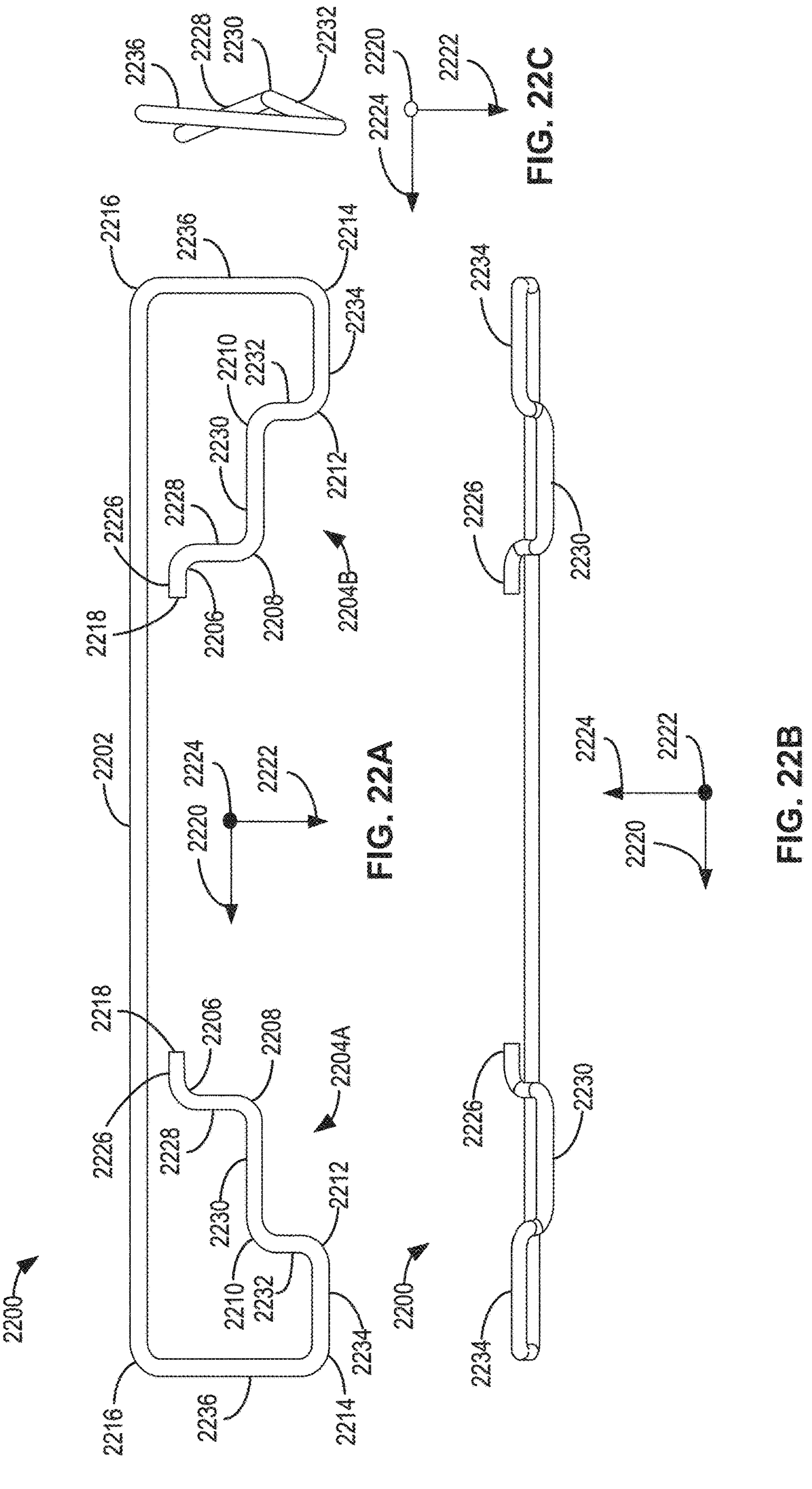
FIG. 22A illustrates a top view of a second example torsional spring that may be implemented in the example component stack of FIGS. 17A and/or 17B instead of the example torsional spring of FIGS. 19A and/or 19B.
FIG. 22B illustrates a front view of the second example torsional spring of FIG. 22A.
FIG. 22C illustrates a side view of the second example torsional spring of FIGS. 22A and/or 22B.

FIGS. 22A, 22B, and 22C illustrate top, front, and side views, respectively, of a second example torsional spring 2200 that may be implemented in the example component stack 1700 of FIGS. 17A and/or 17B instead of the torsional spring 1900 of FIGS. 19A and/or 19B. As shown in the illustrated example of FIGS. 22A-22C, the second torsional spring 2200 includes an example axle 2202 between example bent portions 2204A, 2204B of the second torsional spring 2200. In the illustrated example, each of the bent portions 2204A, 2204B includes six bends (e.g., a first example bend 2206, a second example bend 2208, a third example bend 2210, a fourth example bend 2212, a fifth example bend 2214, and a sixth example bend 2216) between the axle 2202 and respective example ends 2218 of the second torsional spring 2200.

In the illustrated example of FIGS. 22A-22C, a first example arm 2226 is defined between the end 2218 of the second torsional spring 2200 and the first bend 2206, a second example arm 2228 is defined between the first and second bends 2206, 2208, a third example arm 2230 is defined between the second and third bends 2208, 2210, a fourth example arm 2232 is defined between the third and fourth bends 2210, 2212, a fifth example arm 2234 is defined between the fourth and fifth bends 2212, 2214, and a sixth example arm 2236 is defined between the fifth and sixth bends 2214, 2216. In this example, each of the bends 2206, 2208, 2210, 2212, 2214, 2216 is approximately a 90-degree bend along an X-Y plane of FIG. 22A (defined by example X and Y axes 2220, 2222 in FIG. 22A). In some examples, one or more of the bends 2206, 2208, 2210, 2212, 2214, 2216 can include a bend along an example Z axis 2224 orthogonal to the X and Y axes 2220, 2222). For example, as shown in FIG. 22B, the first and fifth arms 2226, 2234 can be displaced upward along the Z axis 2224 relative to the third arm 2230. Furthermore, as shown in FIG. 22C, the second and fourth arms 2228, 2232 are angled downward toward the third arm 2230 relative to the X-Y plane defined by the X and Y axes 2220, 2222 in FIG. 22C.

Figure 23:
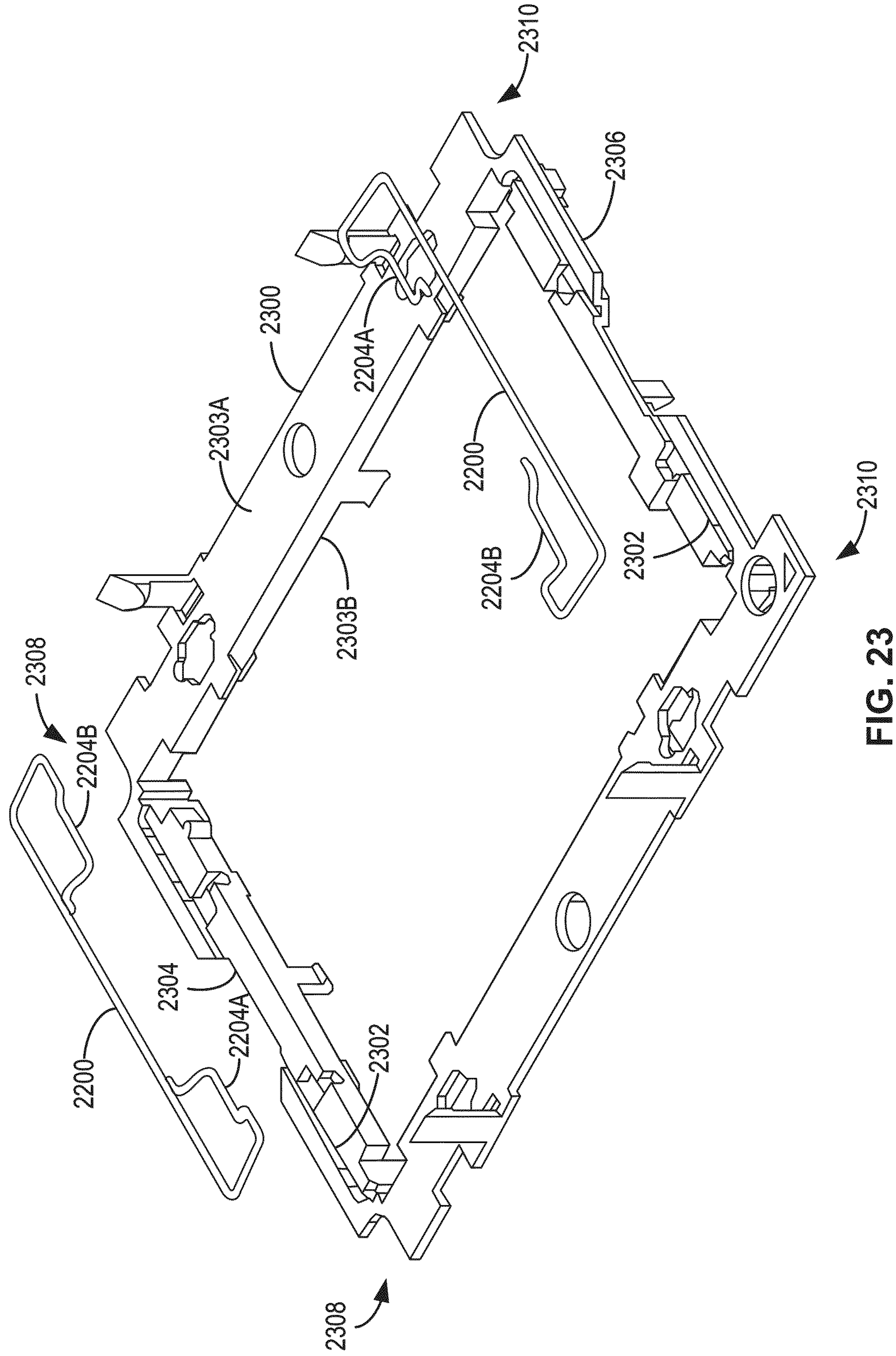
FIG. 23 illustrates a second example carrier configured to receive ones of the second example torsional spring of FIGS. 22A, 22B, and/or 22C.

FIG. 23 illustrates a second example carrier 2300 configured to receive ones of the second example torsional spring 2200 of FIGS. 22A-22C. In some examples, the second carrier 2300 of FIG. 23 can be implemented in the component stack 1700 of FIGS. 17A and/or 17B instead of the carrier 1704 of FIGS. 17A and/or 17B and/or the carrier 2000 of FIGS. 20A and/or 20B. In the illustrated example of FIG. 23, the second carrier 2300 includes example cavities (e.g., elongated cavities, channels) 2302 in a first example surface 2303A of the second carrier 2300 on first and second example sides 2304, 2306 of the second carrier 2300, where the first side 2304 is opposite the second side 2306. In this example, the cavities 2302 are dimensioned to receive respective ones of the second torsional springs 2200. In some examples, the cavities 2302 extend into the first surface 2303A by a first distance less than a thickness of the second carrier 2300 (e.g., less than a second distance between the first surface 2303A and a second example surface 2303B of the second carrier 2300). In this example, the cavities 2302 extend along a length of the respective sides 2304, 2306 between respective example corners 2308, 2310 of the second carrier 2300. In this example, the second carrier 2300 is plastic, and the second torsional springs 2200 are metal (e.g., metal wire, music wire). In some examples, a different material may be used for the second carrier 2300 and/or the second torsional springs 2200. In some examples, the material for the second torsional springs 2200 may be selected based on a desired spring constant of the second torsional springs 2200. In some such examples, the desired spring constant is based on range of expected operational temperatures at which the component stack 1700 of FIGS. 17A and/or 17B is to operate. In some examples, the material for the second torsional springs 2200 may be selected based on environmental conditions in which the component stack 1700 of FIGS. 17A and/or 17B is to be implemented. For example, the material may be selected to prevent and/or reduce galvanic corrosion between the second torsional springs 2200 and the semiconductor device 1706.

In the illustrated example of FIG. 23, the bent portions 2204A, 2204B of the second torsional springs 2200 are to contact the step surface 1744 of the semiconductor device 1706 proximate respective corners of the semiconductor device 1706. For example, the first bent portion 2204A is to contact the semiconductor device 1706 proximate a first corner of the semiconductor device 1706, and the second bent portion 2204B is to contact to semiconductor device 1706 proximate a second corner of the semiconductor device 1706, the first and second corners along a same outer edge of the semiconductor device 1706.

Figure 24:
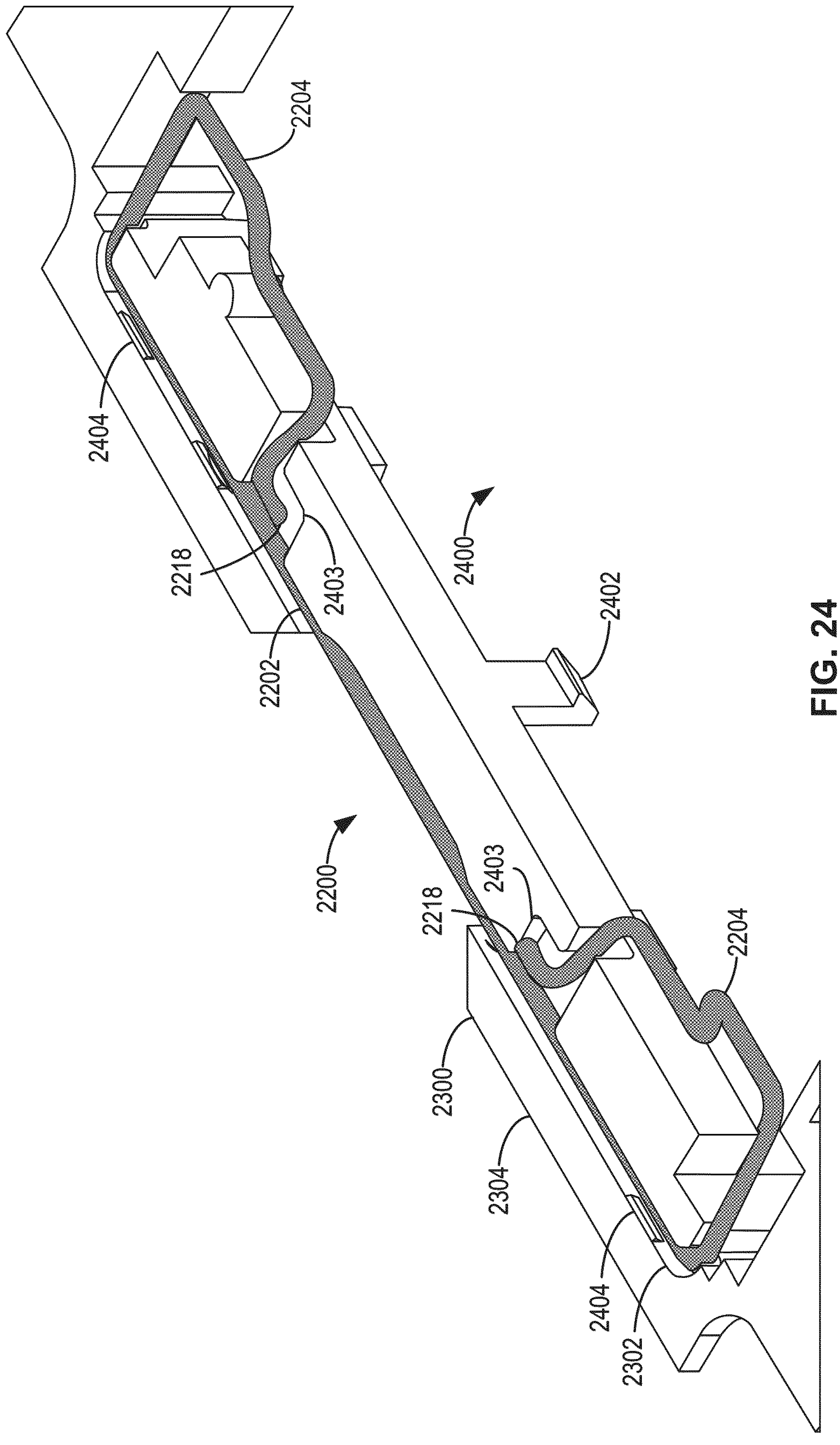
FIG. 24 illustrates the second example torsional spring of FIGS. 22A, 22B, and/or 22C implemented in the example cavity of the second example carrier of FIG. 23.

FIG. 24 illustrates the second example torsional spring 2200 of FIGS. 22A-22C implemented in the example cavity 2302 of the second example carrier 2300 of FIG. 23. In the illustrated example of FIG. 24, the axle 2202 of the second torsional spring 2200 is positioned in the cavity 2302 extending along a length of the side 2304 of the second carrier 2300. In this example, the bent portions 2204 partially extend into an example aperture 2400 of the second carrier 2300 in which the semiconductor device 1706 of FIGS. 17A and/or 17B is to be positioned using an example carrier snap 2402. Further, in some examples, the ends 2218 of the bent portions 2204 extend into example cutouts 2403 of the second carrier 2300, but do not necessarily contact a surface of the second carrier 2300 to allow free movement (e.g., bending, twisting, etc.) of the torsional spring 2200 within the cutouts 2403. In this example, the axle 2202 can be configured to rotate (e.g., via torsional forces) within the cavity 2302, but the axle 2022 experiences little to no upward or downward reaction forces when the component stack 1700 of FIGS. 17A and/or 17B is assembled. As such, the clips 2008 of FIGS. 20A and/or 20B are not required to hold the second torsional spring 2200 in the cavity 2302. Instead, the second carrier 2300 includes example protrusions (e.g., snaps) 2404 in the cavity 2302 to hold (e.g., retain, firmly hold) the second torsional spring 2200 in the cavity 2302.

Figure 25:
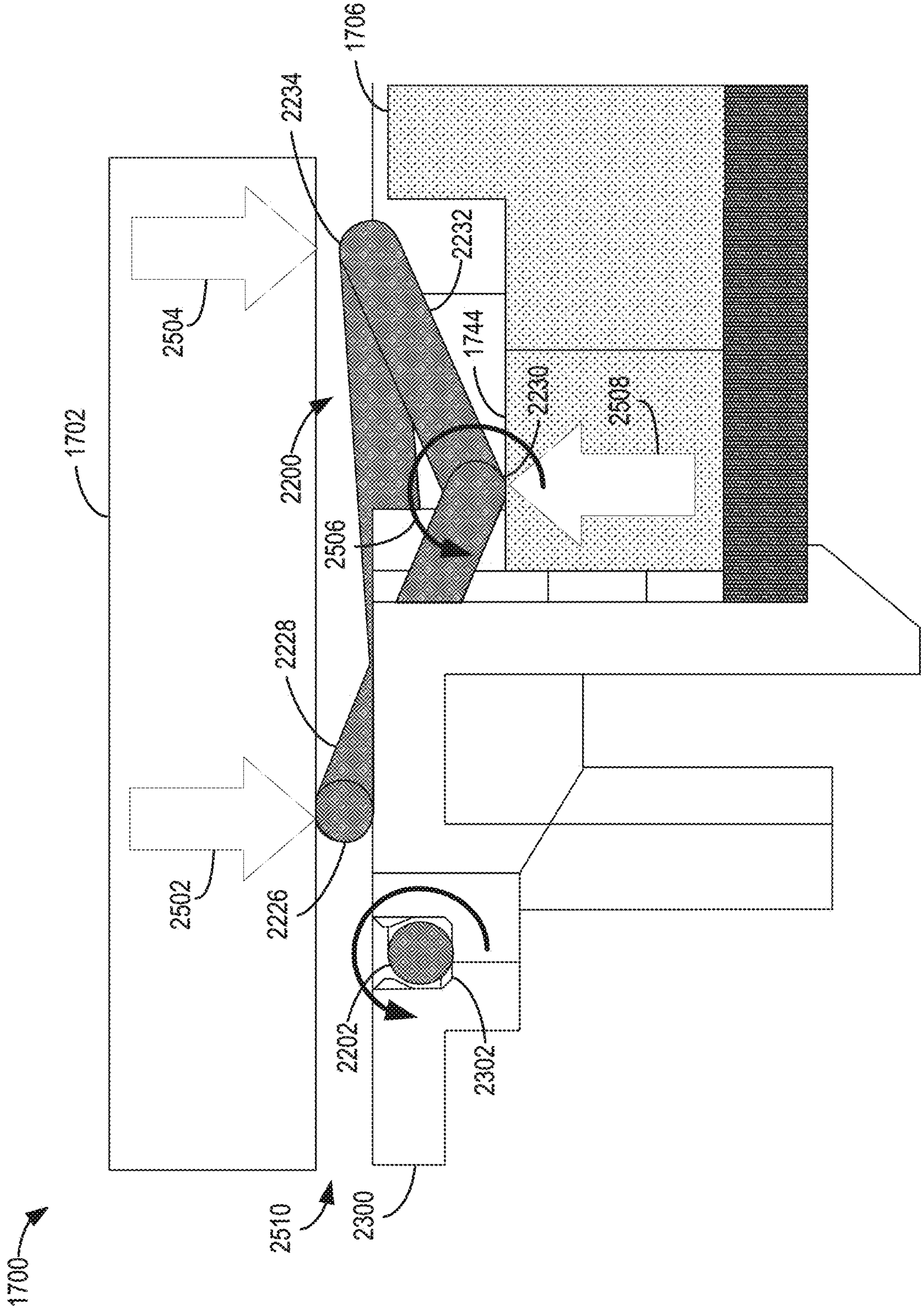
FIG. 25 illustrates a cross-sectional view of the example component stack of FIGS. 17A and/or 17B implementing the second example torsional spring of FIGS. 22A, 22B, and/or 22C.

FIG. 25 illustrates a cross-sectional view of the example component stack 1700 of FIGS. 17A and/or 17B implementing the second example torsional spring 2200 of FIGS. 22A-22C. In the illustrated example of FIG. 25, when the loading mechanism (e.g., the spring-loaded fasteners 1720 and/or the posts 1719 of FIG. 17A) of the component stack 1700 generates a retention load on the heatsink 1702, the retention load urges the heatsink 1702 downward toward the semiconductor device 1706 in the example of FIG. 21. When the heatsink 1702 moves downward, the heatsink 1702 contacts the second torsional spring 2200 at the first and fifth arms 2226, 2234 to generate first and second example reaction forces 2502, 2504 on the first and fifth arms 2226, 2234, respectively. Further, the third arm 2230 contacts the step surface 1744 of the semiconductor device 1706 such that a third example reaction force 2508 is generated between the step surface 1744 and the third arm 2230.

In this example, the first and second reaction forces 2502, 2504 urge the second and fourth arms 2228, 2232, respectively, to rotate downward in FIG. 25 about the third arm 2230 to produce an example torsional load 2506 at the third arm 2230. In this example, the torsional load 2506 biases the third arm 2230 downward to press against the step surface 1744 of the semiconductor device 1706 (e.g., as a reactive force to the third reaction force 2508 on the third arm 2230). As a result, a load from the third arm 2230 on the step surface 1744 reduces warpage of the semiconductor device 1706 and/or increases a contact force between electrical contacts of the semiconductor device 1706 and the socket 1710 of FIGS. 17A and/or 17B. In this example, the axle 2202 of the second torsional spring 2200 rests in the cavity 2302 of the second carrier 2300. In this example, the axle 2202 experiences negligible vertical reactive forces as a result of the retention load on the heatsink 1702. In some examples, the axle 2202 rotates in the cavity 2302 as a result of the retention load on the heatsink 1702.

In this example, the heatsink 1702 is spaced apart from the semiconductor device 1706 and the second carrier 2300 by an example gap (e.g., a clearance) 2510. For example, during assembly of the component stack 1700, the heatsink 1702 is coupled to the second carrier 2300 such that the gap 2510 is provided therebetween. In some examples, the gap 2510 enables the second torsional spring 2200 to extend above an upper surface of the semiconductor device 1706 and the carrier 2300 such that when a retention load is applied on the assembly, the heatsink 1702 will contact the torsional spring 2202 prior to contacting the semiconductor device 1706. In this way the forces 2502, 2504 are generated that results in a force urging downward on the step surface 1744 corresponding to the third reaction force 2506 as shown in FIG. 25.

Figure 26:
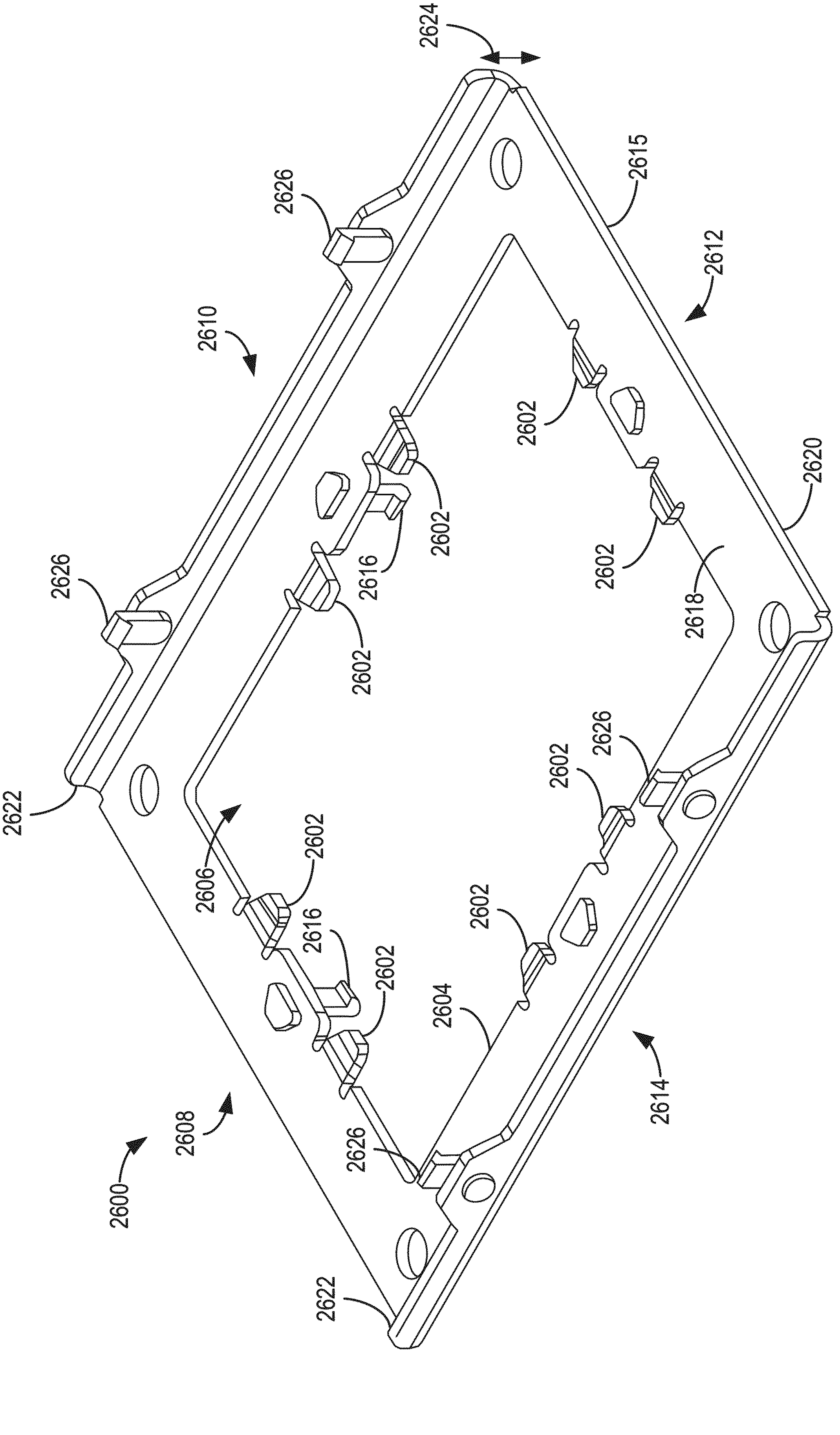
FIG. 26 illustrates a third example carrier that may be implemented in the example component stack of FIGS. 17A and/or 17B.

FIG. 26 illustrates a third example carrier 2600 that may be implemented in the example component stack 1700 of FIGS. 17A and/or 17B. In some examples, the third carrier 2600 can be implemented in the component stack 1700 of FIGS. 17A and/or 17B instead of the carrier 1704 of FIGS. 17A and/or 17B, the carrier 2000 of FIGS. 20A and/or 20B, and/or the second carrier 2300 of FIG. 23. In the illustrated example of FIG. 26, the third carrier 2600 includes example leaf springs 2602 spaced around an example inner perimeter 2604, where the inner perimeter 2604 defines an example aperture 2606 of the third carrier 2600. In some examples, the leaf springs 2602, like the torsional spring 1900 of FIGS. 19A and/or 19B and/or the second torsional spring 2200 of FIGS. 22A, 22B, and/or 22C, are used to distribute a load from the loading mechanism (e.g., the spring-loaded fasteners 1720 and/or the posts 1719 of FIG. 17A) to the step surface 1744 of the semiconductor device 1706 to improve contact between electrical contacts of the semiconductor device 1706 and the socket 1710 of FIGS. 17A and/or 17B.

In the illustrated example of FIG. 26, the third carrier 2600 includes two of the leaf springs 2602 on each example side 2608, 2610, 2612, 2614 of the third carrier 2600 (e.g., for a total of eight of the leaf springs 2602). In some examples, a different number of the leaf springs 2602 (e.g., less than two, three or more, etc.) can be implemented on at least one of the sides 2608, 2610, 2612, 2614. In some examples, the leaf springs 2602 are implemented on less than all of the sides 2608, 2610, 2612, 2614 of the carrier 2600. In this example, the third carrier 2600 includes example carrier snaps 2616 coupled to the respective example sides 2608, 2610, 2612, 2614 of the third carrier 2600, where the sides 2608, 2610, 2612, 2614 define an example outer perimeter 2615 of the third carrier 2600. In this example, the carrier snaps 2616 are positioned between respective pairs of the leaf springs 2602. In some examples, the semiconductor device 1706 of FIGS. 17A and/or 17B is to be positioned in the aperture 2606 and held in place by the carrier snaps 2616. In such examples, the leaf springs 2602 are to contact and/or act on the step surface 1744 of the semiconductor device 1706. In some examples, the leaf springs 2602 collectively provide between 30 and 40 pounds of force (lbf) onto the step surface 1744 of the semiconductor device 1706.

In this example, a thickness of the third carrier 2600 (e.g., a distance between example top and bottom surfaces 2618, 2620 of the third carrier 2600) is 1.5 mm. In some examples, the thickness of the third carrier 2600 can be different. In this example, the third carrier 2600 includes example flanges (e.g., vertical flanges, side walls) 2622 on the second and fourth sides 2610, 2614 of the third carrier 2600. In this example, the flanges 2622 extend upward from and/or are substantially perpendicular (e.g., transverse) to the top surface 2618. In this example, an example height 2624 of the flanges 2622 is between 5 mm and 6 mm. In some examples, the flanges 2622 increase stiffness of the third carrier 2600 to reduce bending of the third carrier 2600 due to retention loads of the loading mechanism (e.g., the spring-loaded fasteners 1720 and/or the posts 1719 of FIG. 17A). In the illustrated example, example heatsink snaps 2626 are coupled to and/or disposed in the flanges 2622, where the heatsink snaps 2626 are used to couple the heatsink 1702 of FIGS. 17A and/or 17B to the third carrier 2600.

In this example, the leaf springs 2602 are integrally formed with the third carrier 2600. In this example, the leaf springs 2602 and the third carrier 2600 are metal (e.g., steel). In some examples, the carrier snaps 2616 and the heatsink snaps 2626 are plastic. However, a different material for at least one of the leaf springs 2602, the carrier snaps 2616, or the heatsink snaps 2626 may be used instead. In some examples, the carrier snaps 2616 and/or the heatsink snaps 2626 are coupled to the third carrier 2600 by heat staking. In some examples, the third carrier 2600 may include the cavities 2002 and the torsional springs 1900 shown in the carrier 2000 of FIGS. 20A and/or 20B. Additionally or alternatively, the third carrier 2600 may include the cavities 2302 and the second torsional springs 2200 of the second carrier 2300 of FIG. 23.

Further, in some examples, the example carriers 2000, 2200 discussed above in connection with FIGS. 20A, 20B, and 23 can be modified to include leaf springs similar to the leaf springs 2602 of the third carrier 2600 of FIG. 26. Further still, in some examples, any one of the carriers 2000, 2200, 2600 can include one or more of the torsional springs 1900 shown in FIGS. 19A and 19B as well as one or more of the torsional springs 2200 shown in FIGS. 22A-22C. Thus, the different example carriers 2000, 2200, 2600 disclosed herein are not mutually exclusive. Rather, any feature or aspect disclosed in connection with any one of the example carriers 2000, 2200, 2600 can be used in combination with and/or used instead of any features or aspects disclosed in connection with any other one of the example carriers 2000, 2200, 2600.

Figure 27A:
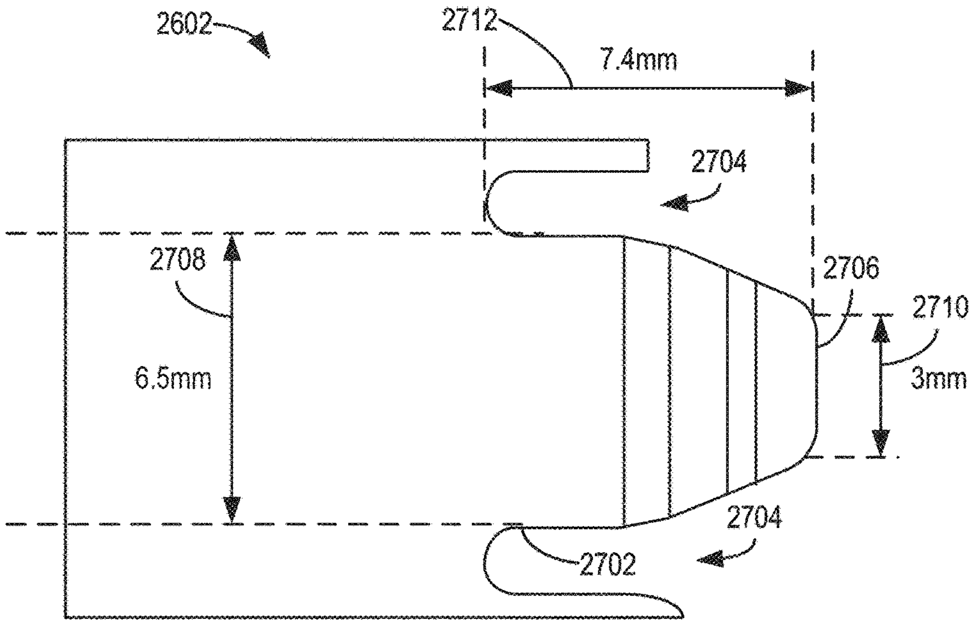
FIG. 27A illustrates a top view of one of the example leaf springs of FIG. 26.
Figure 27B:
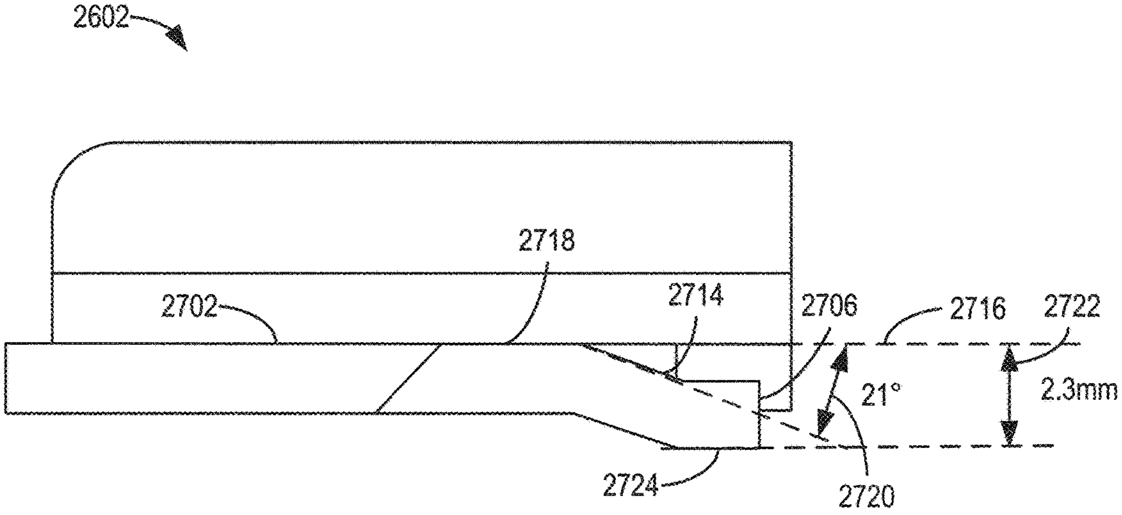
FIG. 27B illustrates a cross-sectional view of the example leaf spring of FIG. 27A.

FIGS. 27A and 27B illustrate top and cross-sectional views, respectively, of one of the example leaf springs 2602 of FIG. 26. In the illustrated example of FIG. 27A, the leaf spring 2602 includes an example base 2702 and example cutouts 2704 on either side of the base 2702. In this example, the leaf spring 2602 tapers (e.g., narrows) from the base 2702 toward an example end 2706 of the leaf spring 2602. In this example, a first example width 2708 at the base 2702 is approximately 6.5 mm, and a second example width 2710 at the end 2706 is approximately 3 mm. In this example, an example length 2712 of the leaf spring 2602 between the base 2702 and the end 2706 is approximately 7.4 mm. In some examples, at least one of the first width 2708, the second width 2710, or the length 2712 can be different.

Turning to FIG. 27B, the leaf spring 2602 includes an example angled surface 2714 that is angled downward from an example plane (e.g., a horizontal plane) 2716 of an example upper surface 2718 of the base 2702. In some examples, the angled surface 2714 is angled downward from the plane 2716 by an example angle 2720, where the angle 2720 is approximately 21 degrees in this example. In some examples, the angle 2720 can be different. In this example, an example vertical distance 2722 between the upper surface 2718 and an example lower surface 2724 of the leaf spring 2602 (e.g., proximate the end 2706 of the leaf spring 2602) is approximately 2.3 mm. In some examples, the lower surface 2724 is to contact the step surface 1744 of the semiconductor device 1706 when the semiconductor device 1706 is assembled to and/or disposed in the third carrier 2600. In such examples, the lower surface 2724 is to provide a reactive force on the step surface 1744 of the semiconductor device 1706 when the loading mechanism (e.g., including the spring-loaded fasteners 1720 and/or the posts 1719 of FIG. 17A) acts on the heatsink 1702.

Figure 28:
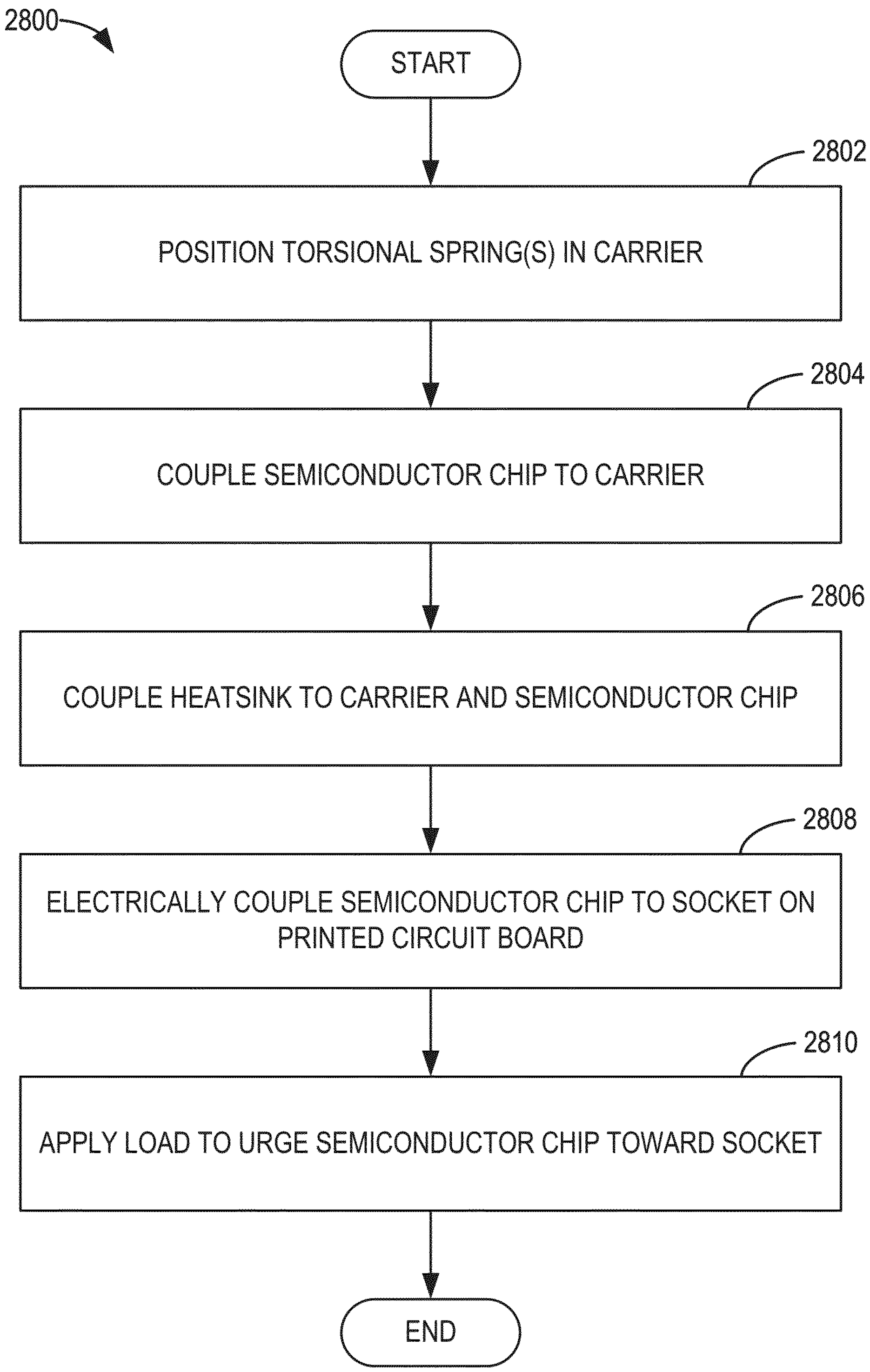
FIG. 28 is a flowchart representative of an example method of assembling the example component stack of FIGS. 17A and/or 17B with the example torsional spring of FIGS. 19A and/or 19B and/or the second example torsional spring of FIGS. 22A, 22B, and/or 22C.

FIG. 28 is a flowchart representative of an example method 2800 of assembling the example component stack 1700 of FIGS. 17A and/or 17B with the example torsional spring 1900 of FIGS. 19A and/or 19B and/or the second example torsional spring 2200 of FIGS. 22A, 22B, and/or 22C. In some examples, some or all of the operations outlined in the example method 2800 are performed automatically by fabrication equipment that is programmed to perform the operations. Although the example method of assembling is described with reference to the flowchart illustrated in FIG. 28, many other methods may alternatively be used. For example, the order of execution of the blocks may be changed, and/or some of the blocks described may be combined, divided, re-arranged, omitted, eliminated, and/or implemented in any other way.

The example method 2800 of FIG. 28 begins at block 2802 by positioning the example torsional spring 1900 of FIGS. 19A and/or 19B or the second torsional spring 2200 of FIGS. 22A, 22B, and/or 22C in the example carrier 2000 of FIGS. 20A and/or 20B or the second example carrier 2300 of FIG. 23, respectively. For example, the example torsional springs 1900 are positioned in respective ones of the example cavities 2002 of the example carrier 2000, and the example clips 2008 are placed in the cavities 2002 to hold (e.g., retain) the torsional springs 1900 in the cavities 2002. Alternatively, the second example torsional springs 2200 are positioned in respective ones of the example cavities 2302 of the second example carrier 2300, and the second torsional springs 2200 are retained in the second carrier 2300 via example protrusions 2404.

At block 2804, the example method 2800 includes coupling the example semiconductor device 1706 of FIGS. 17A and/or 17B to the example carrier 2000 or the second example carrier 2300. For example, the semiconductor device 1706 is positioned (e.g., disposed) in the example aperture 2010 of the carrier 2000, and the semiconductor device 1706 is coupled to (e.g., supported adjacent) the carrier 2000 via the example carrier snaps 2005 spaced about the aperture 2010. Alternatively, the semiconductor device 1706 is positioned (e.g., disposed) in the example aperture 2400 of the second carrier 2300, and the semiconductor device 1706 is coupled to (e.g., supported adjacent) the second carrier 2300 via the example carrier snaps 2402 spaced about the aperture 2400.

At block 2806, the example method 2800 includes coupling the example heatsink 1702 of FIGS. 17A and/or 17B to the example semiconductor device 1706 and to the carrier 2000 or the second carrier 2300. For example, the heatsink 1702 is thermally coupled to the central surface 1742 of the example semiconductor device 1706 via the example TIM 1730 of FIGS. 17A and/or 17B to facilitate heat transfer from the semiconductor device 1706 to the heatsink 1702. In some examples, the heatsink 1702 is coupled (e.g., fastened, attached) to the first surface 2003A of the carrier 2000. In some examples, the heatsink 1702 is coupled to the second carrier 2300 such that the gap 2510 is provided between the heatsink 1702 and the first surface 2303A of the second carrier 2300 and the semiconductor device 1706. In such examples, the heatsink 1702 does not contact the semiconductor device 1706 until after at least some of the retention load has been transferred to the second torsional springs 2200 by compressing the springs 220 as the gap 2510 is closed.

At block 2808, the example method 2800 includes electrically coupling the semiconductor device 1706 to the example socket 1710 of the example PCB 1712 of FIGS. 17A and/or 17B. For example, the pins 1732 of the socket 1710 are aligned with corresponding contacts on the semiconductor device 1706 to electrically couple the semiconductor device 1706 to the socket 1710.

At block 2810, the example method 2800 includes applying a load to urge the semiconductor device 1706 toward the socket 1710. For example, the springs 1737 of FIG. 17B (implemented in the spring-loaded fasteners 1720 of FIG. 17A) generate a load on the heatsink 1702 to urge the heatsink 1702 toward the socket 1710 and, thus, facilitate retention of the semiconductor device 1706 in the socket 1710. In some examples, the torsional springs 1900 and/or the second torsional springs 2200 distribute a portion of the load to the step surface 1744 of the semiconductor device 1706. In some examples, the increased load at the step surface 1744 counteracts and/or reduces effects of warpage of the semiconductor device 1706 and/or the socket 1710, thus ensuring sufficient contact between electrical contacts of the semiconductor device 1706 and the socket 1710.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc., may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, or (7) A with B and with C. As used herein in the context of describing structures, components, items, objects and/or things, the phrase "at least one of A and B" is intended to refer to implementations including any of (1) at least one A, (2) at least one B, or (3) at least one A and at least one B. Similarly, as used herein in the context of describing structures, components, items, objects and/or things, the phrase "at least one of A or B" is intended to refer to implementations including any of (1) at least one A, (2) at least one B, or (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, or (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, or (3) at least one A and at least one B.

As used herein, singular references (e.g., "a", "an", "first", "second", etc.) do not exclude a plurality. The term "a" or "an" object, as used herein, refers to one or more of that object. The terms "a" (or "an"), "one or more", and "at least one" are used interchangeably herein. Furthermore, although individually listed, a plurality of means, elements or method actions may be implemented by, e.g., the same entity or object. Additionally, although individual features may be included in different examples or claims, these may possibly be combined, and the inclusion in different examples or claims does not imply that a combination of features is not feasible and/or advantageous.

From the foregoing, it will be appreciated that example systems, methods, apparatus, and articles of manufacture have been disclosed that control load distribution of IC packages when assembled within heat dissipating component stacks. Disclosed systems, methods, apparatus, and articles of manufacture provide torsional springs in a carrier coupled between a semiconductor device and a heatsink thermally coupled to the semiconductor device. In examples disclosed herein, the torsional springs distribute loads (e.g., retention spring loads) from the heatsink to a surface (e.g., a step surface) of the semiconductor device proximate edges of the semiconductor device. By distributing loads to the surface of the semiconductor device, examples disclosed herein counteract and/or reduce effects of warpage of the semiconductor device and/or a corresponding socket. Furthermore, by reducing warpage of the semiconductor device and/or increasing loads on corners and/or edges of the semiconductor device, disclosed systems, methods, apparatus, and articles of manufacture improve the efficiency of using a computing device by maintaining sufficient contact forces between electrical contacts of the semiconductor device and the corresponding socket, thus improving reliability of signal transmission between the semiconductor device and the socket. Disclosed systems, methods, apparatus, and articles of manufacture are accordingly directed to one or more improvement(s) in the operation of a machine such as a computer or other electronic and/or mechanical device.

Example methods, apparatus, systems, and articles of manufacture to control load distribution of IC packages are disclosed herein. Further examples and combinations thereof include the following:

Example 1 includes an apparatus comprising a carrier plate including a first surface to face a heatsink, a second surface opposite the first surface, and an aperture extending between the first and second surfaces, the aperture dimensioned to surround a semiconductor device, and a spring carried by the carrier plate, the spring to contact a surface of the semiconductor device proximate an outer edge of the semiconductor device.

Example 2 includes the apparatus of example 1, wherein the spring is integrally formed with the carrier plate.

Example 3 includes the apparatus of example 1, wherein the carrier plate includes a cavity in the first surface, the spring positioned in the cavity.

Example 4 includes the apparatus of example 3, further including at least one clip to be placed in the cavity to hold the spring in the cavity.

Example 5 includes the apparatus of example 3, wherein the cavity includes protrusions to retain the spring in the cavity.

Example 6 includes the apparatus of example 1, wherein a first end of the spring is to contact the surface of the semiconductor device and a second end of the spring is to contact a bolster plate on a printed circuit board.

Example 7 includes the apparatus of example 1, wherein the spring is a first spring positioned on a first side of the carrier plate, further including a second spring positioned on a second side of the carrier plate, the second side opposite the first side.

Example 8 includes the apparatus of example 1, wherein the spring includes an axle extending between first and second bent portions, the first and second bent portions to contact the surface of the semiconductor device proximate respective corners of the semiconductor device.

Example 9 includes the apparatus of example 1, wherein the spring is a torsional spring.

Example 10 includes the apparatus of example 1, wherein the spring is a leaf spring.

Example 11 includes the apparatus of example 1, further including flanges on opposite sides of the carrier plate, the flanges to extend transverse to the first surface.

Example 12 includes the apparatus of example 1, wherein the spring is to distribute a load from the heatsink to the surface of the semiconductor device when the semiconductor device is pressed into a corresponding socket.

Example 13 includes an apparatus comprising a carrier plate to be coupled to a heatsink, the carrier plate including an aperture to receive a semiconductor device, the semiconductor device to be thermally coupled to the heatsink, and a torsional spring to extend through a channel in the carrier plate, the torsional spring to contact a surface of the semiconductor device.

Example 14 includes the apparatus of example 13, wherein the torsional spring includes a first end to contact the surface of the semiconductor device and a second end to contact a bolster plate on a printed circuit board.

Example 15 includes the apparatus of example 13, further including clips to be disposed in the channel to hold the torsional spring in the channel.

Example 16 includes the apparatus of example 13, wherein at least two arms of the torsional spring are to contact the heatsink when the semiconductor device is pressed into a corresponding socket.

Example 17 includes the apparatus of example 13, wherein the torsional spring includes an axle extending between first and second bent portions, the axle positioned in the channel, the first and second bent portions to contact the surface of the semiconductor device.

Example 18 includes an apparatus comprising a first surface to face a base of a heatsink, a second surface opposite the first surface, an outer perimeter, an inner perimeter defining an aperture extending between the first and second surfaces, the aperture dimensioned to surround an integrated circuit (IC) package, and a leaf spring on the inner perimeter of the aperture, the leaf spring to contact a surface of the IC package.

Example 19 includes the apparatus of example 18, wherein the leaf spring includes an angled surface angled relative to the first surface such that an end of the leaf spring is to be farther away from the base of the heatsink than the first surface is from the heatsink.

Example 20 includes the apparatus of example 18, further including flanges on opposite sides of the outer perimeter.

Example 21 includes the apparatus of example 18, wherein the apparatus is metal.

Example 22 includes the apparatus of example 18, wherein the leaf spring tapers from a base of the leaf spring to an end of the leaf spring.

Example 23 includes a method comprising positioning an integrated circuit (IC) package in an aperture of a carrier plate, positioning a torsional spring in a cavity of the carrier plate to contact a surface of the IC package proximate an outer edge of the IC package, and attaching the carrier plate to a heatsink to thermally couple the IC package to the heatsink.

Example 24 includes the method of example 23, where the torsional spring is a first torsional spring, the cavity is a first cavity on a first side of the carrier plate, further including positioning a second torsional spring in a second cavity on a second side of the carrier plate, the second side opposite the first side.

Example 25 includes the method of example 23, further including positioning at least one clip in the cavity to hold the torsional spring in the cavity.

Example 26 includes the method of example 23, further including applying a retention load on the heatsink to urge the heatsink toward a bolster plate of a printed circuit board, the retention load to result in the torsional spring applying a force on the surface of the IC package.

The following claims are hereby incorporated into this Detailed Description by this reference. Although certain example systems, methods, apparatus, and articles of manufacture have been disclosed herein, the scope of coverage of this patent is not limited thereto. On the contrary, this patent covers all systems, methods, apparatus, and articles of manufacture fairly falling within the scope of the claims of this patent.

What is claimed is:

1. An apparatus comprising:
- a carrier plate including:
  - a first surface to face a heatsink;
  - a second surface opposite the first surface;
  - a cavity in the first surface; and
  - an aperture extending between the first and second surfaces, the aperture dimensioned to surround a semiconductor device; and
- a spring carried by the carrier plate and positioned in the cavity, the spring to contact a surface of the semiconductor device proximate an outer edge of the semiconductor device.

2. The apparatus of claim 1, wherein the spring is a first spring, further including a second spring integrally formed with the carrier plate, the second spring to contact the surface of the semiconductor device.

3. The apparatus of claim 1, further including at least one clip to be placed in the cavity to hold the spring in the cavity.

4. The apparatus of claim 1, wherein the cavity includes protrusions to retain the spring in the cavity.

5. The apparatus of claim 1, wherein a first end of the spring is to contact the surface of the semiconductor device and a second end of the spring is to contact a bolster plate on a printed circuit board.

6. The apparatus of claim 1, wherein the spring is a first spring positioned on a first side of the carrier plate, further including a second spring positioned on a second side of the carrier plate, the second side opposite the first side.

7. The apparatus of claim 1, wherein the spring includes an axle extending between first and second bent portions, the first and second bent portions to contact the surface of the semiconductor device proximate respective corners of the semiconductor device.

8. The apparatus of claim 1, wherein the spring is a first spring, further including a leaf spring carried by the carrier plate, the leaf spring to contact the surface of the semiconductor device.

9. The apparatus of claim 1, further including flanges on opposite sides of the carrier plate, the flanges to extend transverse to the first surface.

10. The apparatus of claim 1, wherein the spring is to distribute a load from the heatsink to the surface of the semiconductor device when the semiconductor device is pressed into a corresponding socket.

11. An apparatus comprising:
- a carrier plate including:
  - a first surface to face a heatsink;
  - a second surface opposite the first surface; and
  - an aperture extending between the first and second surfaces, the aperture dimensioned to surround a semiconductor device; and
- a torsional spring carried by the carrier plate, the torsional spring to contact a surface of the semiconductor device proximate an outer edge of the semiconductor device.

12. An apparatus comprising:
- a carrier plate to be coupled to a heatsink, the carrier plate including an aperture to receive a semiconductor device, the semiconductor device to be thermally coupled to the heatsink; and
- a torsional spring to extend through a channel in the carrier plate, the torsional spring to contact a surface of the semiconductor device.

13. The apparatus of claim 12, wherein the torsional spring includes a first end to contact the surface of the semiconductor device and a second end to contact a bolster plate on a printed circuit board.

14. The apparatus of claim 12, further including clips to be disposed in the channel to hold the torsional spring in the channel.

15. The apparatus of claim 12, wherein at least two arms of the torsional spring are to contact the heatsink when the semiconductor device is pressed into a corresponding socket.

16. The apparatus of claim 12, wherein the torsional spring includes an axle extending between first and second bent portions, the axle positioned in the channel, the first and second bent portions to contact the surface of the semiconductor device.

17. A method comprising:
- positioning an integrated circuit (IC) package in an aperture of a carrier plate;
- positioning a torsional spring in a cavity of the carrier plate to contact a surface of the IC package proximate an outer edge of the IC package; and
- attaching the carrier plate to a heatsink to thermally couple the IC package to the heatsink.

18. The method of claim 17, wherein the torsional spring is a first torsional spring, the cavity is a first cavity on a first side of the carrier plate, further including positioning a second torsional spring in a second cavity on a second side of the carrier plate, the second side opposite the first side.

19. The method of claim 17, further including positioning at least one clip in the cavity to hold the torsional spring in the cavity.

20. The method of claim 17, further including applying a retention load on the heatsink to urge the heatsink toward a bolster plate of a printed circuit board, the retention load to result in the torsional spring applying a force on the surface of the IC package.

* * * * *